(12) United States Patent
Wang et al.

(10) Patent No.: US 12,046,693 B2
(45) Date of Patent: Jul. 23, 2024

(54) SOLAR DEVICE FABRICATION LIMITING POWER CONVERSION LOSSES

(71) Applicant: Maxeon Solar Pte. Ltd., Singapore (SG)

(72) Inventors: Lili Wang, Fremont, CA (US); Arnaud Lepert, Fremont, CA (US)

(73) Assignee: MAXEON SOLAR PTE. LTD., Singapore (SG)

(*) Notice: Subject to any disclaimer, the term of this patent is extended or adjusted under 35 U.S.C. 154(b) by 0 days.

(21) Appl. No.: 17/464,513

(22) Filed: Sep. 1, 2021

(65) Prior Publication Data
US 2023/0079215 A1    Mar. 16, 2023

(51) Int. Cl.
| | |
|---|---|
| *H01L 31/18* | (2006.01) |
| *H01L 31/0216* | (2014.01) |
| *H01L 31/0224* | (2006.01) |
| *H01L 31/0747* | (2012.01) |
| *H01L 31/075* | (2012.01) |

(52) U.S. Cl.
CPC ...... *H01L 31/186* (2013.01); *H01L 31/02167* (2013.01); *H01L 31/022466* (2013.01); *H01L 31/0747* (2013.01); *H01L 31/075* (2013.01); *H01L 31/1868* (2013.01); *H01L 31/1884* (2013.01)

(58) Field of Classification Search
CPC ........... H01L 31/0682; H01L 31/02167; H01L 31/022466; H01L 31/0747; H01L 31/075; H01L 31/1868; H01L 31/1884; H01L 31/186
See application file for complete search history.

(56) References Cited

U.S. PATENT DOCUMENTS

| | | | |
|---|---|---|---|
| 7,883,343 B1* | 2/2011 | Mulligan | ........ H01L 31/022441 257/E25.007 |
| 2004/0035458 A1 | 2/2004 | Beernink et al. | |

(Continued)

FOREIGN PATENT DOCUMENTS

EP    3544060 A1    9/2019

OTHER PUBLICATIONS

International Search Report and Written Opinion for related PCT/US2022/040188, mailed Apr. 25, 2023.

*Primary Examiner* — Golam Mowla
(74) *Attorney, Agent, or Firm* — Schmidt Patent Law, Inc.

(57) ABSTRACT

Separation of individual strips from a solar cell workpiece, is accomplished by excluding a junction (e.g., a homojunction such as a p-n junction, or a heterojunction such as a p-i-n junction) from regions at which separation is expected to occur. According to some embodiments, the junction is excluded by physical removal of material from inter-strip regions of the workpiece. According to other embodiments, exclusion of the junction is achieved by changing an effective doping level (e.g., counter-doping, deactivation) at inter-strip regions. For still other embodiments, the junction is never formed at inter-strip regions in the first place (e.g., using masking during original dopant introduction). By imposing distance between the junction and defects arising from separation processes (e.g., backside crack propagation), losses attributable to electron-hole recombination at such defects are reduced, and collection efficiency of shingled modules is enhanced.

29 Claims, 43 Drawing Sheets

(56) References Cited

U.S. PATENT DOCUMENTS

| | | | |
|---|---|---|---|
| 2006/0231130 A1* | 10/2006 | Sharps | H01L 31/022433 136/243 |
| 2009/0155951 A1* | 6/2009 | Stan | H01L 31/03042 438/74 |
| 2010/0084009 A1* | 4/2010 | Carlson | H01L 31/022441 257/E31.124 |
| 2010/0126572 A1* | 5/2010 | Kizilyalli | H01L 31/1844 257/E31.022 |
| 2010/0236619 A1* | 9/2010 | Tsutsumi | H01L 31/075 257/E31.128 |
| 2012/0273040 A1 | 11/2012 | Kim et al. | |
| 2020/0259041 A1 | 8/2020 | Gibson et al. | |

* cited by examiner

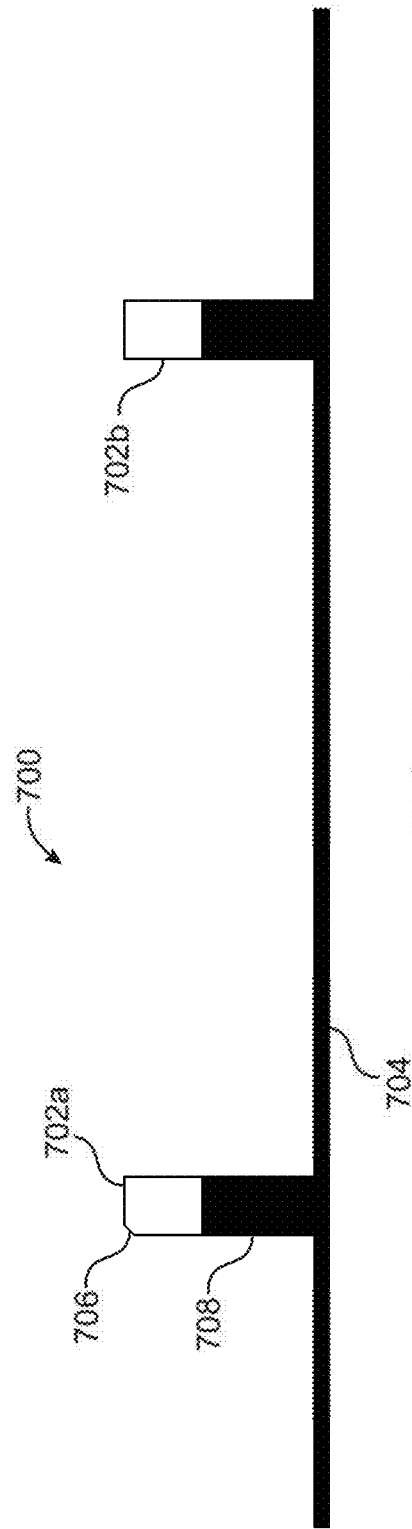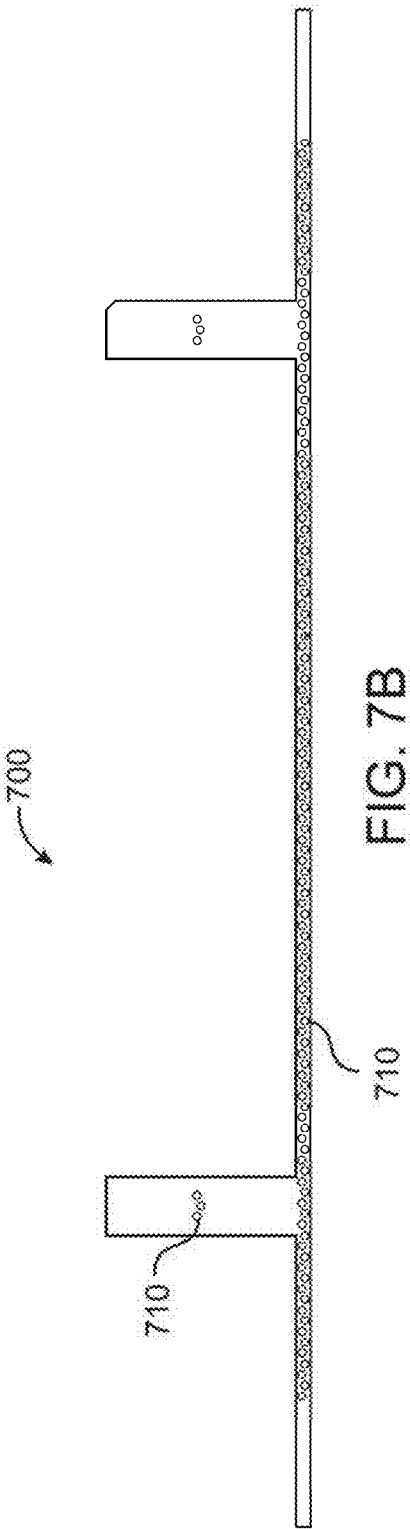

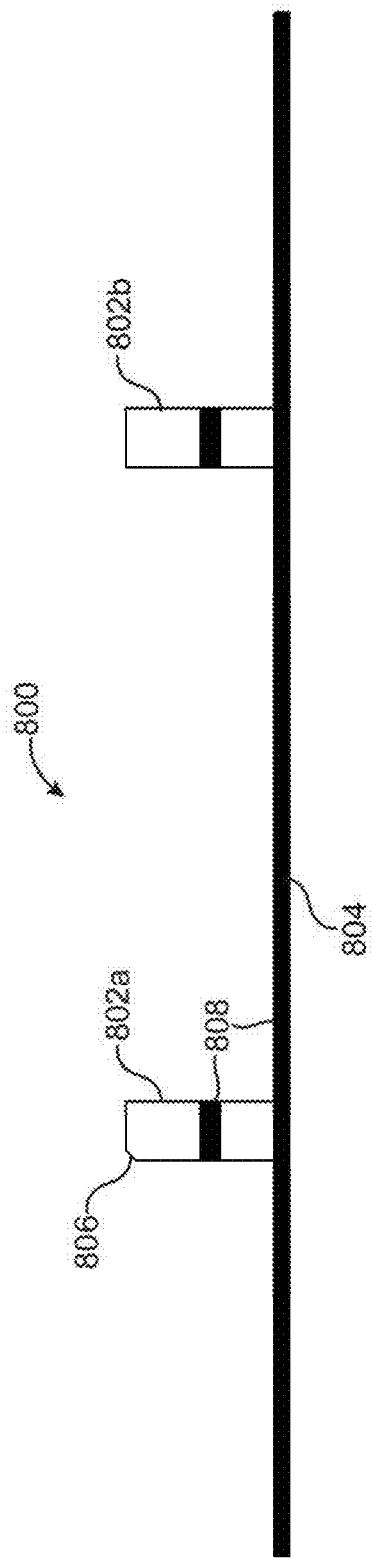
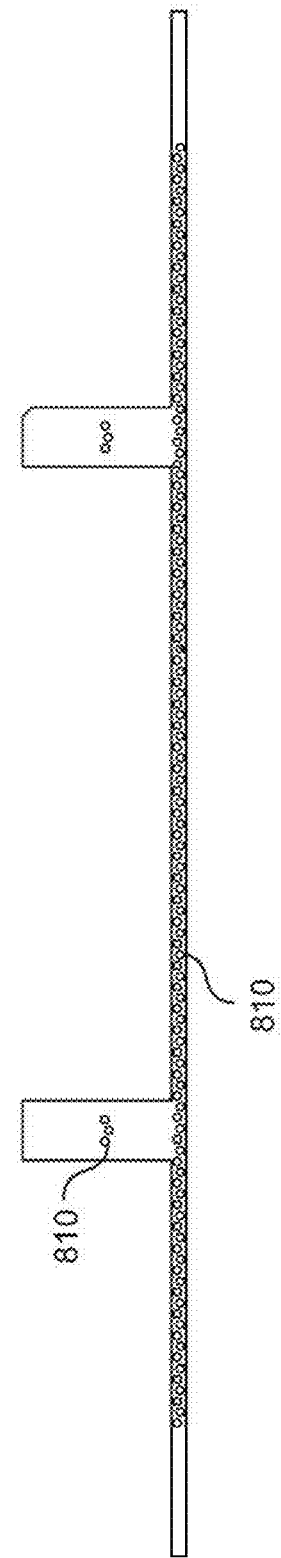
FIG. 8A
FIG. 8B

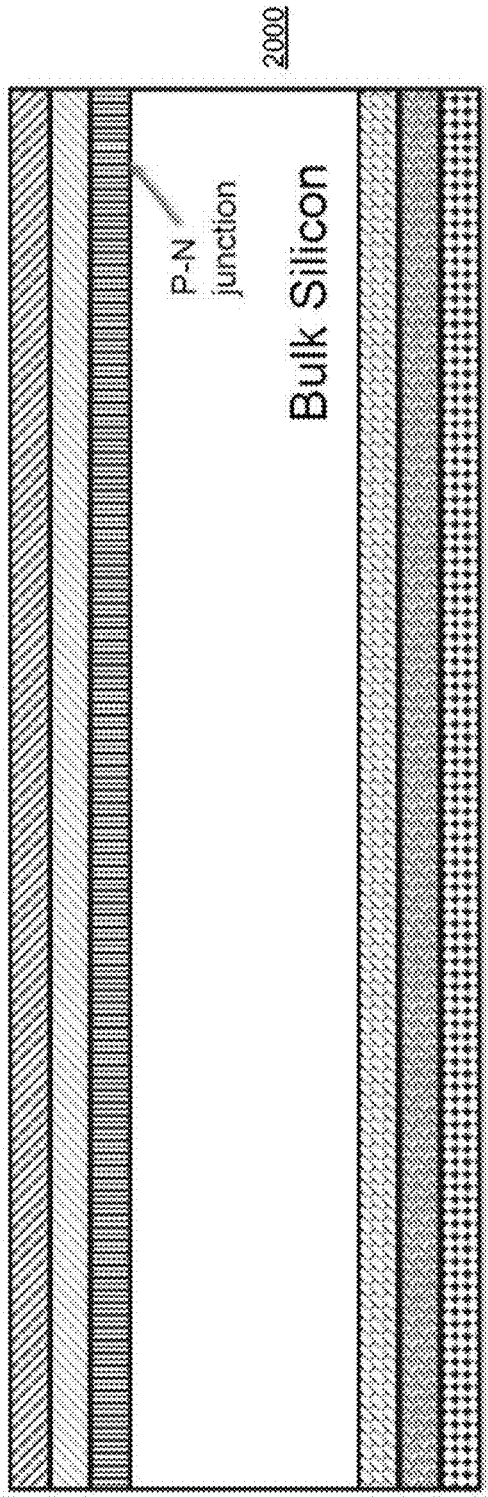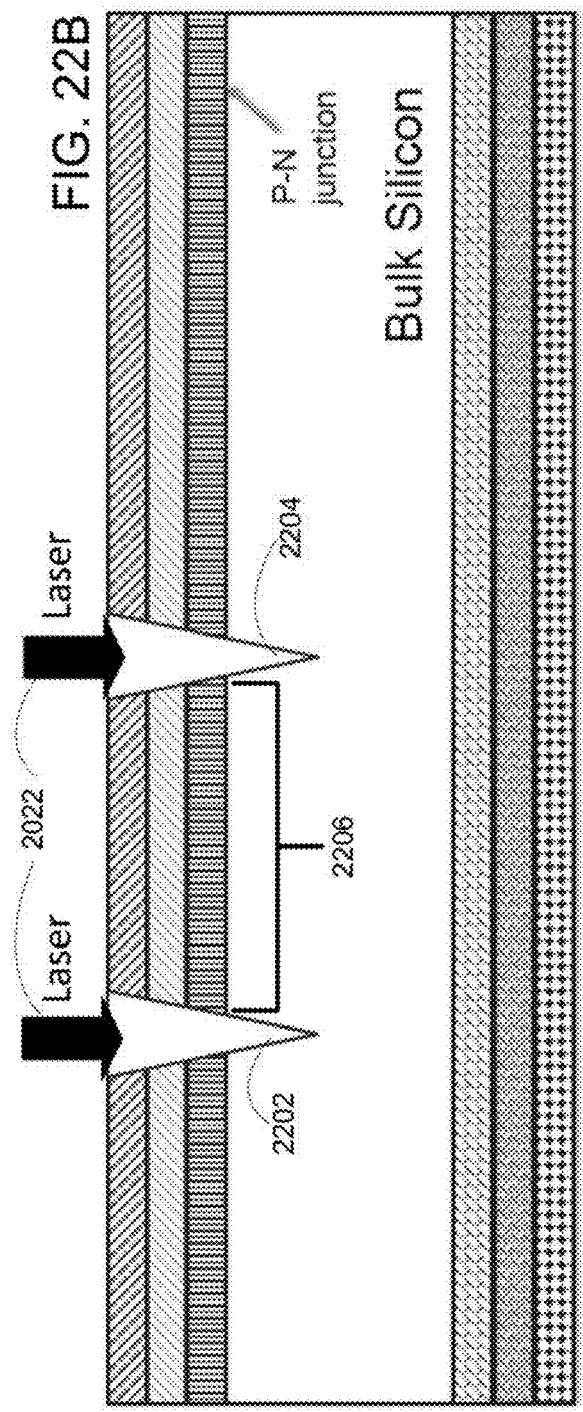

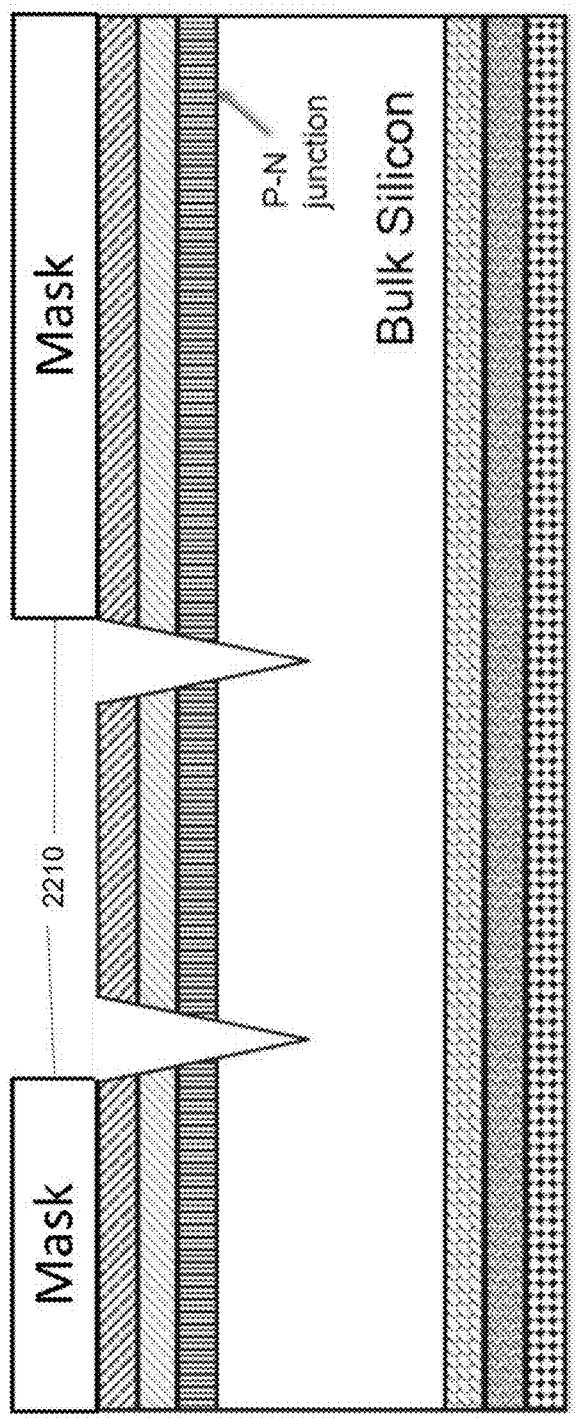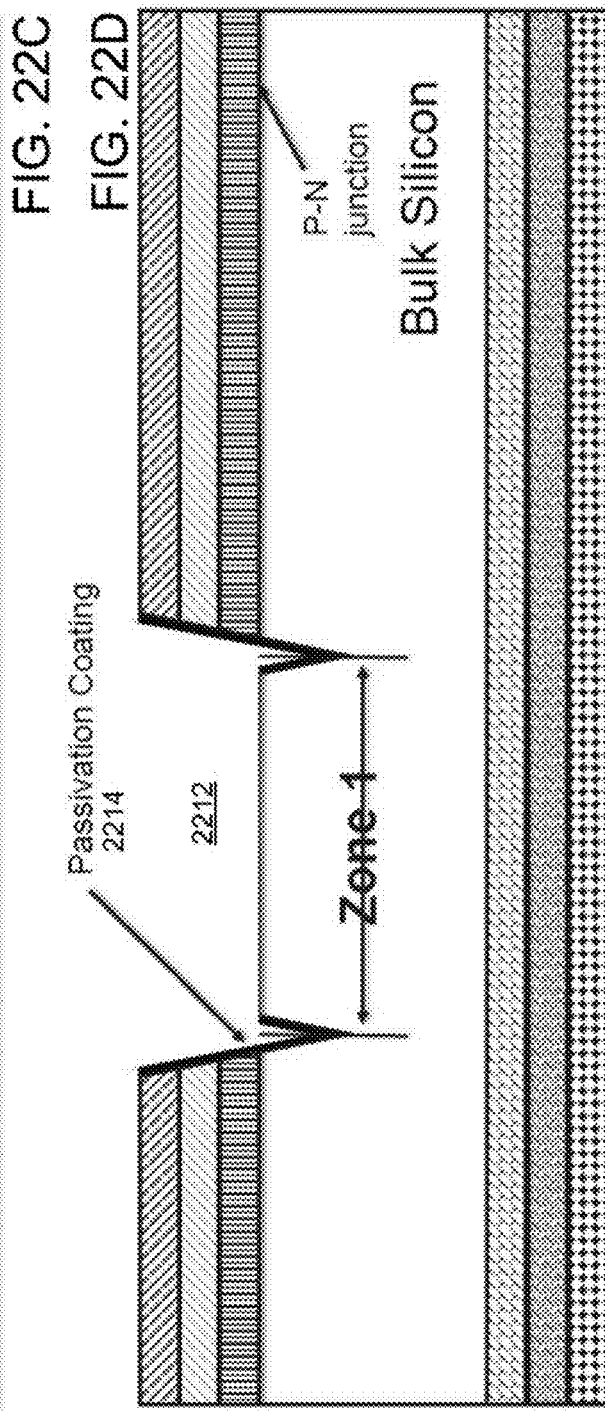

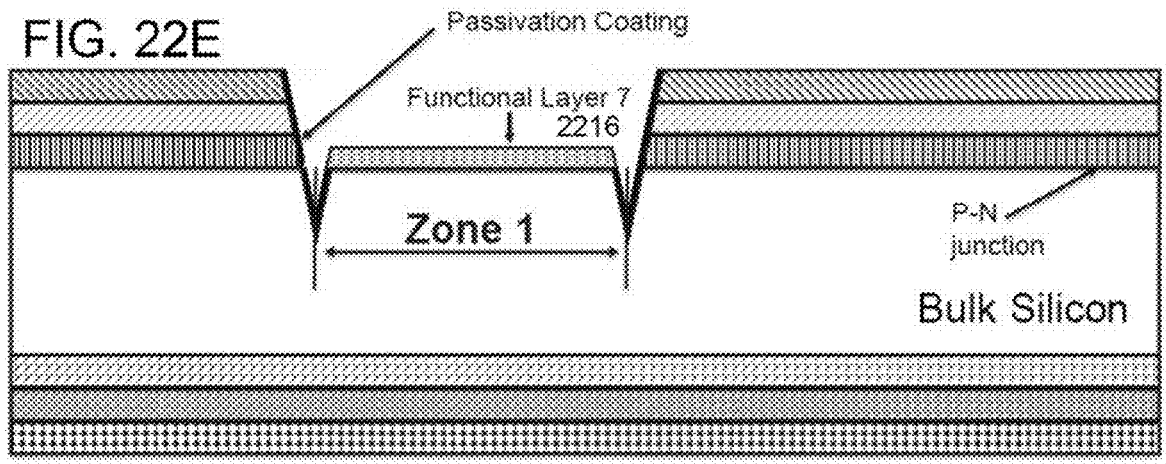
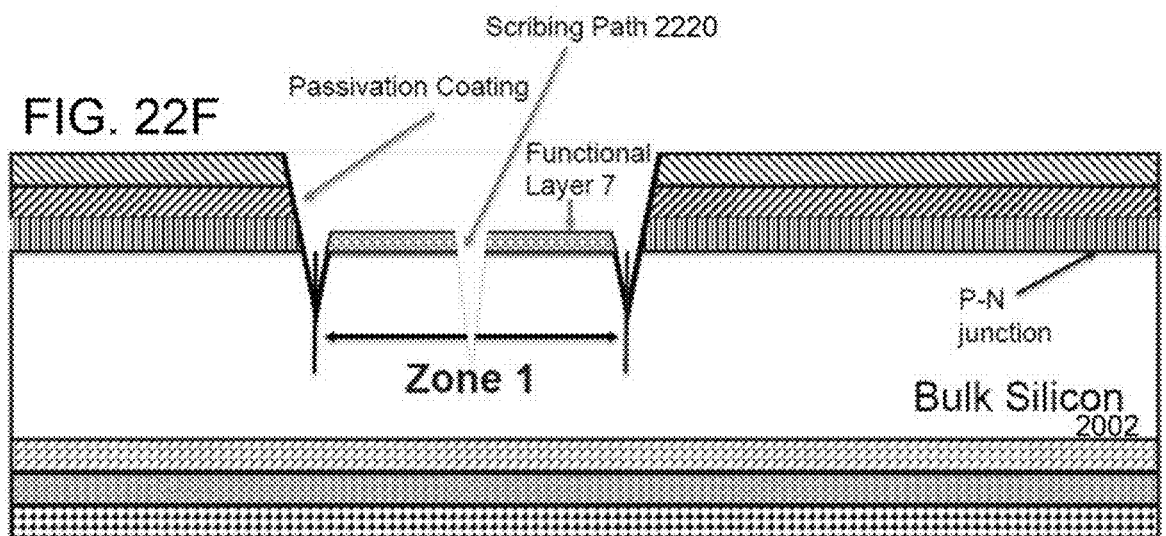
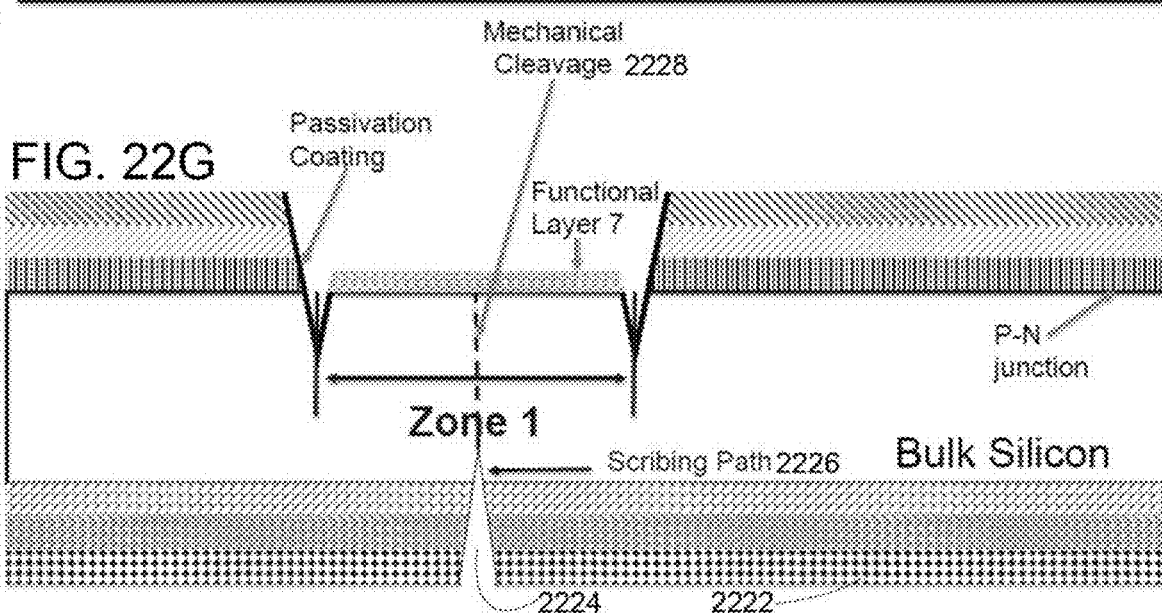

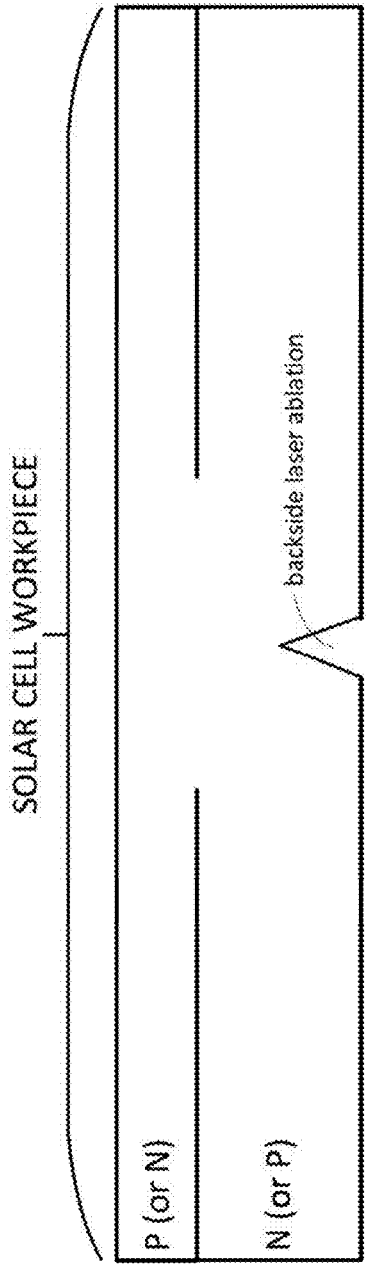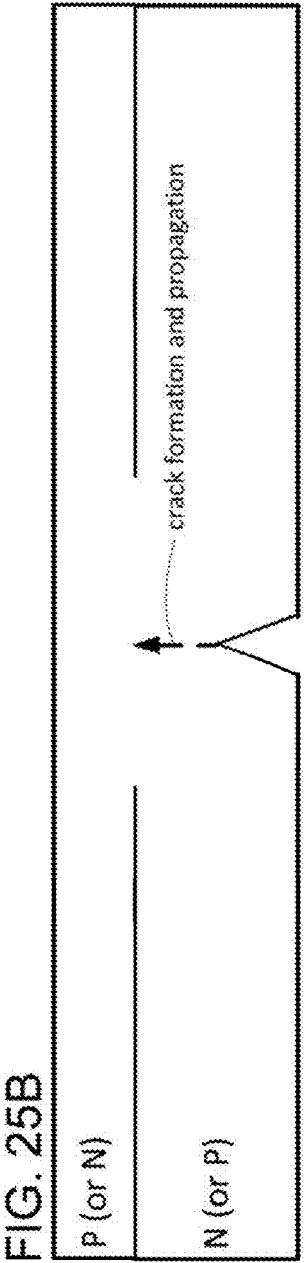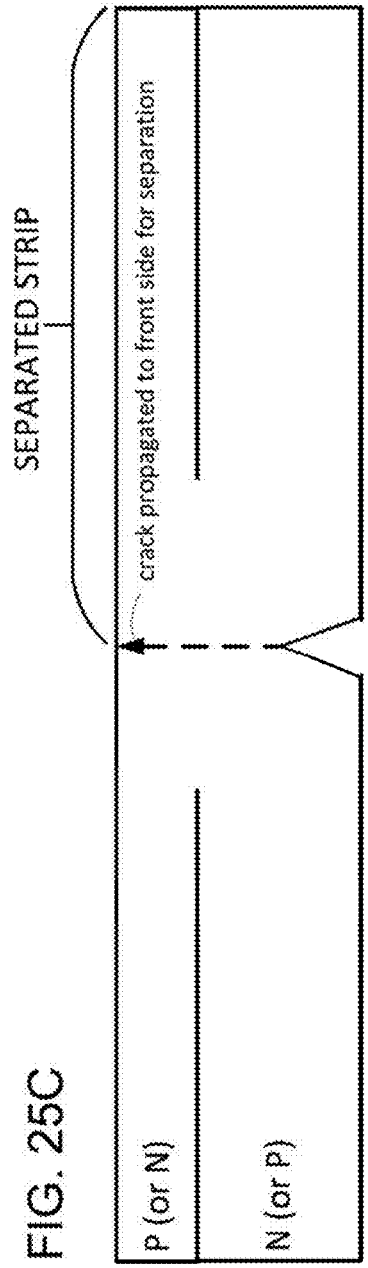

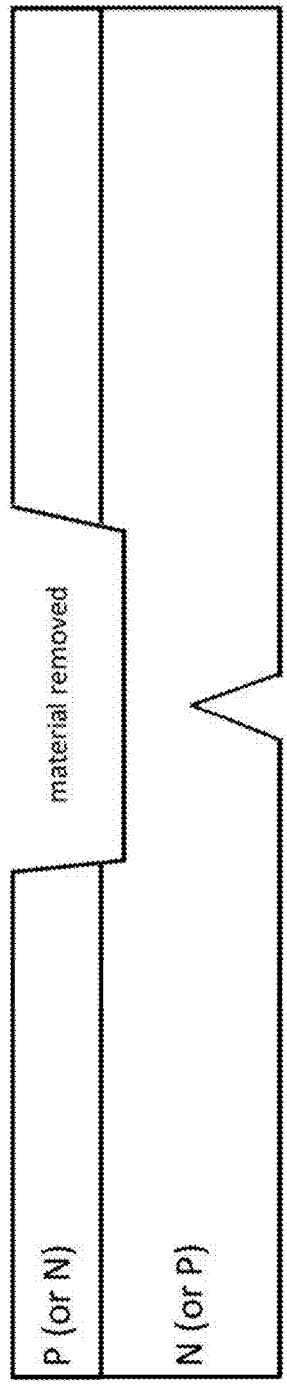
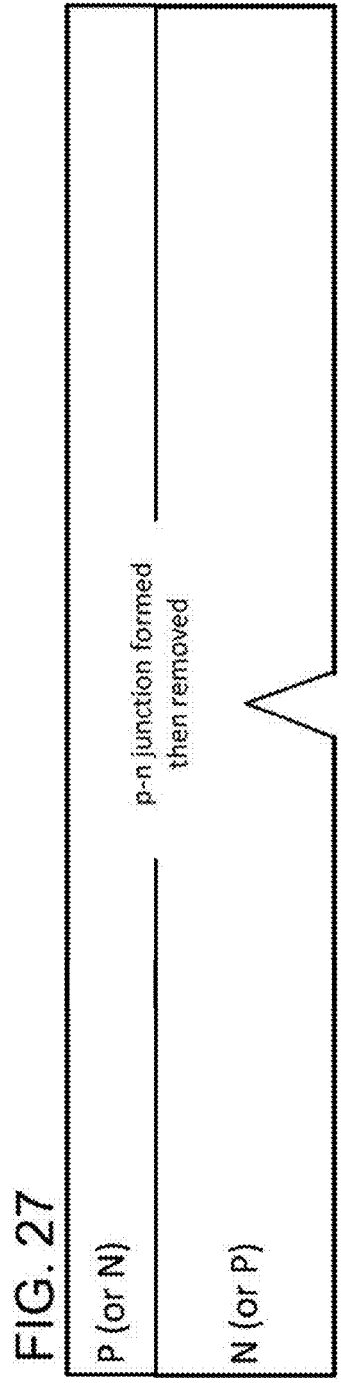
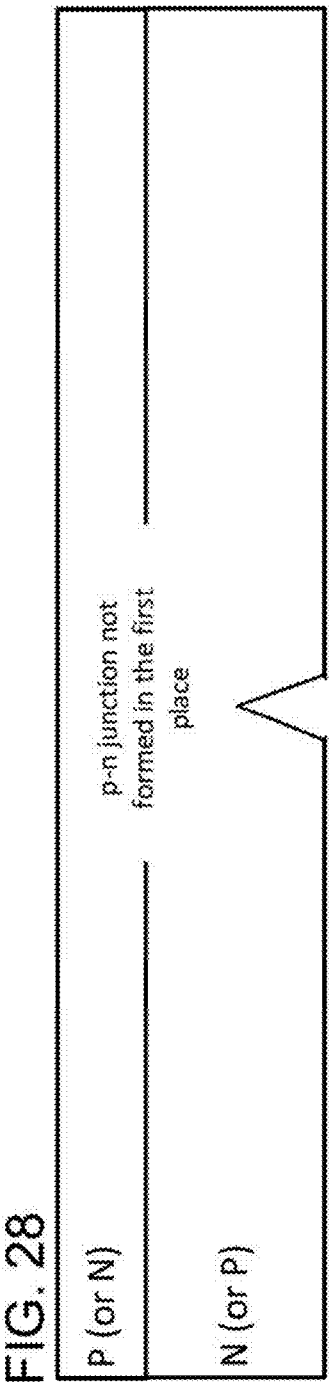

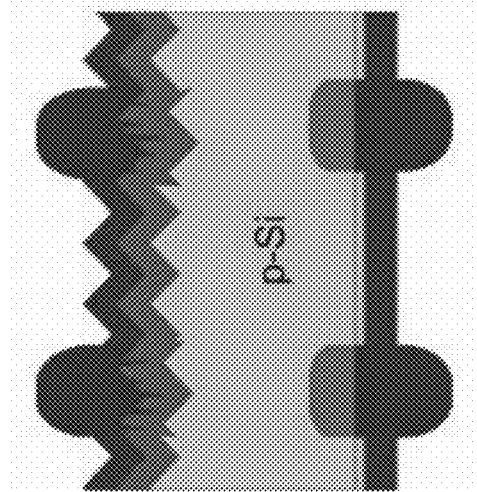
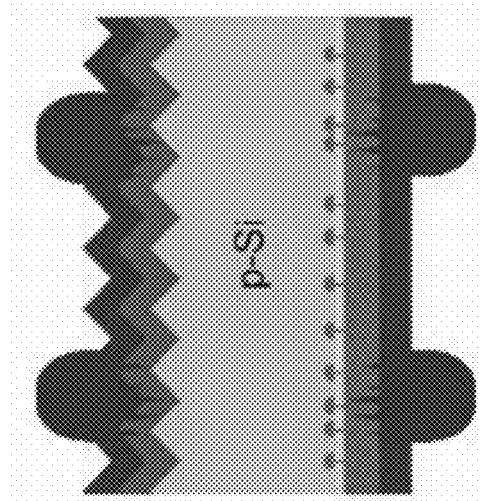
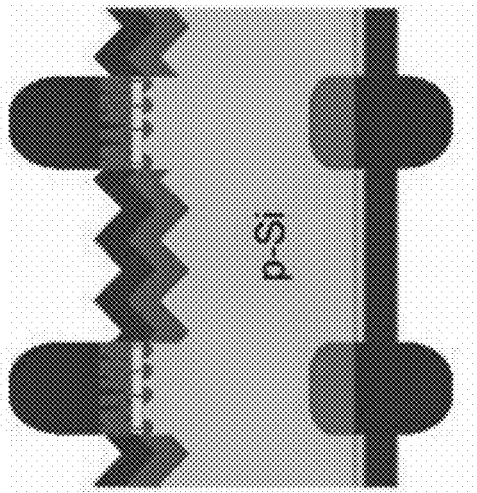
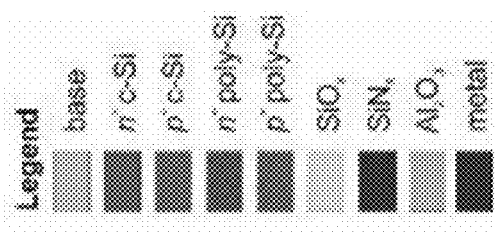
FIG. 29B

US 12,046,693 B2

SOLAR DEVICE FABRICATION LIMITING POWER CONVERSION LOSSES

BACKGROUND

Photovoltaic devices are becoming an increasingly important element of global energy production. As technologies for creating photovoltaic materials are improved and economies of scale manifest, the price of photovoltaic material has been dropping at an exponential rate, making photovoltaic installations increasingly cost-competitive with other energy production technologies.

Due to the high scalability of photovoltaic devices and the ubiquitous presence of solar radiation, photovoltaic energy generation is well suited for small-scale installations that serve individual residential and commercial structures. In these scenarios, photovoltaic cells are typically arranged into individual panels or modules, and one or more of the modules are installed in an area that is exposed to solar radiation. The modules convert solar energy to electricity, which is used to supply the energy needs of a structure, stored for future use, or delivered to the electrical grid.

SUMMARY

Separation of individual strips from a solar cell workpiece, is accomplished by excluding a junction (e.g., a homojunction such as a p-n junction, or a heterojunction such as a p-i-n junction) from regions at which separation is expected to occur. According to some embodiments, the junction is excluded by physical removal of material from inter-strip regions of the workpiece. According to other embodiments, the junction is achieved by changing an effective doping level (e.g., counter-doping, deactivation) at inter-strip regions. For still other embodiments, the junction is never formed at inter-strip regions in the first place (e.g., using masking during original dopant introduction). By imposing distance between the junction and defects arising from separation processes (e.g., backside crack propagation), losses attributable to electron-hole recombination at such defects are reduced, and power conversion efficiency of shingled modules is enhanced.

BRIEF DESCRIPTION OF THE DRAWINGS

FIGS. 7A and 7B illustrate respective coated and uncoated surfaces of a front conductive ribbon;

FIGS. 8A and 8B illustrate respective coated and uncoated surfaces of a back conductive ribbon;

FIGS. 22A-G show simplified cross-sectional views illustrating the fabrication of a photovoltaic element according to an embodiment.

FIGS. 25A-C are simplified cross-sectional views illustrating a process of separating a strip from a solar cell workpiece.

FIGS. 26-28 are simplified cross-sectional views illustrating approaches to improving power conversion efficiency according to embodiments.

FIG. 29B shows simplified cross-sectional views of PERC+, POLO-RS, and PERC+POLO devices.

DETAILED DESCRIPTION

Figure 1A:
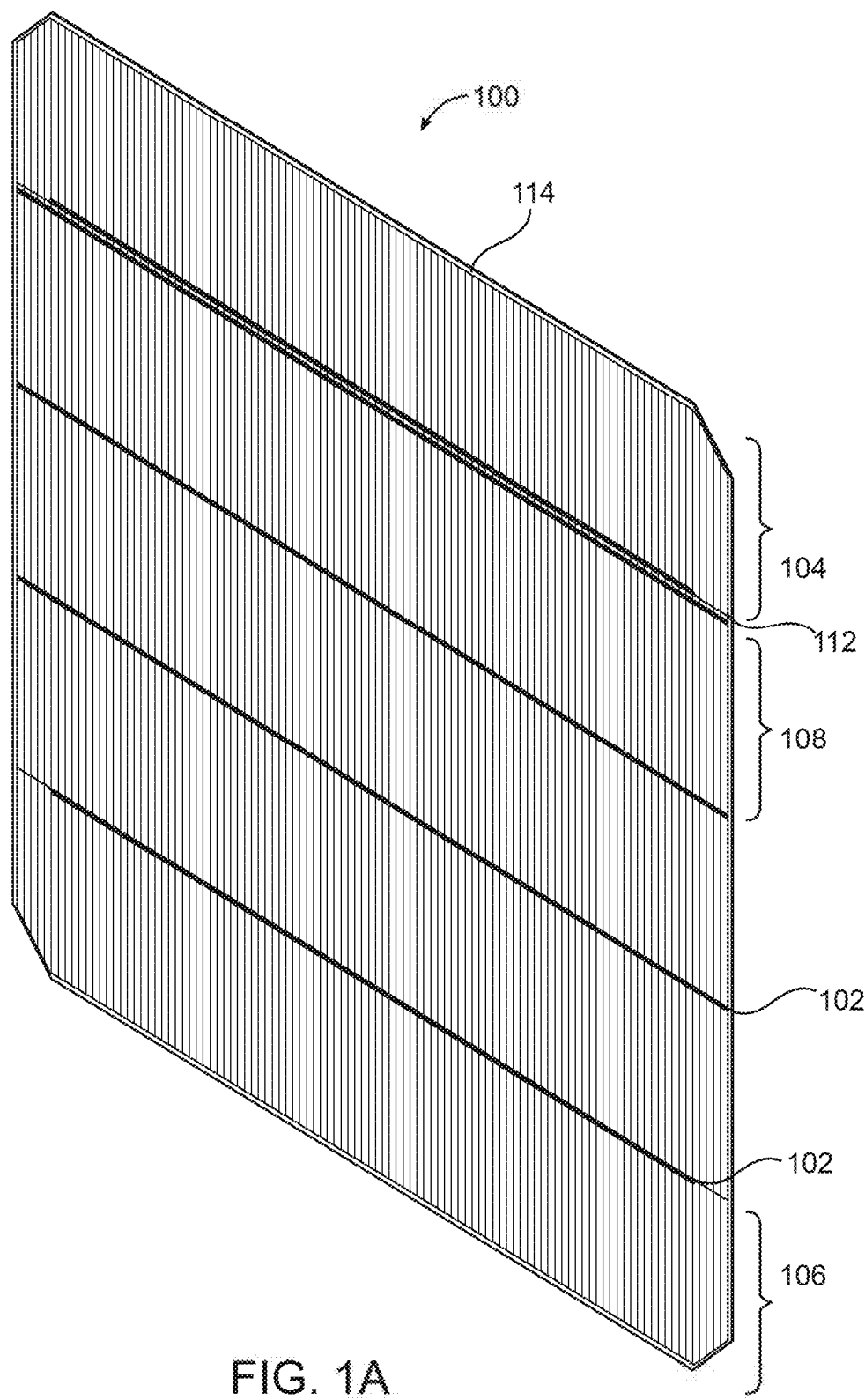
FIGS. 1A and 1B illustrate respective front and back sides of a photovoltaic cell.

A detailed description of embodiments is provided below along with accompanying figures. The scope of this disclosure is limited only by the claims and encompasses numerous alternatives, modifications and equivalents. Although steps of various processes are presented in a particular order, embodiments are not necessarily limited to being performed in the listed order. In some embodiments, certain operations may be performed simultaneously, in an order other than the described order, or not performed at all.

Numerous specific details are set forth in the following description. These details are provided in order to promote a thorough understanding of the scope of this disclosure by way of specific examples, and embodiments may be practiced according to the claims without some or all of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

It is convenient to recognize that a photovoltaic module has a side that faces the sun when the module is in use, and an opposite side that faces away from the sun. Although, the module can exist in any orientation, it is convenient to refer to an orientation where "upper," "top," "front" and "aperture side" refer to the sun-facing side and "lower," "bottom" and "back" refer to the opposite side. Thus, an element that is said to overlie another element will be closer to the "upper" side than the element it overlies.

Solar cells, also called photovoltaic (PV) cells, convert the sun's energy into electricity using semiconductors typically made of silicon. The cells are electrically connected to each other and assembled into a solar module. Multiple modules can be wired together to form an array. The larger and more efficient the module or array, the more electricity it can produce. Innovation is critical to optimizing solar module energy and reducing costs.

Solar energy has become an essential part of the economy and a key component of future energy supply. The market for solar PV modules is highly competitive and growing rapidly. Although solar module manufacturers have succeeded over the years in reducing costs dramatically, the efficiency (power produced per area) of solar modules has remained fairly constant throughout the last decade. For solar module manufacturers, the most common path for improving their sales and profit margins is to increase module efficiency, since a higher efficiency module means fewer components and lower installation costs per watt for all of the other elements in a solar PV system. Solar module manufacturers typically increase the power in their modules by 2-3% per year.

In comparison, embodiments of the present application increase the power of solar modules by up to 20% compared to conventional modules without adding incremental costs. This vastly exceeds the performance of conventional solar modules.

Embodiments of the present disclosure include high density strings of interconnected PV cells which are packed more efficiently onto the solar module to reduce inactive space between cells. Embodiments use advanced semiconductor manufacturing processes and equipment in which solar cells are scribed (cut) and singulated (separated) into highly-uniform strips, re-assembled into strings of cells, packaged and tested. By utilizing a ribbon-less interconnection process, cells are cut and overlaid (shingled) without soldering which creates a highly reliable and efficient power unit assembly.

Embodiments of the present disclosure produce up to 20% more power than a conventional solar module and provide a visually attractive all-black appearance compared to conventional solar modules on the market today. Embodiments use advanced cell interconnect and module production processes. The technology results in lower overall system costs; higher efficiency modules produce more power (watts) per square meter area, reducing the number of panels needed per installation and thereby lowing labor and material costs.

FIG. 1A is a front perspective view of a photovoltaic (PV) cell 100. This figure is merely an example of a photovoltaic cell, and one of ordinary skill in the art would recognize other variations, modifications, and alternatives to the specific embodiment shown in FIG. 1.

The surface of PV cell 100 illustrated in FIG. 1A is an aperture region of the cell 100 that exposes photovoltaic material, which is exposed to solar radiation. In various embodiments of PV cells 100, the photovoltaic material can be silicon, polycrystalline silicon, single crystalline silicon, or other photovoltaic materials as known in the art.

The solar cell 100 can be characterized as comprising a plurality of strips, each of which has a bus bar 102 on its front face. In some embodiments the cell can be without chamfered corners. Because the cell 100 shown in FIG. 1A has chamfered corners, some of the strips have different shapes. The cell 100 has a first end strip 104 disposed against a first edge of the cell, and a second end strip 106 disposed on a second edge of the cell opposing the first edge.

In the embodiment shown in FIG. 1A, the first end strip 104 has a 45-degree chamfer 110 on each outer corner. Other embodiments may have other cell shapes—for example, in some embodiments, the cell 100 is a rectangular cell with right-angle corners.

Three rectangular interior strips 108 are disposed in a central portion of the PV cell 100. Each of the interior strips 108 in FIG. 1A has a substantially rectangular shape, and a bus bar 102 running across the front surface. A plurality of thin conductive fingers 114 that are arranged perpendicular to the bus bars 102 are visible on the aperture surface of the strips.

The bus bar 102 associated with the second end strip 106 is separated from the bus bar 102 associated with the adjacent interior strip 108 by a narrow scribe region 112. The scribe region 112 is a region where the cell may be cut to separate the various strips.

In the cell 100 of FIG. 1, the first end strip 104, the second end strip 106, and the plurality of strips 108 are arranged in parallel to each other in the cell 100 such that the cell is divided into a total of five strips including three interior strips 108.

In an embodiment, the PV cell 100 has a length and a width of 156.75 mm plus or minus 2 mm, but other embodiments are possible.

Figure 1B:
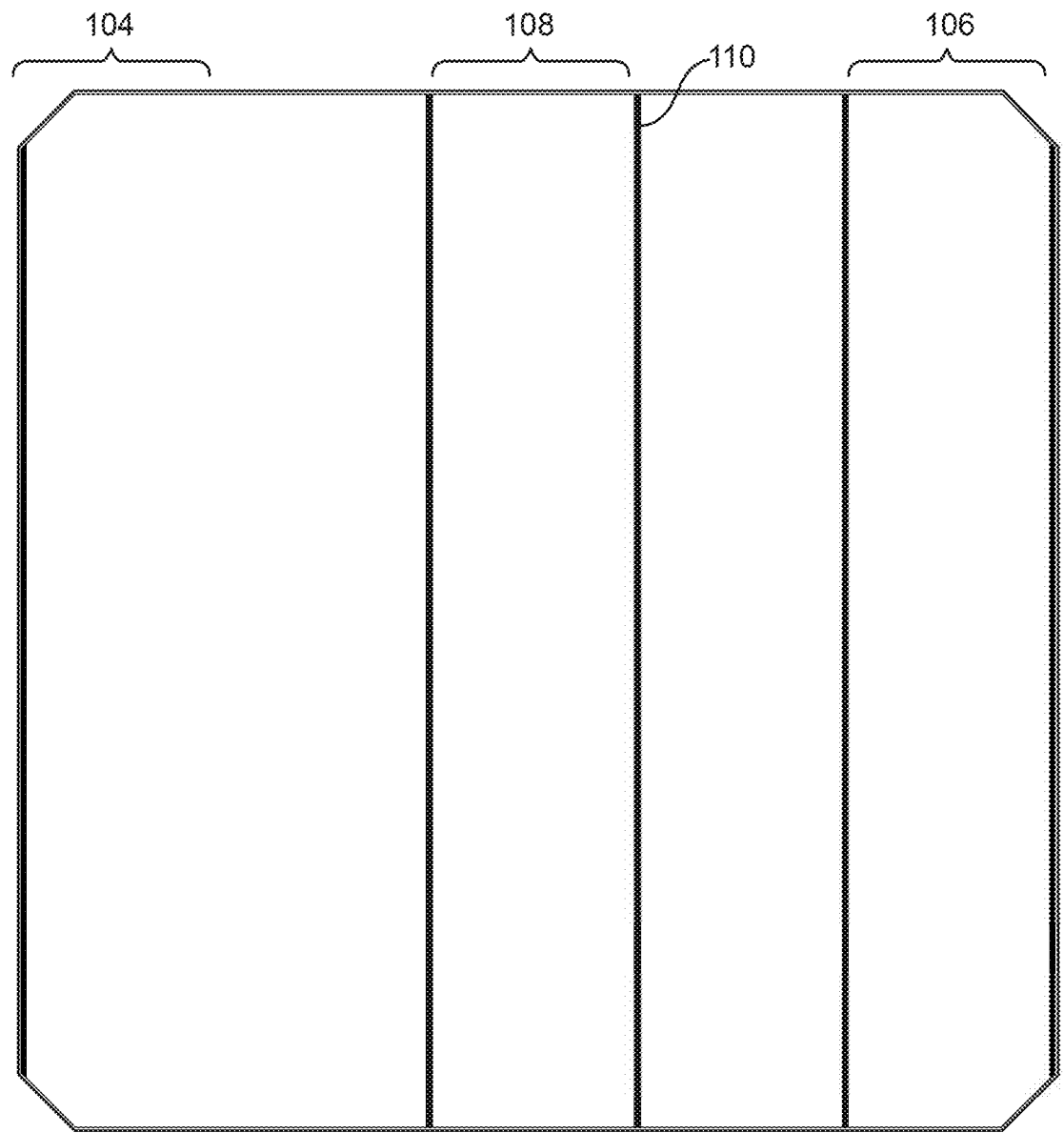

FIG. 1B shows a backside of the PV cell 100 of FIG. 1A. A plurality of backside bus bars 110 are asymmetrically arranged on the backside of the PV cell 100.

In cell 100, the plurality of strips 104, 106 and 108 are monolithically connected with each other. In embodiments of the present application, the monolithic solar cell 100 is subjected to a separation or singulation process in which the strips are physically separated from one another using, for example, mechanical sawing or laser energy. The strips may be separated from one another by dividing the PV cell 100 at its bus bars, so that each face of a strip has a bus bar located at an edge of the strip.

Figure 2A:
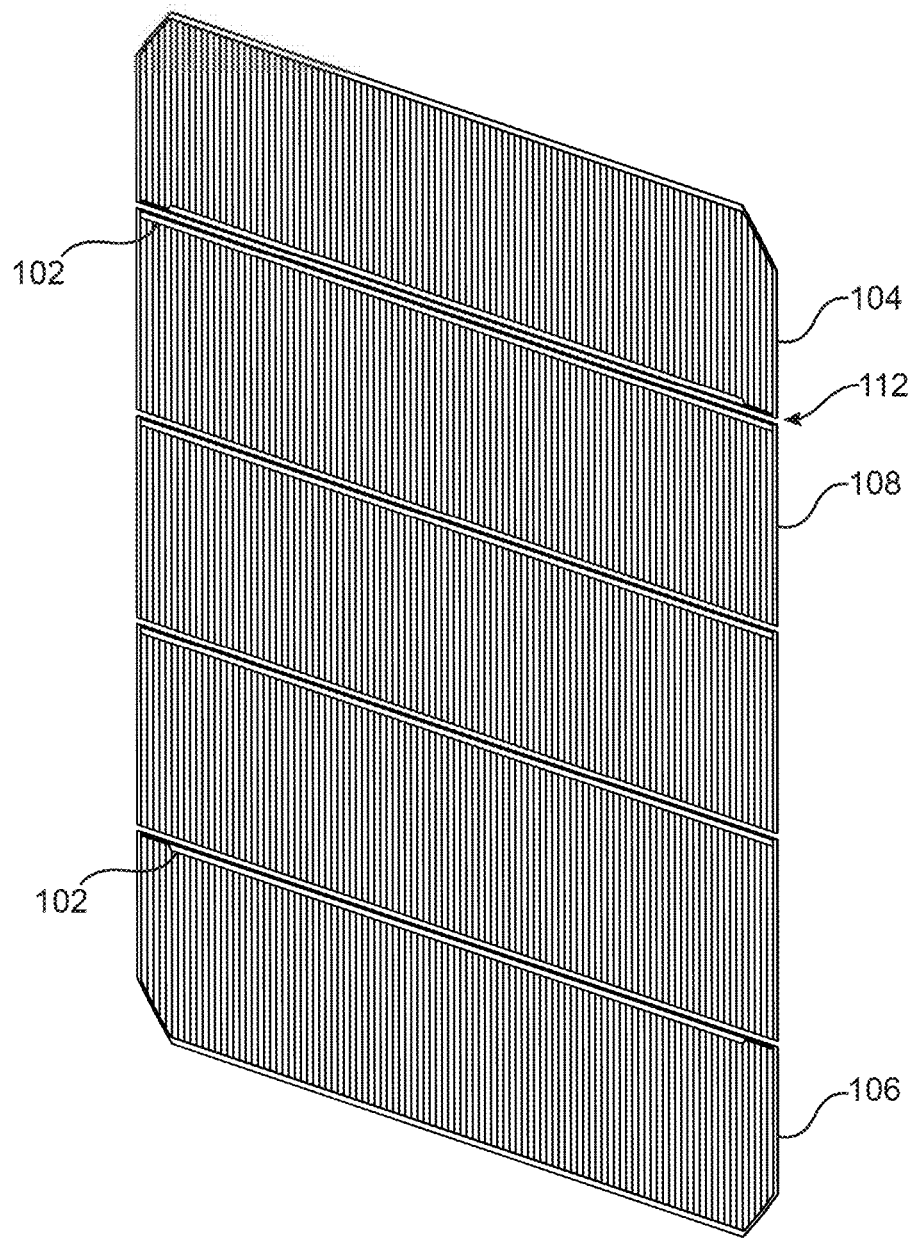
FIGS. 2A and 2B illustrate respective front and back sides of a photovoltaic cell that has been separated into strips.
Figure 2B:
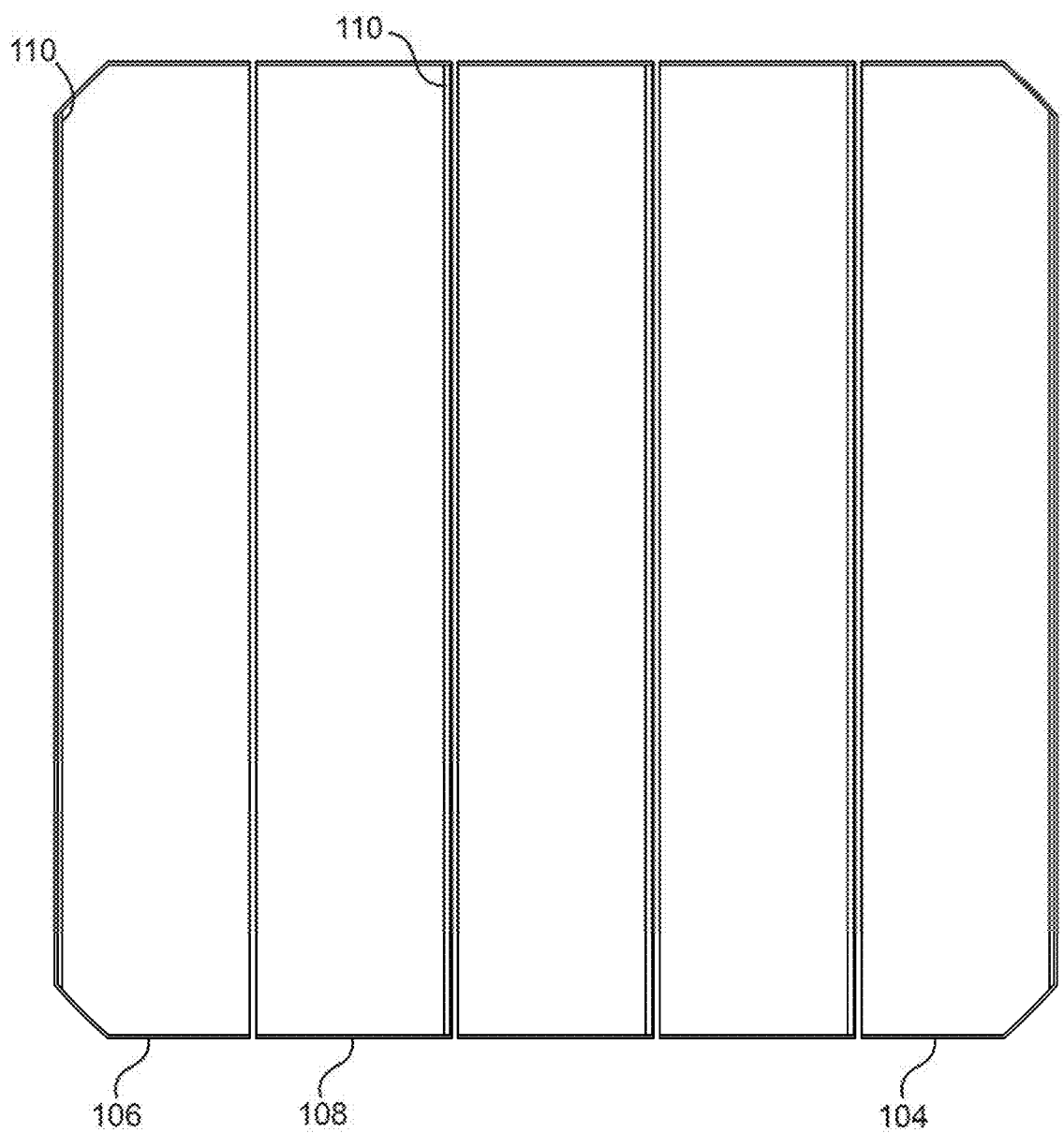

FIG. 2A is a front perspective view of a PV cell 100 that has been subjected to a separation process that separates the cell into a plurality of individual strips. In the embodiment shown in FIG. 2A, the cell 100 is separated into first and second end strips 104 and 106, and three rectangular strips 108 from the middle of the cell. FIG. 2B shows a back view of the same cell 100.

Between FIG. 2A and FIG. 2B, it is apparent that each strip has one bus bar exposed on each face of the strip. The front face of first end strip 104 exposes a front bus bar 102, the front face of second end strip 106 shows another front bus bar 102, and each of the front faces of strips 108 from the interior of the cell have front bus bar 102 on one edge.

On back faces of the strips, as seen in FIG. 2B, every strip has one backside bus bar 110 against an edge of the strip. For the first and second end strips 104 and 106, backside bus bars 110 are disposed on the longest edge of the strips, which is opposite to the chamfered edge. Accordingly, the first and second end strips 104 and 106 have substantially the same characteristics. Similarly, each of the interior strips 108 has substantially the same characteristics as other interior strips 108.

Although FIGS. 1A-2B illustrate strips separated from a standard sized cell 100, other embodiments are possible. For example, it is possible to fabricate PV strips in net shape without any cutting, and to cut PV strips from cells of a variety of shapes and sizes.

Figure 3A:
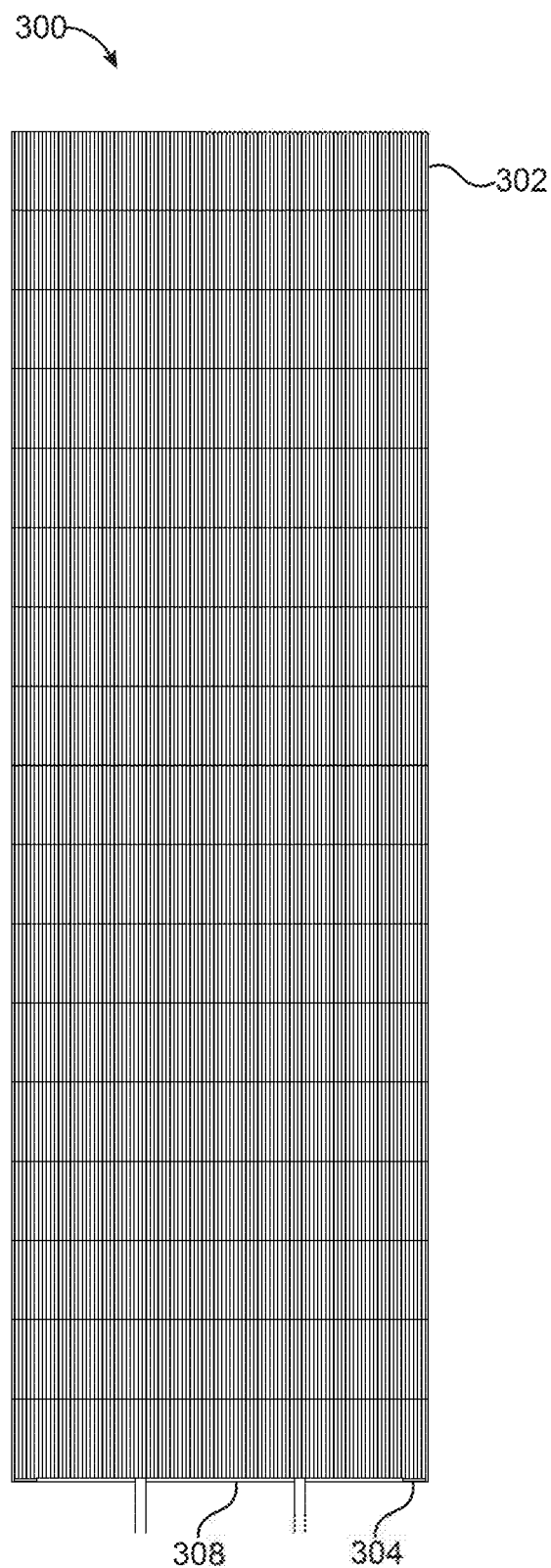
FIGS. 3A, 3B and 3C illustrate respective front, side and back surfaces of a photovoltaic string.
Figures 3B, 3C:
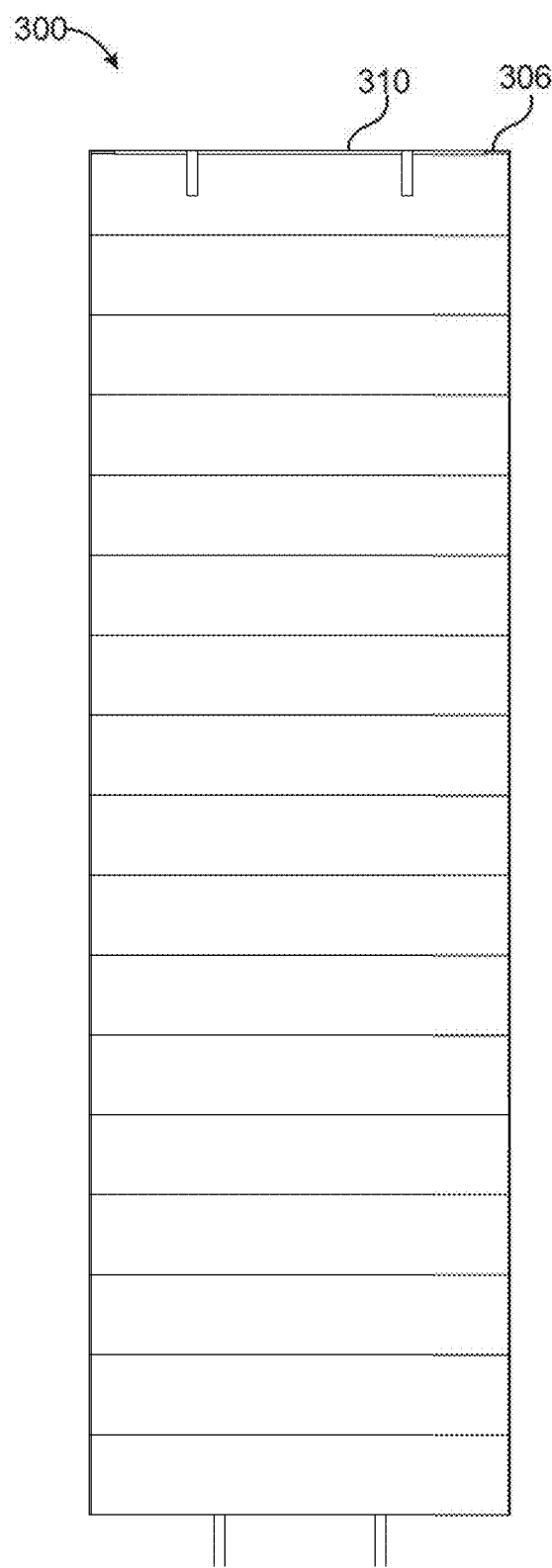

The presence of a front bus bar 102 and back bus bar 110 facilitates a tiled arrangement of individual strips into a string. FIGS. 3A, 3B and 3C illustrate an embodiment of a string 300 that comprises a plurality of strips 302, each connected on a long edge to at least one other strip. FIG. 3A shows a front face of a string 300, FIG. 3B shows a back face of the string 300, and FIG. 3C shows a side view of the string 300.

In the embodiment of FIGS. 3A to 3C, the string 300 has 17 strips 302 coupled in series. However, the number of strips 302 in a string 300 can vary between different embodiments. For example, a string 300 may comprise two strips 302, ten strips 302, twenty strips 302, or fifty strips 302.

The number of strips 302 in a string 300 affects the electrical characteristics of the string. When strips 302 are connected in series to form a string 300, the current of an individual strip is the same as the current for the entire string, but the voltage of each strip is combined. In a simplified example, a string of 10 strips, in which each strip operates at 5 volts and 5 amps, would have an operating voltage of 50 volts and an operating current of 5 amps. Thus, arranging strips 302 into strings 300 facilitates adapting electrical characteristics of photovoltaic material.

As seen in FIG. 3C, strips 302 are arranged in an overlapped or tiled configuration within a string 300. In more detail, front bus bars 304 of strips 302 in the string 300 overlap with and are electrically and mechanically coupled to back bus bars 306 of adjacent strips. In embodiments, the strips 302 may be connected by a material such as a metallic solder or an electrically conductive adhesive (ECA).

An ECA has several advantages as a coupling material in a string 300. Polymeric components of ECA can provide higher elasticity than metal materials, which can help maintain a mechanical bond under various thermal states when the materials contract and expand. In other words, the ECA can relieve mechanical stress caused a coefficient of thermal expansion (CTE) mismatch between mated materials. ECA can be formulated to be soluble to various solvents, which facilitates various manufacturing processes. In addition, an ECA bond is typically more elastic than, for example, a solder bond, so an ECA bond is less prone to cracking during assembly.

In an embodiment in which strips are connected by ECA, the ECA may be a cured adhesive polymer formulation that is highly loaded with conductive metal particles. In some embodiments, the conductive metal is silver. The ECA may be a thermosetting acrylate adhesive. The adhesive may have may be modified with one or more hardening components such as epoxy, phenol-formaldehyde, urea-formaldehyde, etc., that provide hardness and bonding strength. In an example, the ECA is a low temperature cure one-part adhesive.

When strips 302 are connected in series in a string 300, bus bars at the far ends of the string are exposed. In other words, unlike strips 302 in the middle of a string 300, one bus bar of the outermost strips in a string is connected to an adjacent strip, but one bus is not connected to a strip. Instead, in embodiments of the present disclosure, bus bars of the outermost strips 302 are connected to conductive ribbons.

In embodiments of the present disclosure, a system utilizes a ⅕th strip width versus ⅓rd, ¼th or ⅙th of a cell strip width, as shown in Table 1 below.

TABLE 1

| | PV Width | | | | | Comment |
|---|---|---|---|---|---|---|
| Width | 78 | 52 | 39 | 31.2 | 26 | mm |
| Cell Current | 4.5 | 3 | 2.25 | 1.8 | 1.5 | Isc = 9A standard cell |
| Fingers | 80-200 | 80-150 | 80-120 | 80-100 | 80 | (Microns) Based on standard cell finger |
| Shading | 7.0% | 5.8% | 5.0% | 4.5% | 4% | Finger shading |
| Cell Utilization | 98.7% | 97.4% | 96.2% | 94.9% | 93.6% | 2 mm overlap |
| Placements | 2× | 3× | 4× | 5× | 6× | Over standard module |
| Fill Factor | 76% | 77% | 78% | 79% | 79% | |

In Table 1, width refers to the width of a strip after it has been cut from a cell. Current is the amount of current that a strip produces, which is directly proportional to the size of the strip. Fingers carry current across a strip, while shading is the area of the strip shadowed by the fingers. Cell utilization is the amount of area in a string in which strips do not overlap one another. The number of placements is how many strips are cut from a cell and placed in a string. Fill factor is the efficiency of the photovoltaic material present in a string compared to its maximum power producing potential.

In an example, modules are configured to have current and resistance characteristics that are similar to a conventional module (Voc, Vmp, Isc, Imp, Power). However, modules can be designed to have different characteristics for different applications. For example, modules created according to embodiments of this disclosure can be configured to have lower voltage and higher current for the solar tracking applications, and to have higher voltage and lower current for residential modules that interface with module power electronics.

In an example, one embodiment uses a 31.2 mm strip width, which optimizes module characteristics, as well as providing a current and voltage similar to standard modules. This allows embodiments to take advantage of standard inverters, electronics, and mechanical features.

FIG. 3A shows a front ribbon 308 over the exposed front bus bar 304 of the lowermost strip 302 in the string 300. As seen in FIG. 3B, a back conductive ribbon 310 covers the back bus bar 306 at of the uppermost strip 302 of the string 300. The back bus bar 306 is the back terminal of a strip 302, and front bus bar 304 is a front terminal. Each of the front and back ribbons 308 and 310 has two tabs protruding from the respective the ribbon. In a flat orientation, the tabs of the front ribbon 308 extend outward from the string 300, while the tabs of back ribbon 310 extend inwards from the edge strip to which the back ribbon 310 is attached towards the middle of the string. In an embodiment, the front surface of a strip 302 has a positive polarity and the back surface has a negative polarity. However, other embodiments are possible, where the exposed front aperture surfaces has negative polarity and the back surface has positive polarity.

Figure 4:
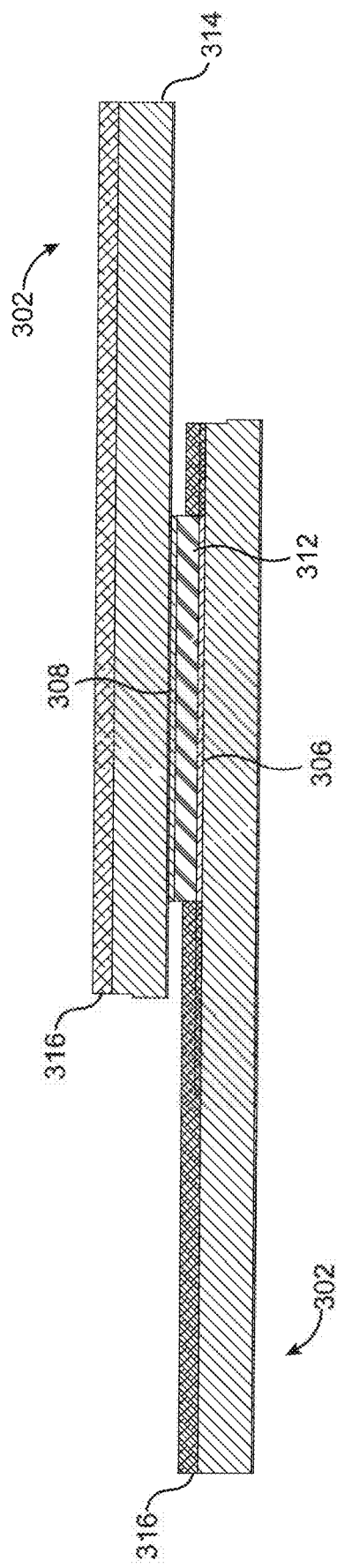
FIG. 4 illustrates overlapped photovoltaic strips in a string.

FIG. 4 shows a detail view of an overlapped joint in which two adjacent strips 302 are connected to one another in a string 300. The overlapped open ends of the strips 302 have a staggered profile, which results from a separation process in which PV cells are separated using two distinct operations, e.g. a scribe operation and a breaking operation. A cutting operation may result in a kerf in the inset portion of the edge, while a breaking operation does not cause a kerf, resulting in the slight protrusion visible in FIG. 4.

Each strip 302 in the string 300 has a thickness of PV material 314 and a thickness of a backing material 316. In many conventional PV cells, the backing material 316 is aluminum, but embodiments are not limited to that material. A back bus bar 306 is exposed by the backing material 316, and a layer of ECA 312 mechanically and electrically couples the back bus bar 306 to a front bus bar 308 on the overlapped strip 302.

Figure 5:
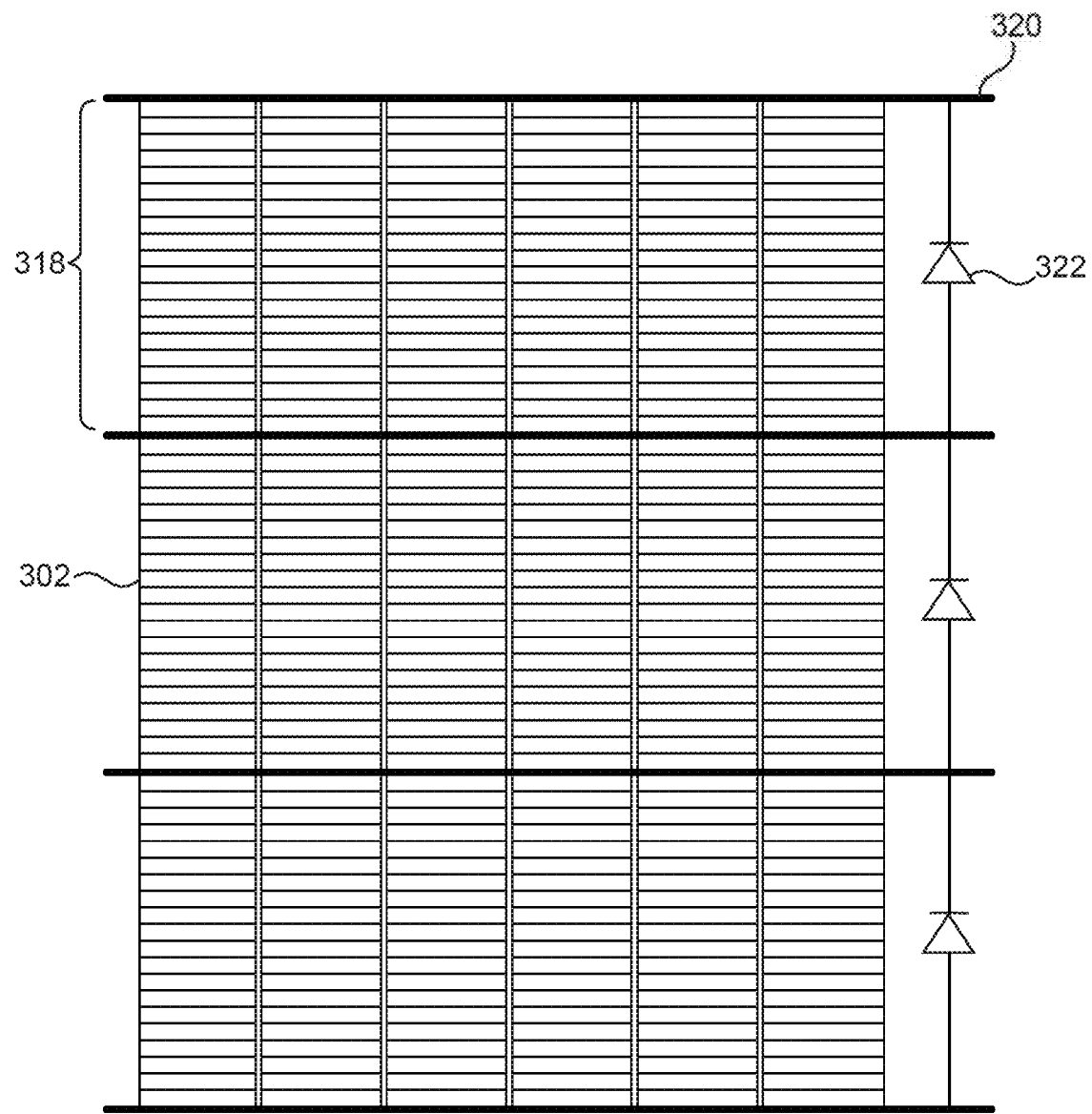
FIG. 5 is a simplified illustration of a photovoltaic module with three zones.

FIG. 5 is a simplified diagram of a photovoltaic apparatus that comprises a plurality of strings 300 that are arranged into a plurality of zones 318. In the specific embodiment shown by FIG. 5, each string 300 has 20 strips 302 connected in series with one another. Each string 300 is connected in parallel with five additional strings through electrical busses 320 disposed at opposing ends of the parallel connected strings, so that a total of six strings are connected in parallel. Each set of strings 300 that are connected in parallel is referred to herein as a "zone" 318.

The number of strings 300 in a zone 318 may vary between embodiments. For example, other embodiments may have from two to ten strings 300 in a zone 318. In addition, the number of zones 318 in a module can vary between embodiments.

The embodiment shown in FIG. 5 has three separate zones 318, and each zone is protected by a single diode 322 coupled in parallel to the six strings 300 in the respective zone. Conventional PV module arrangements are divided into multiple cells that are all connected in series with one another, and diodes are periodically disposed between subgroups of the series connected cells. In such conventional arrangements, when a single cell is disabled, for example by being shaded, all other cells coupled to the same diode are also disabled. In other words, in conventional devices, when one cell is disabled, all cells that are coupled to the diode that protects the disabled cell are also disabled.

In contrast, the PV device shown in FIG. 5 has better performance. Each diode 322 protects a zone 318 in a much more efficient manner than conventional devices. Like conventional devices, when one or more strip 302 in a first string 300 is disabled, all of the strips in the first string are disabled, and current flows through the diode 322. However, unlike conventional devices, all other strings 300 that are present in the same zone 318 and do not have any disabled strips 302 continue to produce normal levels of energy. Accordingly, energy losses due to shading are much lower in embodiments of the present application than conventional devices.

Figure 6:
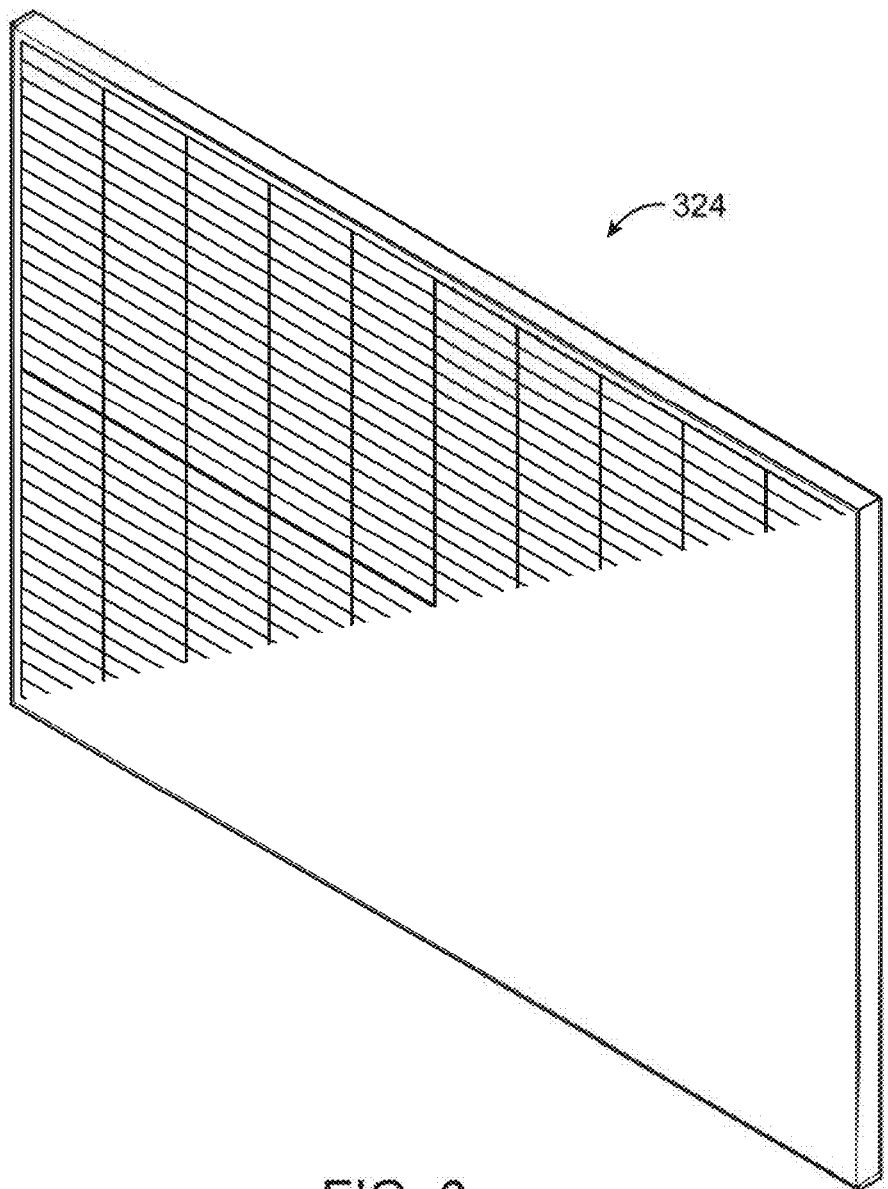
FIG. 6 illustrates an assembled photovoltaic module.

FIG. 6 shows an example of a PV module 324 that includes the photovoltaic components shown in FIG. 5. In more detail, the PV module 324 shown in FIG. 6 has 20 strings 300, and each string 300 has 20 of strips 302 that are mechanically and electrically connected in series with one another.

Returning to FIGS. 3A and 3B, the front bus bar 304 of a string 300 is covered by a front ribbon 308, and the back bus bar 306 is covered by back ribbon 310. The ribbons are mechanically and electrically connected between the respective bus bars of the PV string 300 and electrical busses 320. The conductive ribbons have a number of innovative features not found in conventional photovoltaic devices. Features of the ribbons will now be explained in greater detail.

Conductive Ribbons

FIGS. 7A and 7B illustrate an embodiment of respective first and second surfaces of a front ribbon 700. The front ribbon is configured to be attached to a front bus bar 304 of a PV strip 302, which may be disposed on a far end of a string 300. In an assembled module 324, conductive ribbons are disposed at opposing ends of a PV string 300, and conduct electricity between wiring of a PV module and the photovoltaic elements.

The front ribbon is a single monolithic body that includes two tabs, which may be referred to as a first tab 702a and a second tab 702b. The tabs are connected to a bus interface part 704 of the conductive ribbon 700. The bus interface part 704 has a shape that covers a front bus bar 304. In other words, for purposes of explanation in this disclosure, the conductive ribbon illustrated in FIGS. 7A and 7B has three parts—a long thin bus interface part 704, and two tabs 702 that extend from the bus interface part 704.

In an embodiment, a contact area of the PV bus that is covered by the bus interface 704 of the front conductive ribbon is substantially the same as an area of overlap between adjacent strips in the string. When the contact area between the bus interface 704 and the PV bus is substantially different form the area of overlap between adjacent strips, current mismatch can occur, compromising performance of the string. Here, substantially the same refers to normal engineering tolerances, e.g. less than 10% variance between the areas.

The front bus bar 304 to which front ribbon 700 is attached is disposed on the sun-facing side of a PV strip 302, so it may be visible when the strip 302 is mounted in a PV module 324. Accordingly, the height and width of the bus interface part 704 may be larger than an exposed surface of a front bus bar 304, so that when the bus interface 704 of the ribbon is attached to the front bus bar, it completely obscures the front bus bar 304 from view in an assembled module. In a specific embodiment, the width of a bus interface 704 is 50% or more than the width of a bus bar to which it is attached. The shape of the bus interface part 704 may be rectangular, or some other shape that corresponds to a shape of a bus bar to which it is attached.

In an embodiment, the front ribbon 700 has an asymmetric shape. For example, as seen in FIGS. 7A and 7B, the two tabs 702a and 702b have different shapes from one another. Specifically, first tab 702a has an asymmetric element 706, which is a chamfer, but could be other shapes such as a rounded end or corner in other embodiments. Second tab 702b does not have an asymmetric element 706, so the first tab 702a has a different shape from second tab 702b. As a result, first tab 702a is asymmetric with second tab 702b, and the front ribbon 700 does not have any plane of symmetry.

The asymmetry of front ribbon 700 serves as a visual indicator of the ribbon's orientation. Regardless of other features, it is possible to determine the orientation of front ribbon 700 based on the position of the asymmetric element 706 from a brief visual observation. Absent the asymmetric element 706, it could be difficult to determine which surface is the first surface shown in FIG. 7A, and which surface is the second surface shown in FIG. 7B, at various phases in manufacturing elements of a PV module according to embodiments of the present disclosure.

While the front ribbon 700 attaches to a front bus bar 304, embodiments of the present disclosure also include a back ribbon 800 that is attached to a back bus bar 306 disposed on a back, non-sun facing side of PV material. In some embodiments, the front ribbon 700 and the back ribbon 800 are the same part. However, the specific constraints and environment of a back ribbon may be different from those of a front ribbon, so there are a number of technological advantages that can be achieved by using a different ribbon for front and back terminals.

FIGS. 8A and 8B show an embodiment of a back ribbon 800 that has different characteristics from front ribbon 700 described above. The back ribbon 800 has first and second tabs 802a and 802b that extend from a bus interface 804, and the first tab 802a includes an asymmetric element 806. In an embodiment, the distance between tabs 702a and 702b of a front ribbon 700 is less than the distance between tabs 802a and 802b of back ribbon 800. However, in other embodiments, the distance between tabs 702a and 702b is greater than the distance between tabs 802a and 802b of back ribbon 800. In such embodiments, back and front ribbons can be efficiently cut from the same roll of sheet metal because the tabs of two ribbons in parallel do not overlap. Accordingly, embodiments in which the tab spacing does not overlap between back and front ribbons result in significant material, time and cost savings.

In addition, having a different distance between the tabs of a front ribbon 700 and a back ribbon 800 facilitates efficient assembly of a module in which two strings 300 are disposed in close proximity to one another. The amount of solar energy collected per unit of exposed surface area is an important characteristic for PV modules, especially as the sizing and electronic interfaces for PV modules are increasingly standardized. In order to maximize the efficiency of a PV module per surface area, embodiments of the present disclosure include strips 300 that are arranged end-to-end to minimize the amount of sun-facing surface area that is not occupied by PV material. To facilitate this arrangement, a first end of a first string 300 is arranged in close proximity to a second end of a second string. In such an arrangement, having different spacing between the tabs of a front ribbon 700 compared to a back ribbon 800 prevents damage and electrical shorting that could otherwise result.

In some embodiments, the distance, or length for which the tabs extend from the bus interface 704 are different between front and back ribbons. For example, the tab length for the front ribbon 700 may be longer than tab lengths for the back ribbon 800. In an embodiment, even when both sets of tabs are attached to similar sized bus wiring, the tab lengths for the front ribbon 700 are longer than those of the back ribbon 800 so that the front ribbon can be bent over an edge of a PV strip 302 to which it is attached, thereby hiding the bus wiring from view when the strip is mounted in a PV module 324.

In specific embodiments, back ribbon tabs 802 may extend from the bus interface 804 by from 10 to 20 mm, from 12 to 17 mm, or from 10 to 15 mm. Front ribbon tabs 702 may extend from the bus interface 704 by 15 to 30 mm, 15 to 25 mm, or 15 to 20 mm. Front tabs 702 may be longer than back tabs 802 by at least 2 mm, by at least 4 mm, by about 5 mm, or by more than 5 mm. Widths of front and back tabs may be the same, and may be from 3 mm to 10 mm from 4 mm to 8 mm, or about 6 mm. Other differences between the back and front ribbons will be apparent from subsequent discussion of their features.

The ribbons conduct electricity generated by the PV strips 302 to bus wiring. Accordingly, the ribbons comprise electrically conductive materials. PV modules are typically installed outdoors and may encounter a wide variety of environmental conditions, so it is desirable to select a material that is resistant to corrosion.

There are several material property considerations for a conductive ribbon, including hardness, elastic modulus, malleability, and coefficient of thermal expansion (CTE). The ribbon material should be resistant to surface damage such as scratches and gouges that could be caused by interactions with tooling during the manufacturing process, so softer conductive materials such as copper are less desirable for an exposed surface of a ribbon. On the other hand, the front ribbon 700 is bent and folded around an edge of a strip 302 in assembly, and it is desirable for the bend radius to closely conform to the edge of the strip. Accordingly, a relatively tight bend radius is desirable, which is achieved by malleable materials such as copper.

Conductive materials with a relatively low elastic modulus are desirable in order to minimize the amount of force required to bend a ribbon. Accordingly, an embodiment of the front ribbon 700 may be heat treated so that it is stiff enough to resist damage during handling, while being malleable enough to be manually bent in assembly. A ribbon material may have sufficient stiffness so that the foil body does not undergo plastic deformation when it is grasped by an end of the thin bus interface, while being sufficiently malleable to be manually bent around a corner of PV material with a corner radius of less than 1.0 mm. For example, the ribbon may comprise a ⅛, ¼ or ½ hard copper.

PV modules are installed in a variety of environmental conditions, and the ribbons are in intimate contact with photovoltaic materials. The thermal conditions experienced by a module may be enhanced when outward-facing surfaces of the module are a dark color, which can increase the temperature of a module to significantly above the ambient air temperature. Therefore, it is desirable for a ribbon to have a CTE that approximates the CTE of materials of a photovoltaic strips to which it is attached. When CTE values between the ribbon material and the PV material are significantly different, ECA provides an elastic interface that can prevent cracking due to the mismatch. For example, the CTE of copper is about 17 ppm/C and the CTE of silicon is about 3 ppm/C. The disparity in CTE values could cause inelastic conductive materials to crack and fail, while an elastic ECA material maintains a positive mechanical and electrical coupling across a broad range of temperatures.

To accommodate some of the competing considerations of hardness, conductivity, malleability, CTE, etc., a conductive ribbon may be a coated material. Specifically, in an embodiment of the present disclosure, a conductive ribbon may have a copper core that is plated with tin to impart surface hardness and oxidative stability while maintaining desirable tensile and CTE properties. More specifically, the ribbon may comprise a copper core having a thickness of about 100 to 150 microns, and a tin plating of about 1 to 5 microns. Accordingly, an overall thickness of a ribbon material may be between about 100 to 150 microns, or 75 to 175 microns in various embodiments. In some embodiments, the plating is a material that includes tin, such as tin-lead, or tin-lead-silver.

At least a portion of an outward-facing surface of front ribbon 700 is coated with a coating 708. The coating 708 may be an opaque material with a predetermined color that is selected to match other components of a PV module to provide a consistent, homogenous appearance.

The bus interface 704 of the front conductive ribbon 700 is oriented on the sun-facing side of a module so that it is a visible element of a PV module. Accordingly, the outward-facing surface of the front ribbon 700 has an opaque coating 708. Similarly, when a PV module is assembled, portions of the tabs 702a and 702b are exposed to the sun-facing side of the module and may be visible in an assembled module. Accordingly, the coating 708 extends over portion of the tabs that are adjacent to the bus interface part 704. However, in an embodiment, ends of the tabs 702a and 702b are disposed behind PV material to which the ribbon is attached, so they are hidden from view in an assembled module. In such an embodiment, it is not necessary to coat the ends of the tabs of the front ribbon 700. In addition, leaving ends of the tabs bare facilitates a solder connection to module wiring.

In various embodiments, the coating material 708 may have several different characteristics. The coating 708 should readily adhere to the outer surface material of the conductive ribbons. Because PV modules are typically exposed to direct sunlight, the coating 708 should have good UV stability, preferably one that resists cracking and fading for a duration of 20 years or more. In order to minimize potential shorting conditions, a material for coating 708 may have sufficient dielectric properties to provide effective electrical insulation at thicknesses in the tens of microns.

In the process of assembly, the conductive ribbons are exposed to a variety of environmental conditions, so it is desirable to select materials that are stable under those conditions. For example, temperatures of lamination processes may reach or exceed 150° C., and soldering processes may reach or exceed 250° C., so it is desirable to use a material for coating 708 that is stable at 250° C.

In addition, various chemicals are present in materials that are in close proximity to the conductive ribbons, such as the ECA 312. Accordingly, the material for coating 708 may be compatible with solvents and polymers present in un-cured ECA 312. In one specific embodiment, the coating 708 is highly compatible with Ethylene Vinyl Acetate (EVA). In another embodiment, the coating 708 is compatible with typical components of solder flux.

The coating 708 material may be a polymeric material that is applied in a liquid or powder form. In various embodiments, the polymer may be a catalytic polymer, or a polymer that is dissolved in a solvent. In some embodiments, coating 708 is a liquid polymeric paint. In other embodiments, the coating may be a colored sheet material that is applied to the ribbon with an adhesive or solvent bond.

As seen in FIG. 8A, in an embodiment, the back ribbon 800 has a coating 808. Although the embodiment of FIG. 8A is coated, in other embodiments, the back ribbon 800 is not coated.

In the embodiments shown in the figures of the present disclosure, back ribbon 800 is entirely disposed behind the PV strings 300. Accordingly, the back ribbon 800 may not be a visible element of a PV module.

In a process of manufacturing conductive ribbons, front ribbons 700 and back ribbons 800 may be cut or stamped from the same sheet of material. Each PV string 300 has a first end with a back side bus bar and a second end that terminates with a front side bus bar, so each PV string uses one front ribbon 700 and one back ribbon 800. In such a process, the amount of back conductive ribbons 800 is equal to the number of front conductive ribbons 700.

In an embodiment in which the front ribbons 700 are coated to a predetermined thickness, the back ribbons 800 may be coated so that they have the same thickness as the front ribbons. In addition, coatings may be applied in such a way that the ribbons are substantially level when they are stacked onto a fixture. Specifically, the ribbons may have coating material applied to the tabs as well as to the bus interface. When the bus interface is coated but the tabs are not coated, the thickness of the tab portion of the ribbons is less than the thickness of the bus interface, and a stack of such conductive ribbons would not be flat and level.

Figure 9:
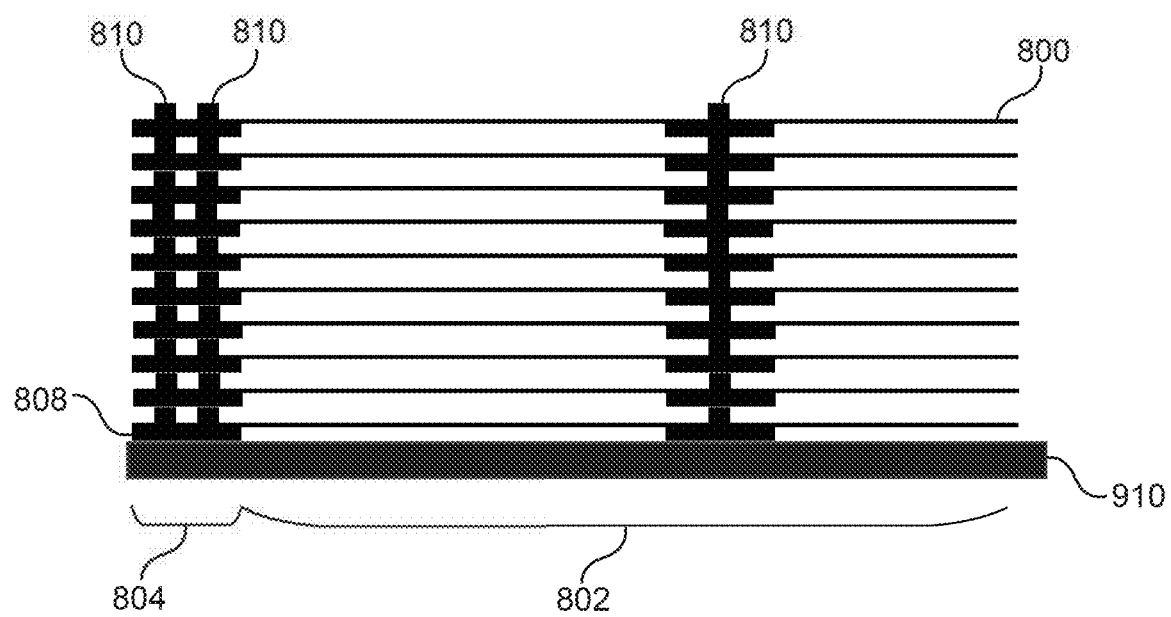
FIG. 9 illustrates a plurality of conductive ribbons stacked on a fixture.

FIG. 9 illustrates an embodiment of a plurality of back conductive ribbons 800 stacked on a fixture 900. In the embodiment shown in FIG. 9, the plurality of back ribbons 800 lie flat on the fixture. In order to achieve a flat orientation, the thickness of the bus interface 804 should be the same as the thickness of the tabs 802. Embodiments of the present disclosure have conductive protrusions disposed on both the tabs 802 and the bus interface 804, and a coating 808 is disposed on both the bus interface 804 and the tabs 802. In addition, the coating 808 on one face of the back ribbon 800 are aligned with the conductive protrusions 810 on the opposite face of the back ribbon. Accordingly, the plurality of back ribbons lie flat on the fixture 900.

Although not illustrated, front ribbons 700 have conductive protrusions 710 aligned with portions of coating 708 on opposing faces as well, so they are level when stacked. Front ribbons 700 may be stacked on the same fixture 900 as back ribbons 800, or different fixtures may be used for each ribbon type.

A level stack of conductive ribbons has several advantages. A level stack reduces the chance that conductive ribbons will be damaged when being transported or handled. A level stack of conductive ribbons provides a stable, predictable surface for automated and manual assembly processes. In addition, stacking conductive ribbons is an efficient way to store and transport a plurality of fixtures in a manufacturing process.

In an embodiment, front and back ribbons may be stacked on the same fixture. To ensure that an equal number of front and back conductive ribbons are stacked onto a fixture, it is desirable for the front and back ribbons to have the same thickness. In addition, having the same stack height for back and front ribbons on the same fixture facilitates automated processes that pick both ribbons from the same fixture.

As seen in FIG. 7B, an embodiment of front ribbon 700 includes a plurality of conductive protrusions 710. The conductive protrusions 710 protrude from a side of the front ribbon that is coupled to the front bus bar 304 of a PV string 300, which is opposite to the coated side of the ribbon.

As discussed above, an ECA 312 may be used to electrically couple conductive ribbons to busses of the PV strips 302. However, there are several potential limitations of the ECA 312 as a conductive interface. Adhesives are typically organic materials that do not conduct electricity. Instead, most ECAs derive their conductive properties from metallic particles that are embedded in the ECA. Because metallic particles lack adhesive properties, an ECA typically represents a compromise between conductivity and adhesion. Higher loading of metal particles increases conductivity and decreases adhesive strength.

Another potential issue with ECA materials relates to barrier properties provided by the ECA material. Many conductive metal materials that are suitable for conductive ribbons are also susceptible to oxidation, which reduces conductivity. Because PV modules are potentially subject to a variety of environmental conditions and have expected lifetimes of 20 or more years, it is possible for metal materials of the conductive ribbons and busses to oxidize through an ECA. The oxygen may be introduced through pores in the ECA, or be released from the ECA itself as the ECA degrades over time.

The conductive protrusions 710 mitigate some of the shortcomings of the ECA bond described above. The conductive protrusions 710 extend outward from the surface of front ribbon 700, and either directly contact the bus material to which they are attached, or reduce the thickness of the ECA between the conductive ribbon and a bus. In other words, the conductive protrusions 710 either eliminate or reduce the amount of ECA between front ribbon 700 and a bus, which increases conductivity between the ribbon and a bus, and reduces the probability and impact of oxidation of the bus and ribbon materials.

In addition, conductive protrusions increase the surface area of the conductive contact surface, which can enhance both adhesion and conductivity. However, for some material combinations, the bond between the ECA and the conductive protrusions may be less than the bond between the ECA and the conductive ribbon surface material.

The conductive protrusions 710 may be a metal material with a high degree of conductivity, such as silver, copper, gold or aluminum. In various embodiments, the protrusions 710 may protrude from the surface of the front ribbon by from 2 to 20 microns, from 2 to 15 microns, or from 5 to 10 microns.

As seen in FIG. 7B, conductive protrusions 710 are arranged in a predetermined pattern. In particular, a plurality of conductive protrusions 710 are disposed along the bus interface 704 in an alternating offset pattern. In addition, a plurality of conductive protrusions 710 may be disposed on each of the first and second tabs 702a and 702b at a point along the tabs to which the tabs are coupled to bus wiring. However, in other embodiments, the conductive protrusions 710 are disposed on a face or portion of the tabs 702 that is not coupled to bus wiring. In such an embodiment, the conductive protrusions 710 may be present on the tabs 702 so that one or more front ribbons 700 lies flat when loaded or stacked on a fixture.

The pattern of conductive protrusions 710 may not extend across the entire length of the bus interface 704. In the embodiment shown in FIG. 7B, the bus interface 704 has bare patches at its far ends. The length of the exposed parts of the ends of bus interface 704 are greater than the distance between adjacent conductive protrusions 710 in the pattern of protrusions. In various embodiments, a bus interface 704 may have one or more bare exposed part that has a width that is at least 5, 10 or 20 times the distance between adjacent conductive protrusions 710. The bare patches may enhance adhesion when the material of the conductive ribbon 700 has greater adhesion strength to the ECA 312 than the material of the conductive protrusions 710.

The total surface area of the bus interface part 704 that is occupied by conductive protrusions 710 may be a significant portion of the surface area of the bus interface 704. For example, in some embodiments, the conductive protrusions 710 may occupy over 10%, 25%, or 50% of the surface area of the bus interface 704. In specific embodiments, the diameter, or height of the conductive protrusions 710 may be over 25% or over 50% of the width of the bus interface 704.

Conductive protrusions 710 are not present on conductive ribbons in some embodiments. In other embodiments, conductive protrusions 710 that are disposed on conductive ribbons are not present on in some connections between ribbon tabs and other conductive elements such as bus wiring. Some of the shortcomings of the ECA interface can be overcome by enhancing the barrier properties of the adhesive, providing a reducing agent in the adhesive formulation, formulating a highly conductive ECA, passivating surfaces of the conductive ribbons, etc.

A metal solder material may be used in place of the ECA, but the bond created by a metal solder can be compromised by a CTE mismatch between a ribbon and a bus. Accordingly, solder bonds are better suited to bonding same materials, or metal materials with similar CTEs, while ECA is more suitable when there is a significant CTE mismatch between the bonded materials, or when one of the materials degrades at soldering temperatures.

As seen in FIG. 8B, a back conductive ribbon 800 has a plurality of conductive protrusions 810 that may have the same characteristics as the protrusions 710 of front conductive ribbon 700 discussed above. For example, a plurality of conductive protrusions 810 may be disposed on each of the first and second tabs 802a and 802b at a point along the tabs to which the tabs are coupled to bus wiring. However, in other embodiments, the conductive protrusions 810 are disposed on a face or portion of the tabs 802 that is not coupled to bus wiring. In such an embodiment, the conductive protrusions 810 may be present on the tabs 802 so that one or more back ribbons 800 lies flat when loaded or stacked on a fixture. The conductive protrusions may be a conductive metal material, such as silver or copper.

In order to create a strong, reliable electrical and mechanical connection between PV panels and internal bussing, a conductive ribbon should have a high degree of flatness and straightness. Deviations of camber and flatness as low as 0.1 mm can have a measurable negative impact on ribbon assembly and performance. Accordingly, care should be taken to minimize handling of the ribbons in a manufacturing process. One way that handling is minimized is by stacking a plurality of pairs of front and back ribbons 700 and 800 on the same fixture.

When conductive protrusions are present on a ribbon, the protrusions may cause a ribbon to warp, for example when the ribbon is exposed to heat in use or during assembly. The warpage caused by conductive protrusions can be sufficient to compromise the performance of a conductive ribbon. However, the warpage can be constrained by applying a coating material to an opposing side of a conductive ribbon.

For example, it is apparent from comparing FIG. 8A to FIG. 8B that the coating 808 on tabs 802 is disposed directly opposite to a location of the conductive protrusions 810 on the other side of the conductive ribbon 800. Similarly, a first surface of the bus interface 804 has a plurality of conductive protrusions 810, while the opposite second surface of the bus interface 804 is covered with coating 808. In an embodiment, the coating 808 is applied to ribbon before the conductive protrusions 810 are applied to prevent warp that would otherwise occur when the conductive protrusions are formed. Accordingly, a coating 808 provides several technological advantages.

Figure 10:
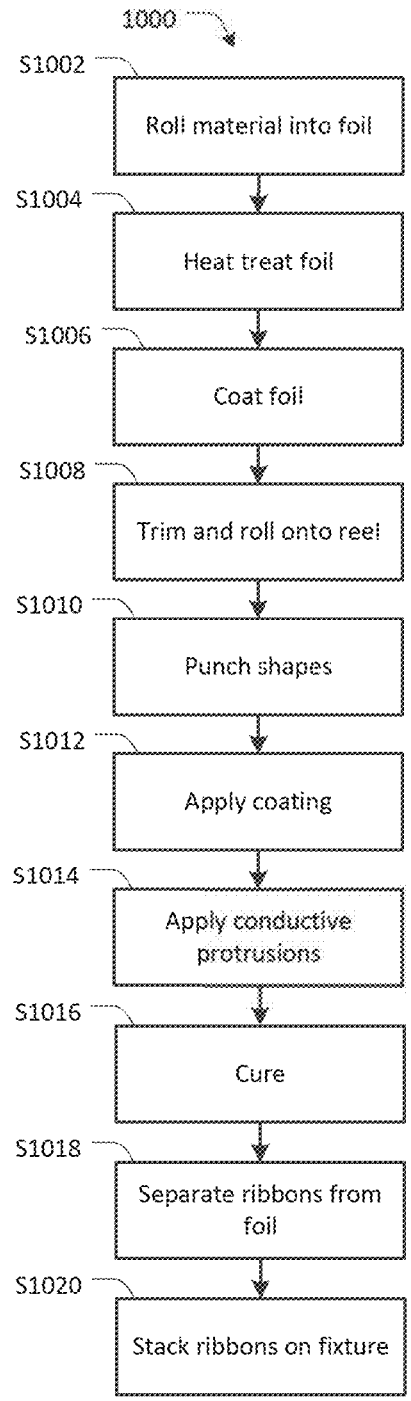
FIG. 10 illustrates a process for making a conductive ribbon.

FIG. 10 illustrates an embodiment of a process 1000 for forming a conductive ribbon. Copper wire or plate is rolled to create a flat foil with a thickness of about 100 to 150 microns at S1002. The foil may be heat treated at S1004 so that it has a flexural modulus appropriate for bending the tabs around a far edge of a string so that the shape of the tabs closely conforms to the shape of the corner of the far edge, while retaining enough stiffness to minimize unintentional plastic deformation when assembling a PV module.

The copper foil is coated at S1006 by a hot dip or electroplating process, and trimmed and rolled onto a reel at S1008. The foil reel is fed into a stamping machine that punches out net shape conductive ribbons at S1010. The machine may punch out front and back ribbon pair shapes simultaneously from the same portion of foil on the reel, and the conductive ribbons may be stamped so that they remain attached to the foil.

The reel is then fed into a coating apparatus that applies the coating to one side of the ribbons attached to the foil at S1012. A coating, e.g. an opaque paint, may be applied to both the front and back ribbons. Conductive protrusions are then applied to the opposite side of the foil at S1014. The conductive protrusions may be applied by melting a conductive metal onto a surface of the foil. The ribbons are then heated to cure the coating and the conductive bumps at S1016. The foil may then pass through a straightening set of rollers and then to a punch which separates the back and front ribbon from the reel at S1018. Individual conductive ribbons are then stacked onto fixtures for shipment and insertion into stringers at S1020.

Assembled Module

Figure 11:
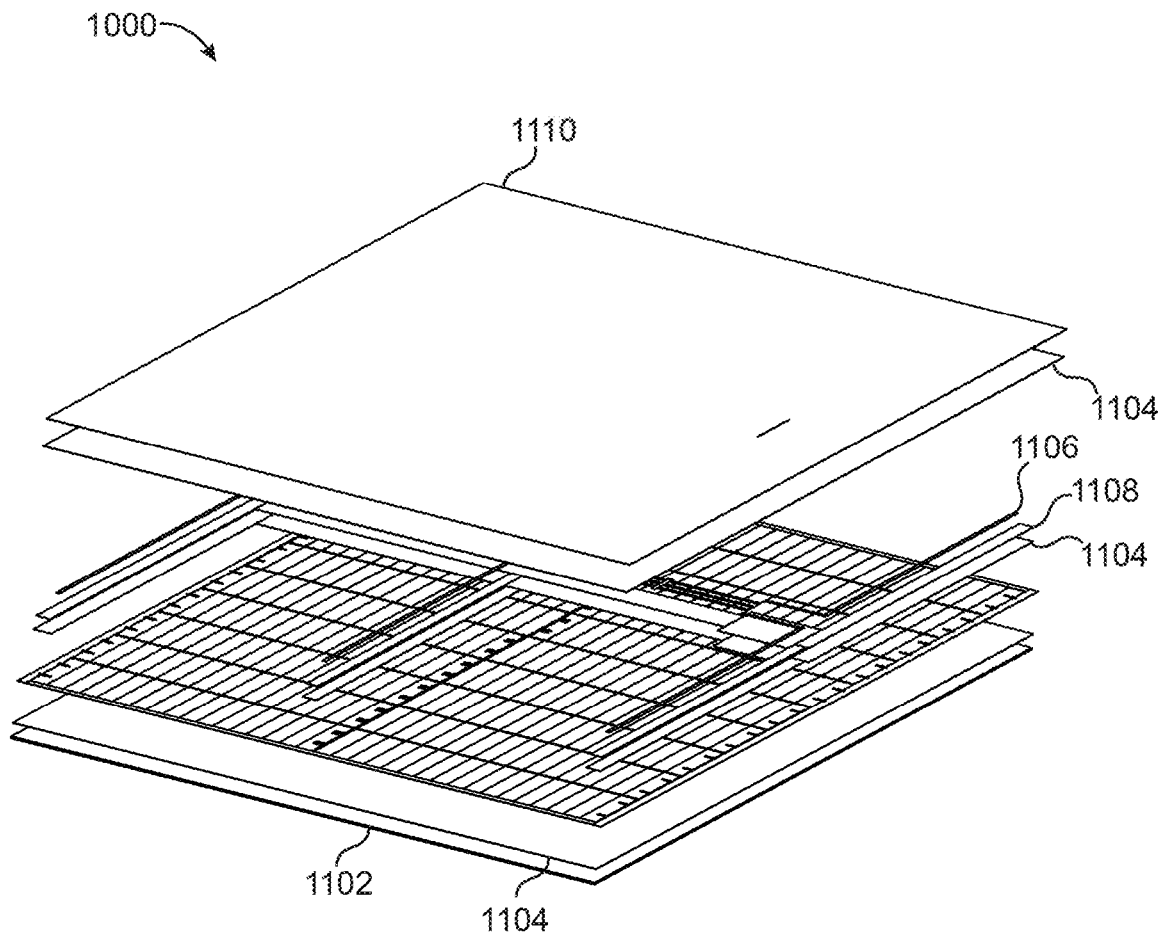
FIG. 11 is an exploded view of a photovoltaic module.

FIG. 11 illustrates a back-facing view of components of an embodiment of a PV module 1100. An outer surface of PV module 1100 is a glass panel 1102, and a translucent laminate material 1104 is disposed between the glass panel and the aperture side of PV elements. In an embodiment, the laminate material 1104 is a sheet of EVA film that encapsulates the PV elements when the PV module 1100 is assembled. When a PV module is assembled, heat, vacuum and pressure may be applied to components of the module shown in FIG. 11 so that the laminate material seals and bonds to adjacent components.

PV elements are disposed directly beneath the laminate 1104. In an embodiment of the present disclosure, the PV elements are a plurality of strings 300, each of which comprises a corresponding plurality of strips 302. Each of the strings 300 has a front ribbon 700 disposed on a first end of the string, and a back ribbon 800 disposed on an opposing second end of the string.

Bus wiring 1106 is disposed behind the plurality of strings 300. The bus wiring 1106 connects front and back terminals of the PV strings 300 to circuitry of the PV module. Although the present embodiment uses flat bus wiring 1106, other embodiments may use other wire shapes.

A plurality of insulation patches 1108 are disposed between the PV material and the flat bus wiring 1106 to prevent electrical shorts between conductive elements of the PV module 1100. A second translucent element 1004 is disposed behind the bus wiring 1106 and insulation patches 1108, followed by a backsheet 1110 which forms an outer backing surface of the PV module.

Figure 12:
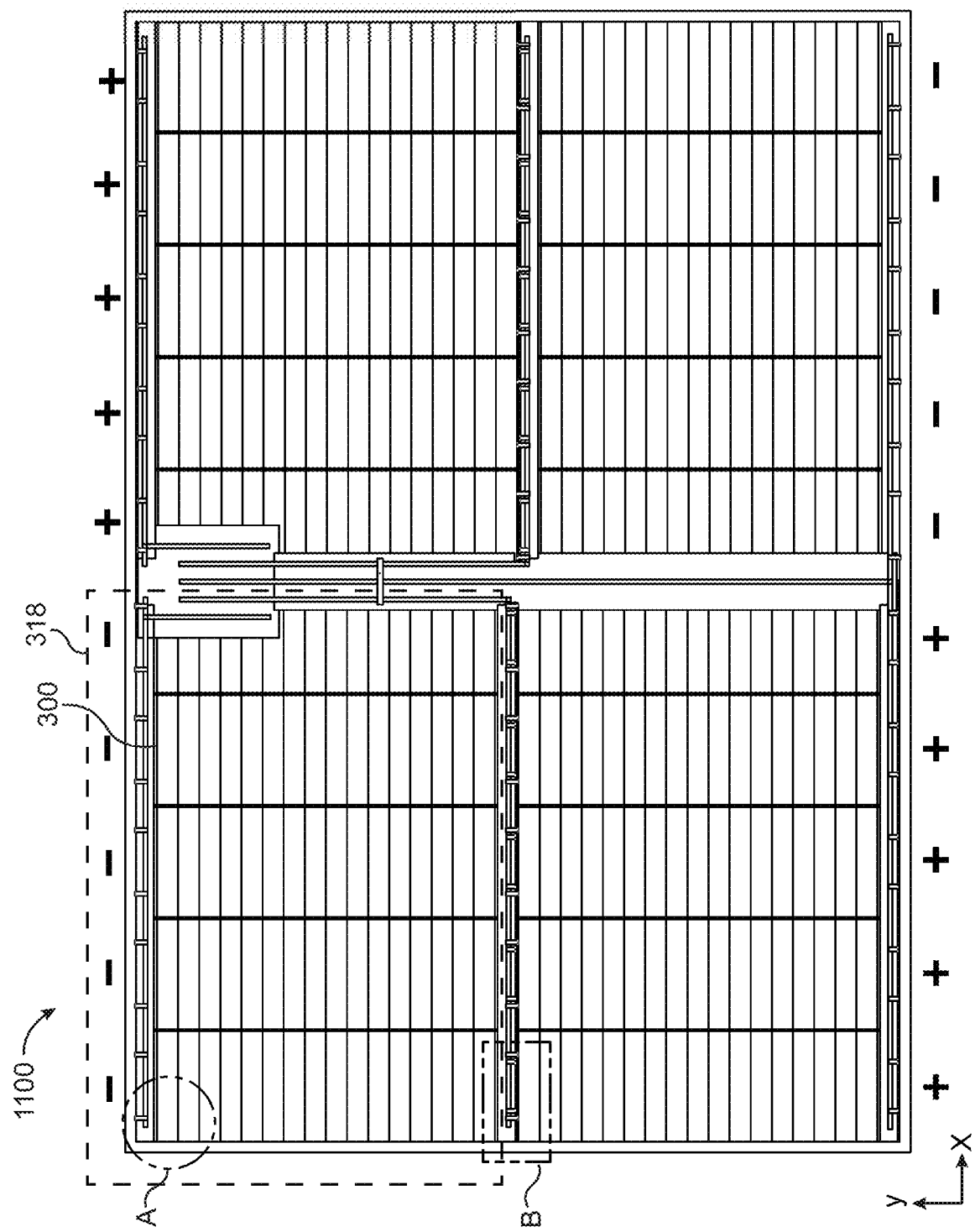
FIG. 12 is a back view of a photovoltaic module without the backsheet.

FIG. 12 illustrates a back view of a PV module 1100. As seen in the embodiment of FIG. 12, five PV strings 300 are arranged in parallel to one another to create four separate zones 318. Each of the PV strings 300 of each zone 318 have opposing terminal ends that are aligned with each other and commonly coupled to the same bus wire 1106. Zones are arranged so that a front terminal of one zone 318 is adjacent to a back terminal of an adjacent zone.

For example, the front terminal end of the zone in the lower left sector of FIG. 12 is directly adjacent to the back terminal end of the zone in the upper left sector, or the X direction as indicated in the figure. Similarly, the back and front terminal ends of each zone 318 are in an opposite orientation from the orientation of an adjacent zone in the Y direction. As a result, each terminal end of each zone 318 is adjacent to a terminal end of another zone with an opposite polarity.

Figure 13:
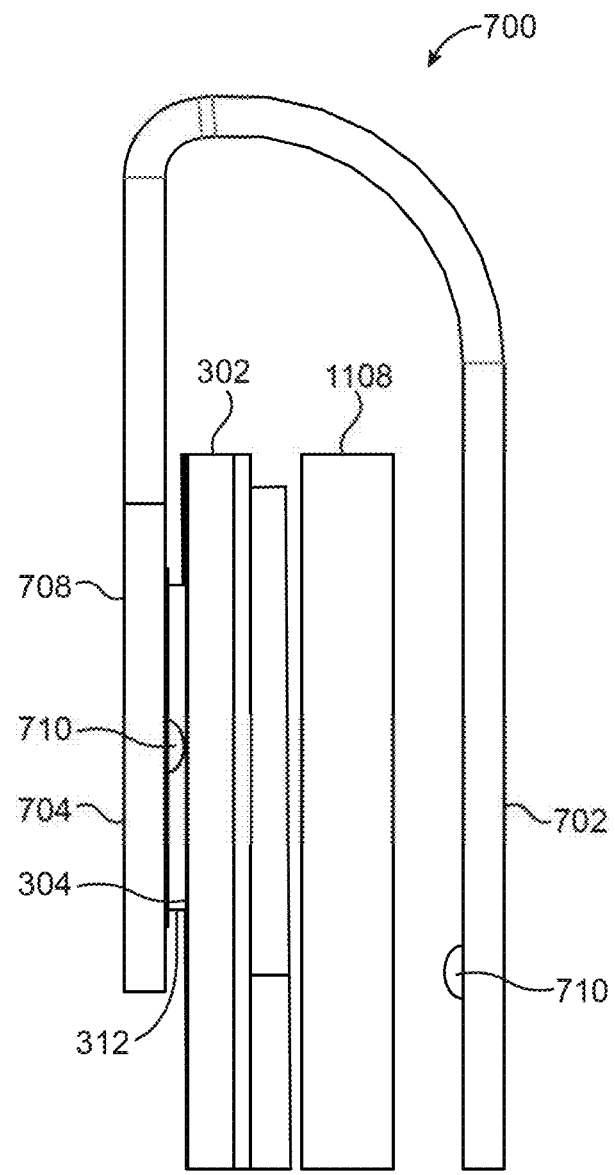
FIG. 13 illustrates a conductive ribbon folded over an end of a string.

FIG. 13 is a detail view of section A of FIG. 12 and shows a front terminal end of a PV strip 302 of a PV string 300 according to an embodiment of the present disclosure. A bus interface portion 704 of front ribbon 700 is coupled to a front bus bar 304 through a layer of ECA 312. Tabs 702 of the front ribbon 700 extend past the edge of the PV strip 302 by a predetermined distance that may be 1.0 mm or less, or between 0.5 mm and 2.0 mm. The gap created by the predetermined distance may prevent damage to the PV material.

In an embodiment, a tool is used to form the bend the front ribbon 700 over the edge of the PV strip 302. The tool may ensure that the predetermined gap is provided while fixing the ribbon material in place so that the ECA bond is not compromised when the tabs are bent. The tabs may be bent 180 degrees from a flat orientation so that they extend in an opposite direction compared to a flat orientation of the ribbon 700.

An opaque coating material 708 is present on outward-facing portions of the front ribbon 700 that are visible when a PV module 1000 is assembled. The entire bus interface portion 704 of the front ribbon is coated with the opaque coating 708. In addition, portions of the tabs 702 are coated with coating 708 so that the coated portion of the tabs is contiguous with the coating over the bus interface 704. The portions of the tabs 702 that are coated are portions that that are folded over the edge of the PV strip 302. In an embodiment in which a coating material is present in those areas of the conductive ribbon 700, no reflective surfaces of the conductive ribbon are visible in an assembled PV module 1000.

An insulation patch 1108 is disposed between a backside surface of the PV strip 300 and an inner surface of front ribbon 700. The insulation patch 1108 may be secured to the backside surface of the PV strip 302 by an adhesive or laminate material such as EVA. In the embodiment shown in FIG. 12, conductive protrusions 710 that extend from a surface of the bus interface 704 are aligned with the front bus bar 304 of the PV strip 302, and provide a low resistance connection between the front ribbon 700 and the PV strip. In contrast, the conductive protrusions 710 on tabs 702 face inwards towards insulation patch 1008. Accordingly, in the embodiments shown in FIG. 12, the conductive protrusions 710 on the tabs 704 are not in a conductive path between the ribbon 700 and a bus of a PV strip 302.

One of the advantages that conductive ribbons provide over conventional solar modules is reducing current density. Embodiments of the bus interface parts 704 and 804 cover the entire surface of the font busses, and ECA is present in most or all of the space between the bus interface parts and the busses. Accordingly, the current density of such embodiments is much lower than the current density of conventional modules, in which the area of the conductive interface is limited to solder connections to which wires are connected.

Returning to FIG. 12, the tabs 702 of front ribbons 700 disposed on outer edges of the PV strings 300 on a top edge of the module are connected to a first flat bus wire 1106. Similarly, tabs 802 of back ribbons 800 along the top edge are coupled to a second bus wire 1106. In contrast, the tabs 702 and 802 of respective front and back ribbons 700 and 800 that are disposed along bottom edge of the module 1100 are commonly coupled to the same bus wire 1106. Similarly, front ribbons 700 and back ribbons 800 of adjacent edges of adjacent zones 318 are commonly coupled to the same bus wire 1106.

The connection between tabs of the front and back ribbons and the bus wiring 1006 may be a solder connection or an ECA connection. When an ECA connection is present, conductive protrusions disposed on the tabs may be aligned with the ECA material. In some embodiments, the conductive protrusions on tabs of a conductive ribbon may be present on an opposite face of the ribbon from the conductive protrusions on the bus interface part of the same ribbon. In other words, conductive protrusions on a ribbon's tabs may be on the opposite face from the conductive ribbons on the ribbon's bus interface.

Figure 14:
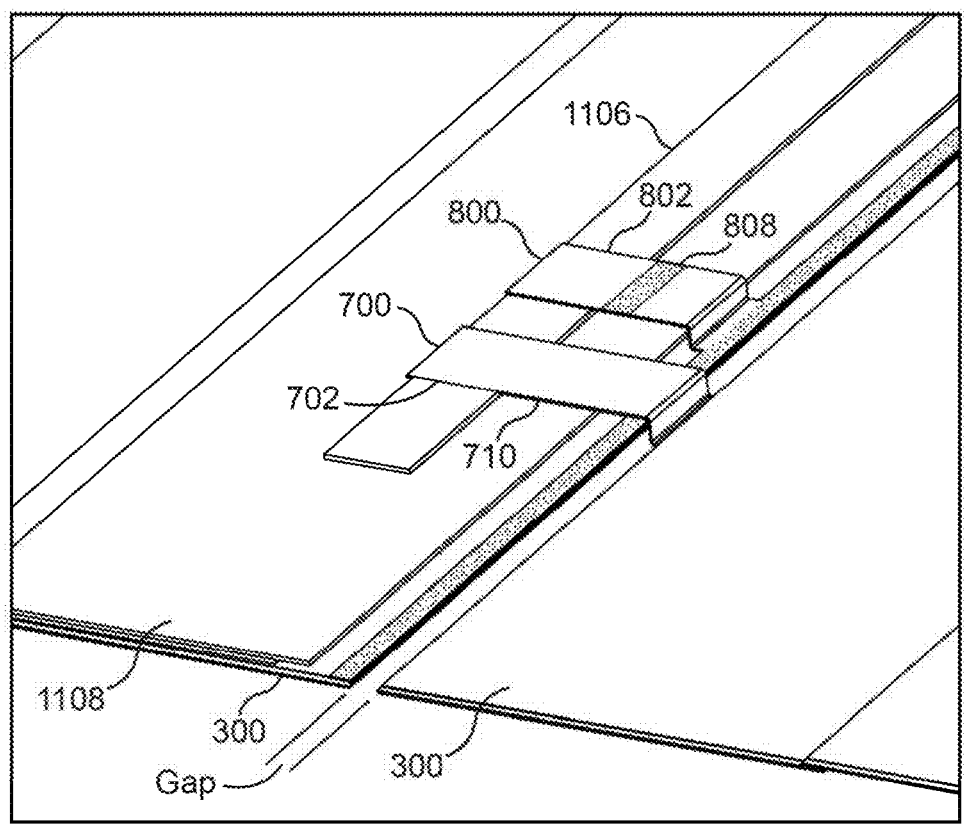
FIG. 14 illustrates a conductive ribbon configuration.

FIG. 14 is a detail view of section B of FIG. 12, and shows ribbon configurations for adjacent PV strings 300. A bus interface 804 of the back ribbon 800 is coupled to the back bus bar 306 of an edge strip 302 so that the coated surface of the back ribbon faces outwards from the back face of the PV material. In an embodiment, an insulation patch 1108 is coupled to the back surface of the PV material, and may be retained by an adhesive or laminate material such as EVA.

Tabs 802 of back ribbon 800 extend away from bus interface 804, fold over the insulation patch 1108, and are coupled to the bus wiring 1106. Tabs 702 of the front ribbon 700 fold over from the front of the strip to which they are attached to the back surface of the strip 302 to which the back ribbon 800 is attached.

Accordingly, the tabs 802 of the back ribbon 800 attached to a first string 300 are aligned in parallel with the tabs 702 of the front ribbon 700 of a second string 300 that is adjacent to the first strip. Therefore, in an embodiment in which opposing terminals of PV strings 300 are adjacent to one another, tabs of respective conductive ribbons are routed in the same direction and are commonly coupled to the same bus wire 1106.

In more detail, tabs 702 of front ribbon 700 have two opposing 90 degree bends so that they are arranged in parallel to unbent tabs 802 of a back ribbon 800 in assembly. In such an orientation, both of the front and back ribbons can be connected to the same bus wire 1006 in close proximity to one another. The connection may be a solder connection or an ECA connection. In another embodiment, the transition from front to back PV surfaces by the front ribbon is more gradual than the 90 degree bend shown in FIG. 14. For example, the transition may be accomplished by two 45 degree bends, or by a gradual curve.

An opaque coating 808 is visible on the exposed surface of the bus interface 804 and the tabs 802 of back ribbon 800. Conductive protrusions 710 protrude outwards from the exposed face of tabs 702 of the front ribbon 700, while conductive protrusions 810 on tabs 802 of back ribbon 800 face into the insulation patch 1108. Although not shown in FIG. 14, the surface of front ribbon tab 702 that is coupled to bus wire 1106 is not coated.

A gap is present between the adjacent strings 300. The gap may accommodate dimensional changes from temperature variation, e.g. expansion of the PV material during a lamination process. Although a portion of front tab 702 passes across the gap between strings, when the portion of that tab is coated with an opaque coating material 710, no reflective surfaces are visible through the gap in an assembled PV module 1100. In various embodiments, the gap may be from 1 to 10 mm, from 1 to 5 mm, from 1 to 3 mm, or about 2 mm. The surface of backsheet 1110 that is visible through the gap may have a color that is the same as a color of the coating 710. In an embodiment, that color is black. In addition, the insulating patch 1108 may have a black color and hide a reflective surface of bus wire 1106.

The conductive ribbons may be components of a mechanical sub-structure in a PV panel 1100. In assembly, the conductive ribbons are a rigid mechanical link between strings 300. In one embodiment, conductive ribbons are physically bonded to strings 300 through an ECA 312, and two tabs of each conductive ribbon are soldered to bus wiring 1106. Bus wiring 1106 runs across both ends of every string 300, and each zone has one bus wire that runs across each of its poles. Accordingly, the conductive ribbons, bus wiring, and PV strings comprise a rigid mechanical sub-structure of a PV module 1100 that is especially resistant to deformation in the primary plane of the PV module, which is the X/Y plane of FIG. 12. Other configurations, e.g. configurations in which bus wiring is round, are not sufficiently resistant to deformation in the primary plane to prevent dislocation in a lamination process.

Components of a PV module 1100 may be exposed to significant forces during a lamination process. In a lamination process, pressure and heat are applied to PV module components so that laminate material 1104 flows to fill gaps and spaces between components, creating a sealed laminate structure. In an embodiment, all of the components shown in FIG. 11 are compressed in a single lamination process.

A lamination process applies a significant amount of force to components of a PV module. The mechanical sub-structure, including the conductive ribbons, prevent the module components from moving during a lamination process, which may be conducted at temperatures of 150 C or more under 1 or more atmosphere of pressure. When the mechanical sub-structure is present, including the conductive ribbons and flat bus wires, it may prevent strips from moving relative to one another by less than 5 mm, or by less than 2 mm.

Figure 15:
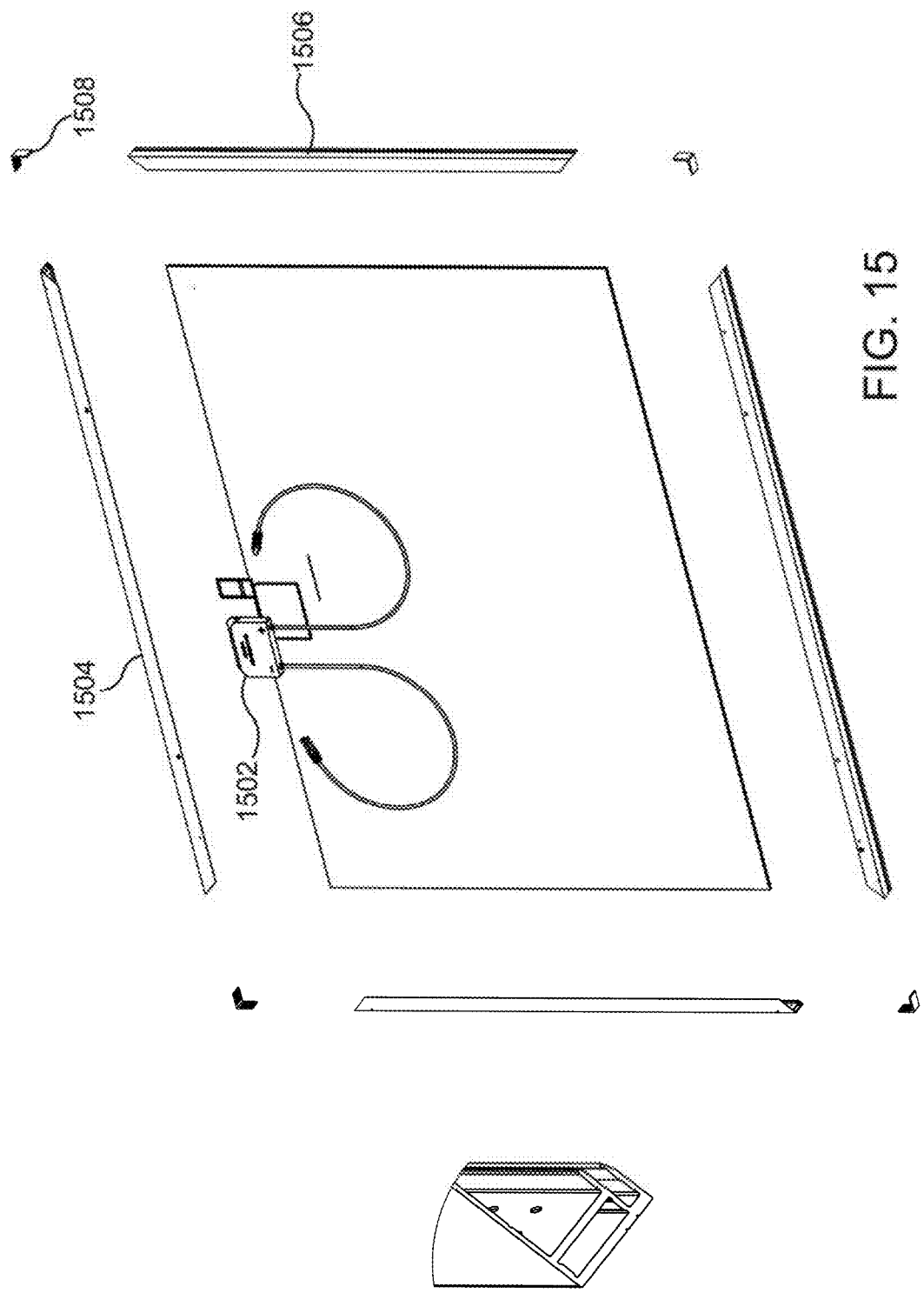
FIG. 15 illustrates and exploded view of the frame, and junction box of a photovoltaic module.

FIG. 15 illustrates several additional components of a panel 1100, including a junction box 1502, a long frame piece 1504, a short frame piece 1506, and a corner fame piece 1508. In an assembled panel 1100, long frame pieces 1504 are connected to short frame pieces 1506 by corner pieces 1508. The front surfaces of the frame pieces that are disposed on an aperture side of the panel 1100 may have portions that extend over edges of glass, laminate and backing materials to provide an even appearance.

Returning to FIG. 12, the efficient and unique arrangement of components in a PV module 1100 provides a number of technological advantages. Use of the same bus material 1106 to connect tabs of conductive ribbons from opposite poles of adjacent zones 318 achieves simultaneous series connections between separate zones and parallel connections between strings 300 within the same zone, as seen in FIG. 5, while minimizing the number of connections and the amount of materials in a panel. Therefore, a PV module 1100 according to an embodiment of the present application is highly efficient and reliable.

In addition, elements of the panel arrangement of the panel 1100 provide a PV panel that does not have reflective surfaces that are visible from the aperture side of the panel. Tiling of PV strips in each of the strings hides metallic bus bars that are visible in conventional panels. Although a PV strip 302 at each end of a PV string 300 has one bus region for which a metallic bus bar would be exposed, embodiments of the present application completely cover that bus bar with a conductive ribbon, and all surfaces of the conductive ribbon that are visible in an assembled PV module are covered with an opaque coating material. Meanwhile, the PV strings are arranged in the panel so that no gaps greater than a few millimeters are present between adjacent strips and strings, and what gaps are present are minimal in size. Components of the PV module may be attached to form a mechanical sub-structure that retains components in place during a lamination process to ensure that gaps and alignment are maintained to a high tolerance.

Apart from the coated surfaces of the conductive ribbons, no bus wiring is visible from an aperture side of a PV module 1100. The only reflective elements that can be perceived from the aperture side of a PV module 1100 according to an embodiment of the present disclosure are the fingers that run across the surface of PV material, and the fingers are too small to be noticeable from a distance of 10 feet or more, so that fingers are not perceived as reflective surfaces from most viewing positions of a typical PV installation.

In some embodiments, solar modules may use PV strips that do not have busses that comprise conductive material on the solar cells, or "busbarless" cells. For example, embodiment may use strips that are cut from cells such as the cells shown in design patent application Ser. Nos. 29/646,603 and 29/646,604, each of which is incorporated by reference herein. In such embodiments, conductive ribbons may be coupled to areas that correspond to the areas in which conductive bus material is normally applied, which may be referred to as bus regions. The conductive interface between conductive ribbons and a bus region of a busbarless strip may be an ECA material that interfaces with the conductive fingers that are oriented orthogonal to the ribbon junctions. A busbarless cell has numerous advantages over a cell with printed busbars, including lower cost and a superior electrical connection between the fingers and adjacent cells that are overlapped and coupled with ECA.

Figure 16:
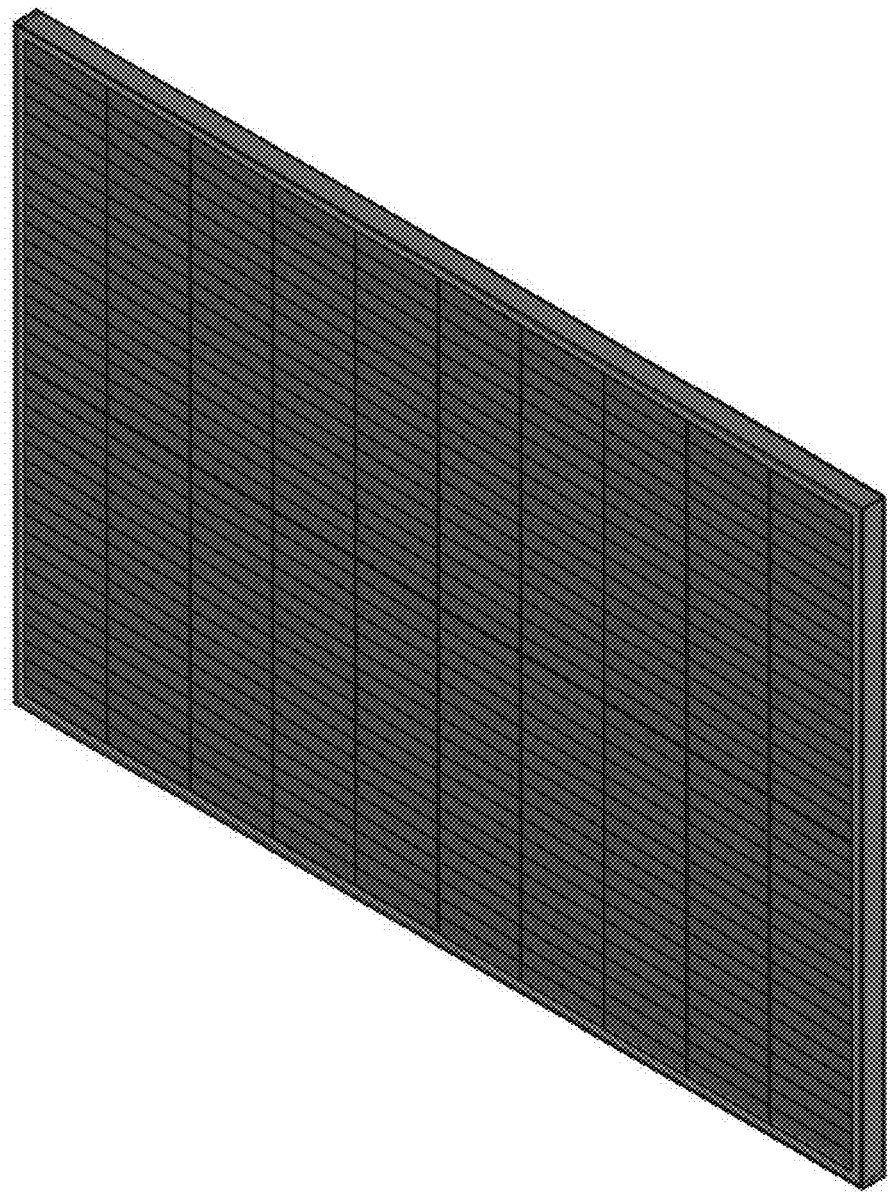
FIG. 16 is a front view diagram of a photovoltaic module having a blacked out visual appearance according to an example.

FIG. 16 is a front view diagram of a photovoltaic module having a blacked out visual appearance according to an example.

In an embodiment, a substantially black appearance, or blacked out visual appearance, is present when a PV module is viewed at a distance of 10 feet or more by an ordinary observer. Reflective surfaces, especially metallic surfaces, that are as small as two square millimeters can be visible on the face of a PV module from a distance of 10 feet. For example, conventional bus bars on PV cells are typically in the range of 1 to 6 mm wide and are several inches long, are visible at a distance of 10 feet when incorporated into a PV module.

While a 1 mm×100 mm strip of metallic material may be perceived from 10 feet, a 1 mm×1 mm strip of metallic material is not visible in a module at that distance. Therefore, PV modules according to this disclosure may have no visible reflective elements that are larger than 1 mm square. In another embodiment, PV modules have no visible reflective elements that are larger than 0.5 mm square. Reflective elements that are as small as 1 mm in a single dimension may still be visible at 10 feet when one other dimension exceeds 1 mm—for example, a 1 mm×10 mm metallic member may be visible at 10 feet, while a 1 mm×1 mm metallic member is not. Features with a very small width in one dimension, e.g. fingers that are typically from 50-100 microns wide, are not visible at 10 feet. More generally, reflective features with either a length or width dimension that are less than 0.5 mm are not typically visible unless they are disposed in very close proximity to one another, e.g. separated by a dimension that is about the same as the width.

In some embodiments, the reflectivity of visible wavelengths from the module is low. For example, a substantially black PV module may have a reflectance in the visible spectrum of 30% or less, 25% or less, 20% or less, or 15% or less. Persons of skill in the art will recognize the lower bounds of reflectance are well established and documented, e.g. that carbon black has a reflectance of less than 5% across the visible spectrum. These reflectance values may apply for all visible parts in a PV module that are larger than 1 mm, 5 mm or 10 mm in any dimension. For reference, reflectance for silver metallic materials typically exceed 90% in the visible spectrum, while color perceived as white can be around 80-90%.

Figure 17:
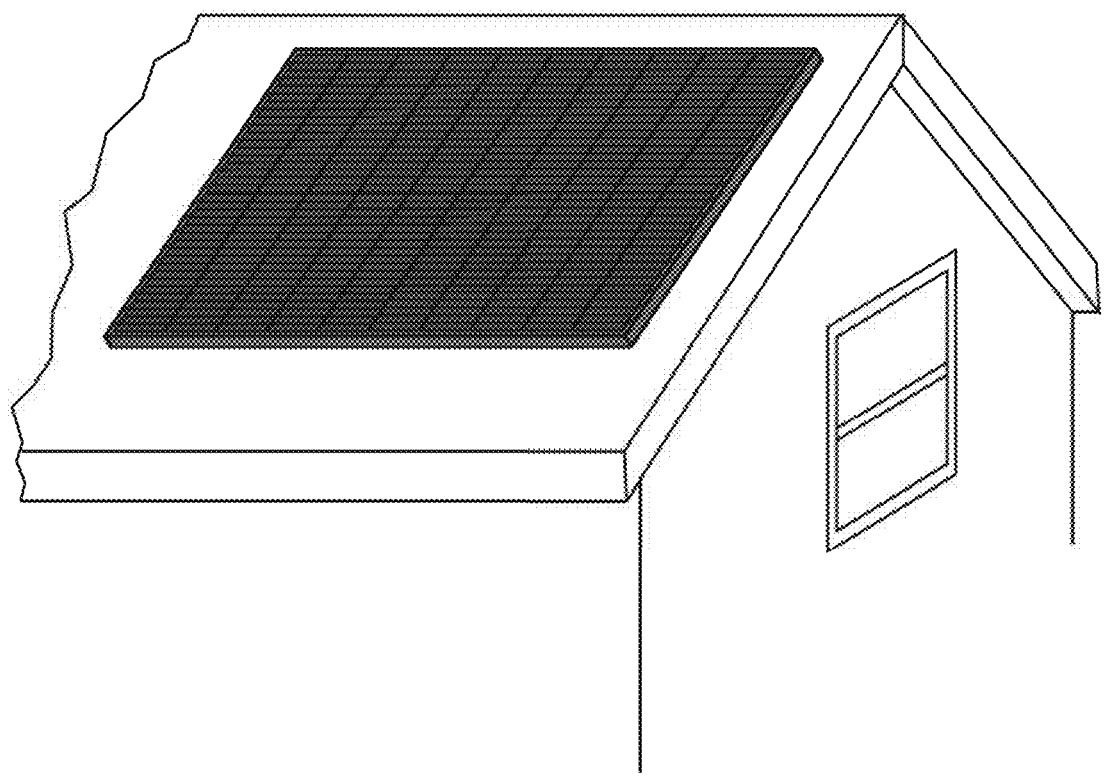
FIG. 17 is the photovoltaic module of FIG. 16 configured to a roof top application for generating power for the roof top application.

FIG. 17 is the photovoltaic module configured to a roof top application for generating power for the roof top application. When viewed from the perspective of an ordinary viewer, e.g. at ground level outside of the house, such a module would be greater than 10 feet from the viewer, and therefore may appear entirely black without any apparent reflective surfaces.

In an example, the present solar module achieves a higher power output than conventional solar modules that have been coated with black coloring. Conventional modules have white backsheets, which increase the amount of reflections within the module itself. When taking into account refractive indices of glass sheets on the front of a module and anti-reflective (AR) coatings applied to the glass, light that passes through the glass experiences total internal reflection (TIR). When white and reflective elements are present within the module, e.g. between the glass and the surfaces of other module components, light reflected off the white and reflective elements is ultimately directed to PV material, leading to increased efficiency.

An example of the surprisingly high power output and efficiency is presented in the following Table 2:

| Module | Experimental A | Experimental B | Comparative A |
|---|---|---|---|
| Module Power Range (Wp -STC) | 415 | 500 | 335 |
| Width (mm) | 1621 | 1939 | 1558 |
| Length (mm) | 1116 | 1116 | 1046 |
| Area (m^2) | 1.809 | 2.164 | 1.630 |
| Power In (W) | 1809 | 2164 | 1630 |
| Efficiency (Pout/Pin) | 22.9% | 23.1% | 20.5% |

In Table 2, Experimental modules A and B are embodiments of modules with a substantially black appearance according to the present disclosure. In contrast, Comparative module A is a module that uses a black backsheet that is manufactured by a competitor. Although not shown in the Table, higher efficiency PV material is available that extends the efficiency of substantially black modules according to embodiments to 25% and higher. In some embodiments, the efficiency of PV material may be up to 21%, and the efficiency of a module using such material may be 20%, where the efficiency of the module per surface area is about 95% of the efficiency of the PV material. Accordingly, embodiments of the present application have substantially higher efficiency per surface area than conventional modules.

In a solar module according to embodiments of the present disclosure, a plurality of strips that are configured with each other using high quality crystalline silicon increase power output even though total internal reflection has been reduced or even eliminated. The present module configures or hides (or blocks) reflective surfaces, such as ribbon wire and the bus bars while making other surfaces (e.g., back sheet) black or antireflective. Despite the lack of internal reflections, modules according to embodiments of the present disclosure have higher efficiency and power yields per unit area than conventional modules that use white backsheets.

In an example, the conventional module uses much of the reflected light in a module to be converted to electricity through total internal reflection off of the glass, the backsheet, or other surfaces. Accordingly, modules with reflective surfaces have higher power output than conventional black modules. In the present example, however, the present black module increases the active area, using the configuration of strips, in the module and reduces resistive losses, which results in a higher performing module even without the reflected light and TIR. Accordingly, the present module achieves an unexpected benefit that cannot be achieved using conventional black modules with conventional architectures.

While it has been a goal of the PV module industry to implement solar modules with an all-black appearance, conventional efforts to do so have resulted in substantial drops in efficiency. Surprisingly, embodiments of the present disclosure achieve an all-black aesthetic appearance while performing better than conventional PV modules that use white backgrounds and reflective surfaces.

Embodiments of the present disclosure provide several improvements to PV module technology. The expansion of photovoltaic technologies is limited by aesthetic elements, including color variation and the presence of reflective surfaces. An embodiment of this disclosure is substantially free of reflective elements and has a substantially black appearance from a distance of at least 10 feet. In addition, due to the spacing and alignment of components, embodiments of the present disclosure minimize the amount of material behind the PV elements that is visible and maximize efficiency by minimizing gaps between elements. The combination of innovative features disclosed in this document, including selectively coated and shaped conductive ribbons, high density and efficient arrangement of PV material, etc., achieve a solar module having a substantially black appearance with power output and efficiency that are superior to conventional modules that use white backsheets.

In an embodiment, a photovoltaic (PV) string includes a plurality of PV strips coupled in series, each strip of the plurality of strips including first and second end strips disposed at opposing ends of the string and at least one middle strip disposed between the first and second end strips. In such an embodiment, each strip may include an aperture side, a front bus bar disposed on the aperture side, a back side opposite to the aperture side, and a back bus bar disposed on the backside, where the back bus of every middle strip overlies the front bus of an adjacent strip in the string, and a front conductive ribbon that completely covers the front bus of the first end strip. The front conductive ribbon may include a bus interface disposed over the front bus of the first end strip, a bus side that faces the aperture side of the first end strip, an exposed side opposite to the bus side, at least one tab extending from the bus interface and an opaque coating that covers the exposed side of the bus interface and extends across at least a portion of the at least one tab.

In embodiments, the front conductive ribbon is attached to the front bus bar of the first end strip by an electrically conductive adhesive (ECA) or a solder material. A contact area between the bus interface of the front conductive ribbon and the front bus bar may be substantially the same, e.g. within normal engineering tolerances, as an area of overlap between adjacent strips in the string.

The front conductive ribbon may have a copper core coated with a material comprising tin. The PV string may have a first tab and a second tab that is asymmetric to the first tab. A width of the bus interface may be from 1 to 2 mm, and the at least one tab may extend at least 7 mm from the bus interface. The PV string may have a back conductive ribbon coupled to a back bus of the second end strip.

In an embodiment, the back conductive ribbon comprises a second bus interface coupled to the back bus of the second end strip, a second bus side that faces the backside of the second end strip, a second exposed side opposite to the second bus side, a second tab extending from the second bus interface, and a second opaque coating that covers the second exposed side of the bus interface and at least a portion of the second tab.

The front conductive ribbon may include a first plurality of tabs and the back ribbon comprises a second plurality of tabs, and a distance between adjacent tabs of the first plurality of tabs is different from a distance between adjacent tabs of the second plurality of tabs. In addition, the at least one tab of the front conductive ribbon may be folded over onto the back side of the first end strip, and the at least one tab of the back conductive ribbon may extend towards the front first end strip on the back side of the string. The front and back conductive ribbons may include a metal foil having a thickness of from 75 microns to 175 microns.

In an embodiment, an electrical interconnect structure for conducting electricity from a photovoltaic cell includes a front conductive ribbon that attaches to a front bus region on a front side of a photovoltaic cell, and the front conductive ribbon has a bus interface having a shape that completely covers the front bus bar of the photovoltaic cell, a bus side that faces the front bus bar of the photovoltaic cell, an exposed side opposite to the bus side, at least one tab extending from the bus interface and an opaque coating that covers the exposed side of the bus interface and extends across at least a portion of the at least one tab.

In an embodiment, the electrical interconnect structure includes a back conductive ribbon configured to attach to a back bus bar on a backside of the photovoltaic cell, and the back conductive ribbon has a second bus interface having a shape that completely covers the back bus bar of the photovoltaic cell, a second bus side that faces the back side of the second end strip, a second exposed side opposite to the second bus side, and a second tab extending from the second bus interface.

In the electrical interconnect structure, the front and back conductive ribbons may be formed of a metal foil having a thickness of from 75 microns to 175 microns, a width of the bus interface and the second bus interface may be between 1 and 2 mm, and each tab may extend at least 7 mm from the respective bus interfaces. Moreover, the front conductive ribbon may have a first plurality of tabs and the back ribbon may have a second plurality of tabs, while a distance between adjacent tabs of the first plurality of tabs is different from a distance between adjacent tabs of the second plurality of tabs.

In an embodiment, a photovoltaic (PV) module has a string that includes a plurality of PV strips coupled in series, each of the plurality of strips including first and second end strips disposed at opposing ends of the string and at least one middle strip disposed between the first and second end strips. In such an embodiment, each strip has an aperture side, a front bus bar disposed on the aperture side and a back side opposite to the aperture side, and the back bus bar of every middle strip covers the front bus bar of an adjacent strip in the string so that the only front bus bar that is not covered by an adjacent strip is a front bus bar of the first end strip. The embodiment has a front conductive ribbon that completely covers the front bus bar of the first end strip, and the front conductive ribbon has a bus interface that completely covers the front bus bar of the first end strip and an opaque coating that covers an exposed side of the bus interface, a frame, a transparent covering disposed over the aperture side of the string and a backsheet that covers the backside of the string. The transparent covering, the backsheet, and the string of PV strips are mounted within the frame.

In an embodiment, all visible surfaces of the front conductive ribbon are covered by the opaque coating, the plurality of strips in the string are coupled to one another using an electrically conductive adhesive (ECA), and the front ribbon is coupled to the front bus bar of the first end strip by the ECA. The PV module may have a plurality of zones, each of which has a plurality of strings that are coupled in parallel. Every zone of the plurality of zones may be adjacent to at least one other zone, and gaps between the adjacent zones may be 5 mm or less.

In an embodiment, the plurality of zones includes a first zone and a second zone, the first and second zones are arranged so that the first end strip of the first zone is adjacent to the second end strip of the second zone, and a back ribbon is disposed over a back bus bar of the second end strip of each string the second zone. The front ribbon may have two tabs extending from the bus interface, and a space between the two tabs of the front ribbon may be different from a space between the two tabs of the back ribbon. Each of the front and back ribbons of every string in the first and second zones may have at least one tab, wherein the at least one tab of the back conductive ribbons of the second zone are mechanically and electrically coupled to a flat wire, and wherein the at least one tab of the front conductive ribbons of the first zone are mechanically and electrically coupled to the flat wire.

In an embodiment, the at least one tab of respective front ribbons of every string in the first zone are mechanically and electrically coupled to a second flat wire. In an embodiment, the mechanical connections between the strips in each string, between the tabs of the front and back conductive ribbons and the first conductive wire, and between the at least one tab of respective front ribbons and the second flat wire form an interconnected mechanical sub-structure that constrains the strings in each zone. The mechanical sub-structure constrains adjacent strings so that, when the strings are laminated between two EVA layers, gaps between the adjacent strings move less than 2 mm.

The PV module may have a plurality of zones including a first zone and a second zone, wherein the second end strip of the first zone is adjacent to the first end strip of the second zone, and wherein back conductive ribbons are disposed over back bus bars of the second end strips. In a PV module, for each string in the first zone, the front conductive ribbon folds over an edge of the first end strip and extends over a back surface of the first end strip. For each string in the second zone, at least one tab of the front conductive ribbon passes through a gap between the first and second zones and extends over the backside of an adjacent string in the first zone.

In a PV module, every front conductive ribbon of the first zone and every front conductive ribbon of the second zone has the same shape.

An embodiment of a photovoltaic (PV) module has a plurality of strings, each string that including a plurality of PV strips coupled in series, each of the plurality of strips including first and second end strips disposed at opposing ends of the string and at least one middle strip disposed between the first and second end strips, wherein each strip comprises an aperture side, a front bus bar disposed on the aperture side, a back side opposite to the aperture side, and a back bus bar on the back side, wherein the back bus bar of every middle strip covers the front bus bar of an adjacent strip in the string so that the only front bus bar that is not covered by an adjacent strip is a front bus bar of the first end strip, a front conductive ribbon that completely covers the front bus bar of the first end strip, the front conductive ribbon comprising a bus interface that completely covers the front bus bar of the first end strip, and an opaque coating that covers an exposed side of the bus interface, a back conductive ribbon disposed over the back bus bar of the second end strip, a first zone and a second zone each comprising a plurality of strings that are coupled in parallel, a frame, a transparent covering disposed over the aperture side of the plurality of zones. and a backsheet that covers the backside of the plurality of zones, wherein the transparent covering, the backsheet, and the string of PV strips are mounted within the frame, and wherein all visible surfaces of each front conductive ribbon are covered by the opaque coating.

In a PV module, the first and second zones are arranged so that the first end strip of the first zone is adjacent to the second end strip of the second zone, and for each string in the first zone, the front conductive ribbon folds over an edge of the first end strip and extends over a back surface of the first end strip. For each string in the second zone, at least one tab of the front conductive ribbon passes through a gap between the first and second zones and extends over the backside of an adjacent string in the first zone.

In an embodiment, a PV module comprises a frame, a string that includes a plurality of PV strips coupled in series and configured within the frame, each of the PV strips comprising crystalline silicon material, the plurality of strips including a first end strip and a second end strip disposed at opposing ends of the string and at least one middle strip disposed between the first end strip and the second end strip, wherein each strip comprises: an aperture side, a singulated side, a front bus bar disposed on the aperture side, and a back side opposite to the aperture side, a configuration comprising the back bus bar of each middle strip covering the front bus bar of an adjacent strip in the string so that the only front bus bar that is not covered by an adjacent strip is a front bus bar of the first end strip, a front conductive ribbon that completely covers the front bus bar of the first end strip, the front conductive ribbon including a bus interface that completely covers the front bus bar of the first end strip and an opaque coating that covers an exposed side of the bus interface, the opaque coating comprising a polymeric material that absorbs electromagnetic radiation in a color spectrum equally while not reflecting any electromagnetic radiation in the color spectrum to reduce a total internal reflection parameter. The module further comprises a transparent covering disposed over the aperture side of the string, and a back sheet that covers the backside of the string, a stacked structure comprising the transparent covering, the string of PV strips, and the back sheet mounted within the frame, a substantially black visual structure comprising each of the aperture side and opaque coating underlying an entirety of the transparent covering when viewed from a distance of 10 feet from a surface region normal to the transparent covering, and a power output of 320 Watts to 400 Watts or 420 Watts to 500 Watts.

In an embodiment, the back sheet is configured in a black color with a reflectance of less than 20%, whereupon the substantially black visual structure comprising the back sheet and the opaque coating are configured to reduce the total internal reflection parameter, and the string of PV strip achieves the power output of 17.5 Watts to 20.9 Watts.

An embodiment of a PV module has no elements with a reflectance in the visible spectrum of greater than 50% and a size of greater than 1 mm in a least dimension in a plane parallel to the transparent covering are present and visible from a direction normal to the transparent covering.

In an embodiment, the module has a power efficiency of from 21 to 25%.

A module may have a plurality of zones includes a first zone and a second zone, and the first and second zones are arranged so that the first end strip of the first zone is adjacent to the second end strip of the second zone. In addition, a back ribbon may be disposed over a back bus bar of the second end strip of each string the second zone.

Each of the front and back ribbons of every string in the first and second zones may have at least one tab, the at least one tab of the back conductive ribbons of the second zone may be mechanically and electrically coupled to a flat wire, and the at least one tab of the front conductive ribbons of the first zone may be mechanically and electrically coupled to the flat wire.

In an embodiment, the front conductive ribbon comprises a first plurality of tabs and the back ribbon comprises a second plurality of tabs, and a distance between adjacent tabs of the first plurality of tabs is different from a distance between adjacent tabs of the second plurality of tabs.

As described above, a solar module may be formed from strips that are separated from a photovoltaic cell and then placed in a shingled arrangement to form a string. This separation process can create defects that give rise to losses effecting the efficiency of power conversion of the module, particularly if those defects occur proximate to the p-n junction.

In order to avoid such degradation during the strip formation process, embodiments exclude the p-n junction from regions at which separation is expected to occur. According to some embodiments, the p-n junction is excluded by physical removal of material from inter-strip regions of the workpiece. According to other embodiments, the p-n junction is achieved by changing a doping level (e.g., counter-doping, deactivation) at inter-strip regions. For still other embodiments, the p-n junction is not formed at inter-strip regions in the first place (e.g., using masked implant).

Figure 24:
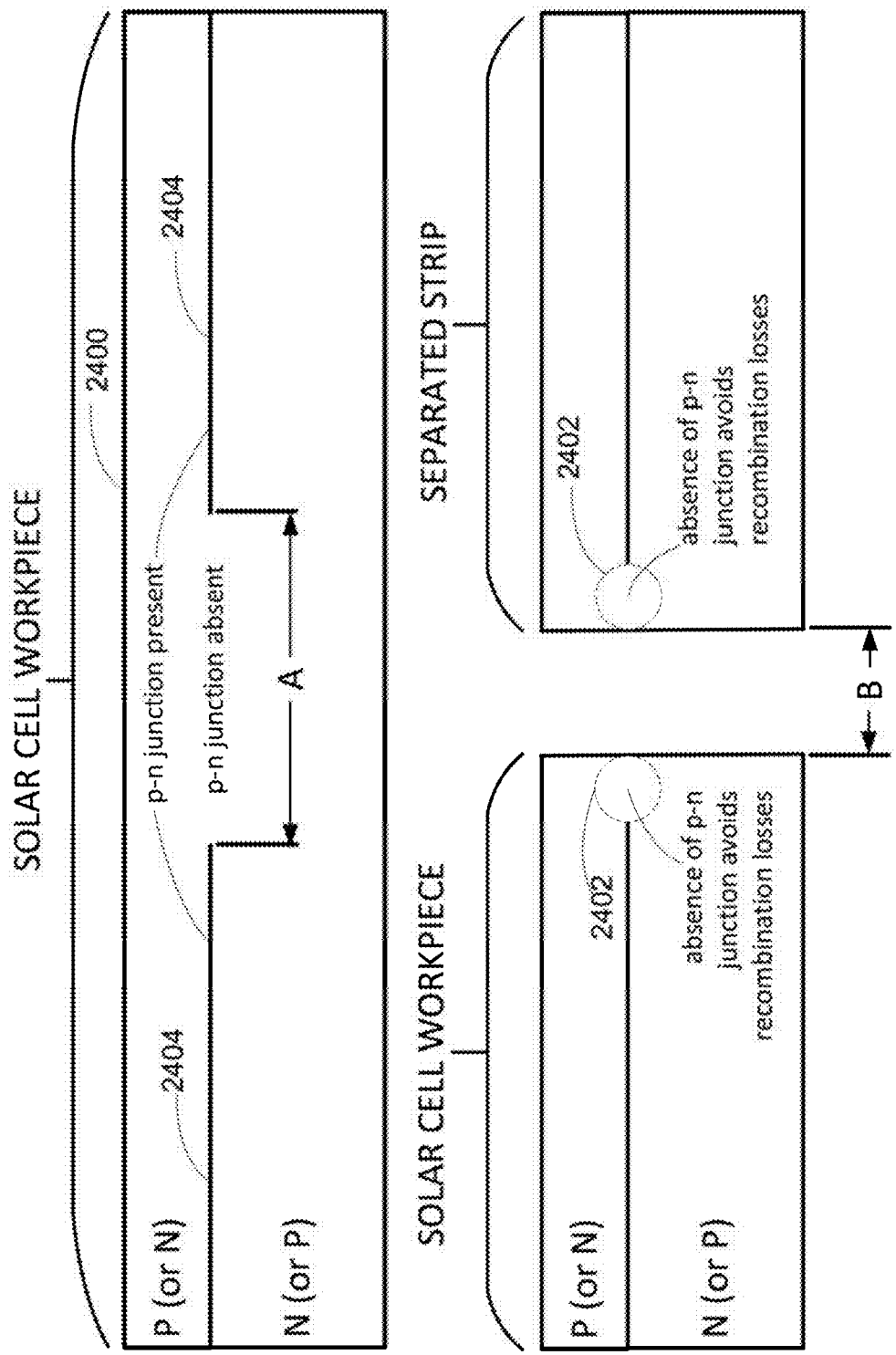
FIG. 24 shows a simplified cross-sectional view of a solar cell workpiece illustrating the general concept of improving power conversion efficiency according to an embodiment.

FIG. 24 shows a simplified cross-sectional view of a solar cell workpiece 2400 illustrating the general concept. Specifically, by excluding the p-n junction from occupying a distance A that is larger than a scribe region B, distance 2402 is imposed between the p-n junction 2404 and inter-strip regions expected to contain defects arising from separation processes (e.g., ablation, etching, crack propagation). In this manner power conversion efficiency losses attributable to electron-hole recombination at such defects, can be reduced.

As mentioned above, various embodiments can encompass at least three main approaches. A first approach modifies the solar cell workpiece to physically remove the material comprising the p-n junction. Such removal can be accomplished, e.g., by ablation and/or etching (e.g., wet etching, dry etching) of the front side of the solar cell workpiece. This may be formation of a passivation layer. This first approach is shown generically in the simplified cross-sectional solar cell workpiece view of FIG. 26. Various examples of this first approach, are also described later below in connection with FIGS. 18A-23E.

A second approach modifies the solar cell workpiece to change dopant levels at a p-n junction that has been created. According to some embodiments, such a change in dopant level can be accomplished by the introduction of counter-dopant to remove the p-n junction. In certain embodiments, such a change in dopant level can be accomplished by dopant deactivation (e.g., annealing to displace dopant to interstitial sites). This second approach (changing dopant level) is shown generically in the simplified cross-sectional solar cell workpiece view of FIG. 27.

A third approach avoids ever forming the p-n junction at inter-strip locations in the first place. This can be accomplished by patterning mask(s) prior to the introduction of dopant that forms the p-n junction in exposed areas. According to some embodiments, the masked introduction of dopant can be accomplished utilizing an implantation process. In certain embodiments the masked introduction of dopant can be accomplished utilizing a diffusion process. According to some embodiments, step(s) implant or diffusion (e.g., where the p-n junction is established by the introduction of dopant into a layer) or patterning of deposited material (e.g., where the p-n junction is established as the interface between a different layers). The third approach is shown generically in the simplified cross-sectional solar cell workpiece view of FIG. 28.

FIGS. 25A-C shows simplified cross-sectional views of a process of separating a strip from a solar cell. This process involves the ablation of material from a backside to form a groove (FIG. 25A). FIG. 25B shows the initiation of a crack at the groove (e.g., by the application of stress in the solar cell workpiece). FIG. 25C shows completion of the separation process by propagation of the crack to the front side of the workpiece.

Defects arising proximate to the p-n junction as a result of these processes, can result in efficiency losses due to electron-hole recombination. Accordingly, embodiments seek to impose distance between the p-n junction and regions expected to experience those separation defects.

Turning now to review the first approach, separation of individual strips from a solar cell workpiece can be accomplished by creating a groove (e.g., by laser ablation) in the workpiece front side, that penetrates through a first functional layer and a p-n junction defined with underlying bulk silicon. A passivation layer is then formed within the groove to correct defects and reduce recombination losses at the depth of the p-n junction.

In certain embodiments, the passivation layer comprises a second functional layer formed over the first functional layer and within the groove. According to other embodiments, the passivation layer is selectively formed within the groove (e.g., utilizing masking) by ablation of the first functional layer as well as other existing overlying functional layer(s). Particular embodiments may define a scribe region between adjacent grooves, and achieving strip separation by propagating a backside crack to the scribe region.

Specifically, embodiments may generate a groove on the solar cell prior to strip separation. This groove penetrates through the p-n junction formed at the interface between a first functional layer and a bulk silicon material. In some embodiments, the groove is formed into the first functional layer, with additional functional layers later being formed thereupon.

According to alternative embodiments, the groove is formed through the first functional layer and as well as any additional overlying functional layer(s). Then, a passivation layer is formed within the groove.

For either approach, the passivation layer serves to stabilize the bulk silicon material and the first functional layer that is exposed during the process of separating a strip from a solar cell. The passivation layer improves the charge separation and transfer process while suppressing/preventing the recombination of electrons and holes. The thickness of passivation layers may be <10 nm, and more typically 2-5 nm, in order to allow the charge transfer utilizing a tunneling mechanism. This stabilization reduces the amount of undesired electron-hole pair recombination attributable to defects, increasing power conversion efficiency.

Figure 18A:
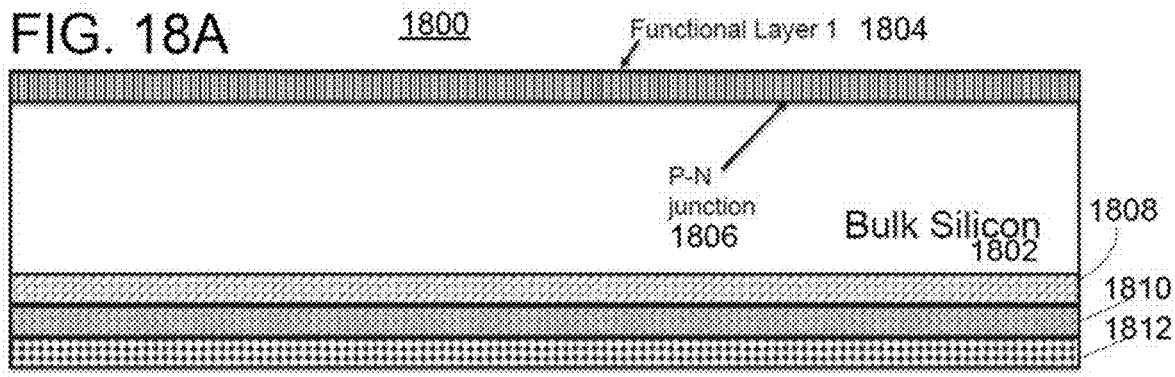
FIGS. 18A-D shows simplified cross-sectional views of the fabrication of a photovoltaic element.

FIGS. 18A-D shows simplified cross-sectional views of the fabrication of a photovoltaic element. In FIG. 18A, a solar cell 1800 is provided comprising bulk silicon 1802 bearing a first functional layer 1804.

The first functional layer comprises dopant of a first conductivity type, and the bulk silicon comprises dopant of a second conductivity type opposite to the first conductivity type. Hence, the interface of the first functional layer and the bulk silicon defines a p-n junction 1806, at which impinging sunlight can give rise to electron-hole pairs.

As shown in FIG. 18A, a back side of the solar cell further includes a number of additional functional layers. Functional layer 1808 proximate to the bulk silicon, can comprise passivation layers, such as $SiO_x$ in TOPCon cells, $AlO_x$ in PERC cells, or intrinsic amorphous silicon in HJT cells.

The functional layer 1810 can comprise doped layer such as n+ poly-Si in TOPCon or p-a-Si:H in HJT. This functional layer may perform one or more of the following roles.

(1) Form passivating contact with passivation layer: for example, in TOPCon, the different doping concentrations of poly-Si can change the work function and cause different selectivity.

(2) Perform as a barrier layer for metallization and in-diffusion. For example, poly-Si may be used between SiOx and metal to avoid the destruction of SiOx layer and maintain the quality of the passivation layer.

(3) Perform gettering, which improves the bulk quality.

The functional layer 1812 can comprise anti-reflective layer such as SiNx. The role of this functional layer is to reduce reflection of incident sun light.

On the bottom of the functional layer 1812, there can be a metal layer. A role of this metal layer is to collect and conduct the charge carriers. The metal layer can be patterned as grids or fully cover the surface.

Figure 18B:
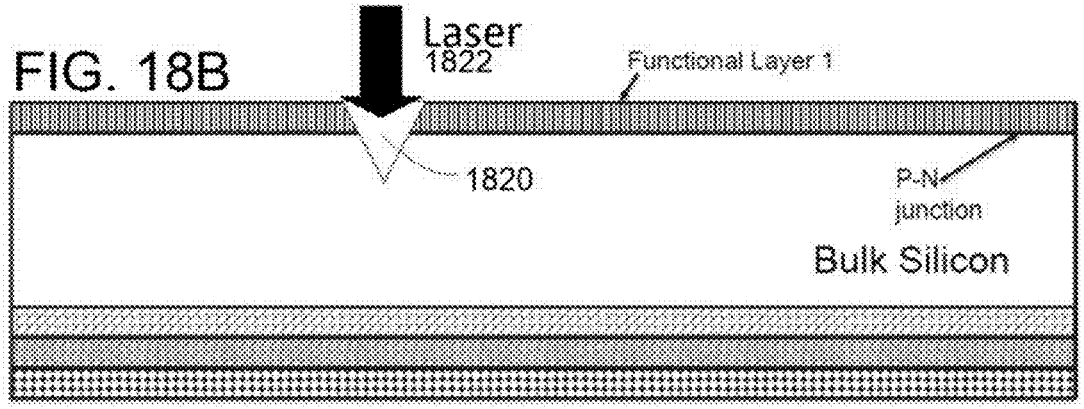

In order to fabricate a photovoltaic element (e.g., an individual strip) from the larger solar cell, in FIG. 18B a groove 1820 is formed in the first functional layer penetrating through the p-n junction and into the bulk silicon.

The groove may be formed by applying a laser 1822 to result in ablation on the solar cell. Such laser ablation can generate defects on the cutting surface. These defects can act as recombination center which can degrade cell performance.

Figure 18C:
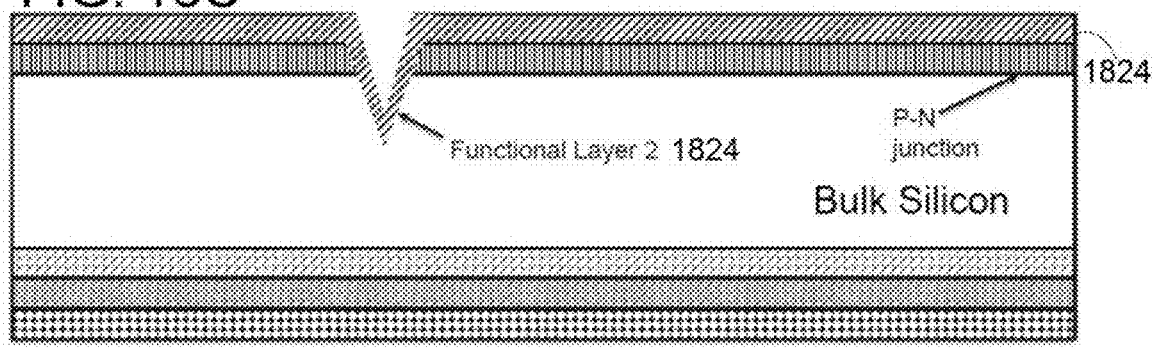

Accordingly, as shown in FIG. 18C, the solar cell bearing the groove is exposed to conditions that result in the formation of a second functional layer 1824 not only on the surface of the first functional layer, but also within the groove. These conditions can include but are not limited to Chemical Vapor Deposition (CVD) ambient resulting in formation of the second functional layer as a passivation layer. Examples of material making up the second functional layer can include but are not limited to oxide layer(s) such as AlOx, SiOx, or a nitride layer such as SiNx, or an amorphous silicon such as a-Si:H.

Figure 18D:
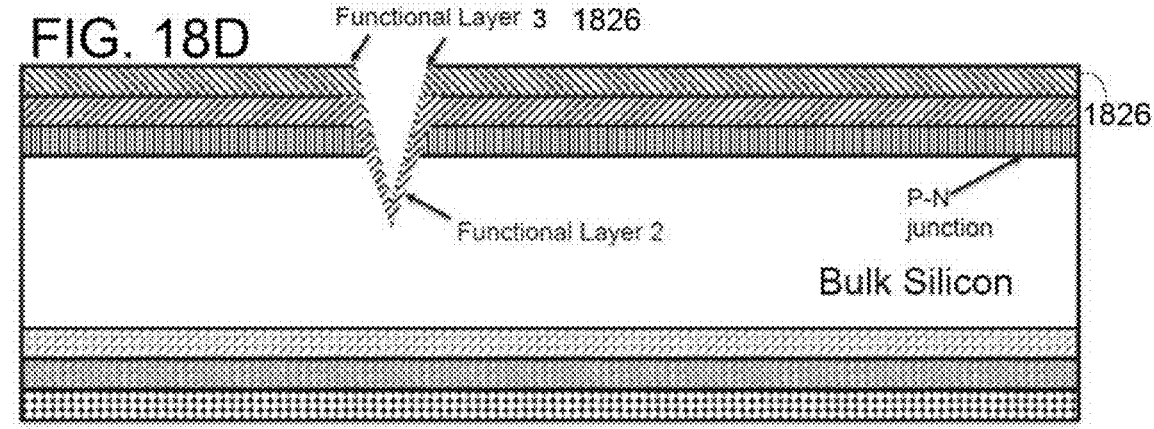

As further shown in FIG. 18D, exposing the solar cell to further conditions results in the additional deposition of material to form a third functional layer 1826, on top of the second functional layer (including within the groove). Examples of material making up the third functional layer can include but are not limited to nitride layer(s) such as SiNx or transparent conductive oxide (TCO) layer. Where TCO is used as the third functional layer 2010, it may also perform as a conductive layer to collect and transport the charge carrier.

Having formed a passivation layer within the groove, a strip can next be fully separated from the solar cell by one or more processes. One process is the formation of a laser scribe line on the backside of the solar cell, for example by laser ablation.

The subsequent imposition of stress (e.g., by the application of mechanical force and/or other energies) can then result in initiation of a crack at the laser scribe line. This crack then propagates to meet the bottom of the groove and thereby accomplish physical separation of a PV strip from the solar cell. According to some embodiments, this force can be a mechanical force. In certain embodiments the force can be a hydraulic force (e.g., from a fluid jet).

Here, the region at the material interface forming the p-n junction is particularly sensitive to defects giving rise to electron-hole recombination that cause electrical losses. As embodiments take particular care to passivate that region prior to separation, defects later arising along the backside scribe line attributable to crack formation and propagation would not be expected to contribute significantly to degradation in power conversion efficiency.

It is noted that the character of the groove is dependent upon the application of energy to the front side of the solar cell. Thus, for a laser ablation process, factors including but not limited to one or more of:

the power of the applied laser beam,
the energy delivered by the applied laser beam,
the wavelength of the applied laser beam,
the duration of the applied laser beam,
the beam spot size of the applied laser beam,
the pulse width of the applied laser beam,
the frequency of the applied laser beam,
the repetition pass of the applied laser beam on the solar cell,
the moving speed of the applied laser beam relative to the surface of solar cells, may affect the aspect ratio, depth, width, and/or slope of the resulting groove.

Figure 19:
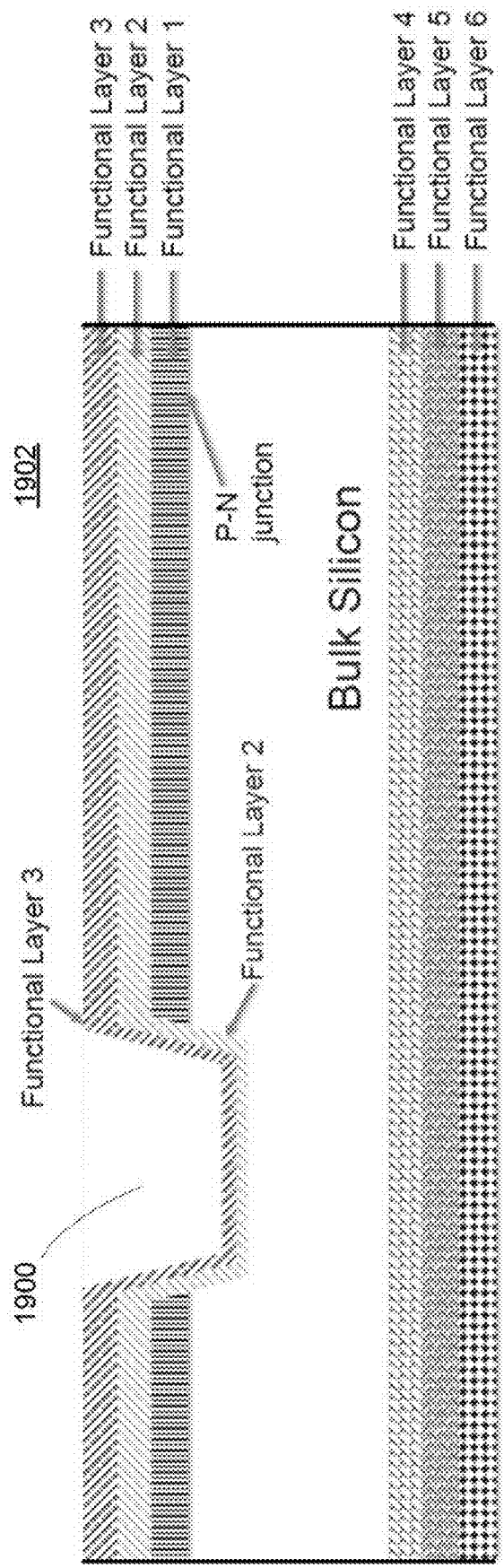
FIG. 19 shows a simplified cross-sectional view of an alternative embodiment of a photovoltaic element.

Accordingly, FIG. 19 shows a simplified cross-sectional view of an alternative embodiment of a photovoltaic element. Here, a wider groove 1900 than in FIG. 18B has been formed in the solar cell 1902 as a result of the laser ablation process.

Figure 20A:
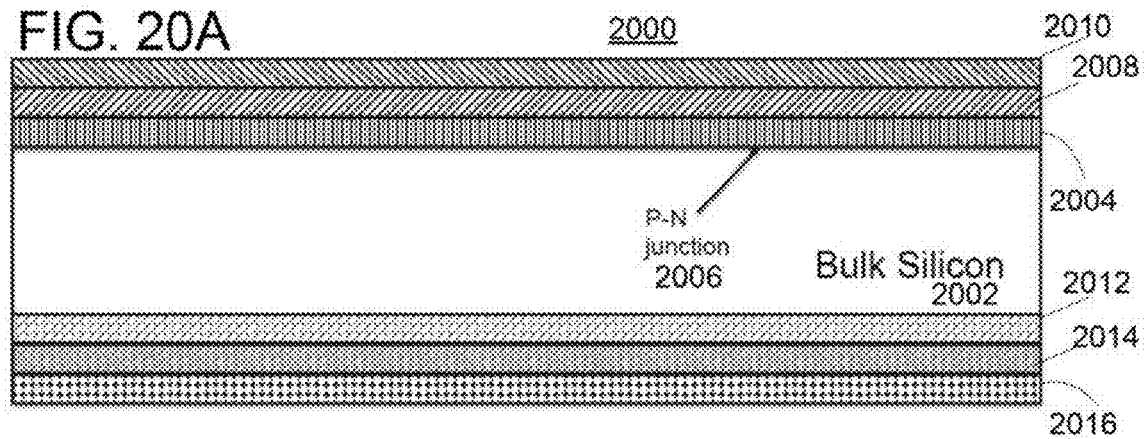
FIGS. 20A-C show simplified cross-sectional views of a process for fabricating a photovoltaic element.
Figure 20B:
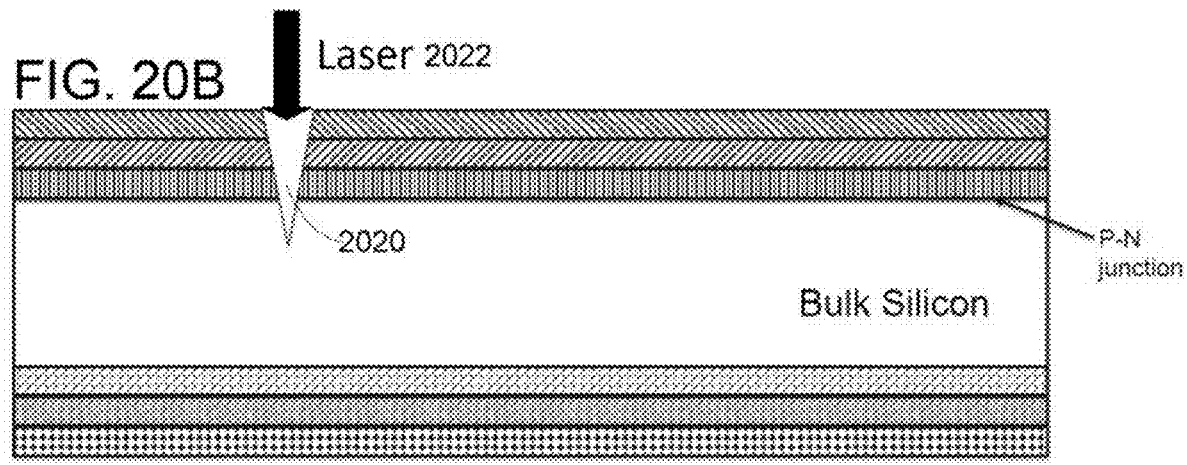
Figure 20C:
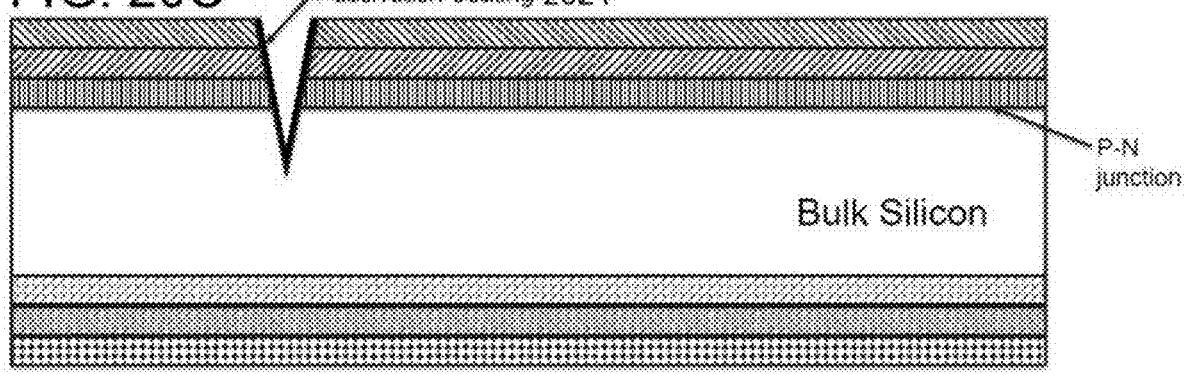

FIGS. 20A-C show simplified cross-sectional views of an alternative process for fabricating a photovoltaic element. Here, the groove is formed through multiple functional layers that are already present.

In FIG. 20A, a solar cell 2000 is provided comprising bulk silicon 2002 bearing a first functional layer 2004. The first functional layer comprises dopant of a first conductivity type, and the bulk silicon comprises dopant of a second conductivity type opposite to the first conductivity type. Hence, the interface of the first functional layer and the bulk silicon defines a p-n junction 2006, at which impinging sunlight can give rise to electron-hole pairs. For HJT devices, the p-n junction is formed by deposition of i-a-Si:H and p-a-Si:H on the top of n-type bulk silicon.

As also shown in FIG. 20A, the solar cell further includes a second functional layer 2008 disposed over the first functional layer. This second functional layer may perform the role of a passivation layer, and can comprise for example oxide layer(s) including AlOx, SiOx, or nitride layer(s) including SiNx, or amorphous silicon such as a-Si:H.

Third functional layer 2010 is disposed over the second functional layer. This second functional layer may perform the role of anti-reflection layer, and can comprise for example nitride such as SiNx or transparent conductive oxide (TCO). In the case of using TCO as the third functional layer 2010, it also performs as a conductive layer to collect and transport the charge carrier.

A back side of the solar cell further includes a number of additional functional layers. Fourth functional layer 2012 proximate to the bulk silicon, can comprise passivation layers, such as $SiO_x$ in TOPCon cells, $AlO_x$ in PERC cells, or intrinsic amorphous silicon in HJT cells.

Fifth functional layer 2014 can comprise doped layer such as n+ poly-Si in TOPCon, p-a-Si:H in HJT devices. Sixth functional layer 2016 can comprise an anti-reflective layer such as SiNx.

In order to fabricate a photovoltaic element (e.g., an individual strip) from the larger solar cell, in FIG. 20B a groove 2020 is formed in the third functional layer penetrating through the second function layer, the first functional layer, and penetrating the p-n junction into the bulk silicon.

Here, it is noted that a somewhat greater amount of energy from a laser 2022 may be needed to form the groove in FIG. 20B, than is needed to form the groove in FIG. 20A. For example, the laser applied in FIG. 18A need only penetrate through the first functional layer to the p-n junction located at a shallower depth (e.g., about 5 μm).

By contrast, in the embodiment of a solar cell shown in FIG. 20A, the p-n junction lies beneath two additional functional layers. Hence, the application of greater energy by the laser may be needed to accomplish the ablation of the extra material. This can be accomplished by adjusting one or more of the following factors:

the power of the applied laser beam,
the energy delivered by the applied laser beam,
the wavelength of the applied laser beam,
the duration of the applied laser beam,
the beam spot size of the applied laser beam;
the pulse width of the applied laser beam, and
the frequency of the applied laser beam, and
the repetition pass of the applied laser beam on the solar cell, and
the moving speed of the applied laser beam relative to the surface of solar cells.

Again, the laser ablation can generate defects on the cutting surface. These defects can act as recombination center which can degrade cell performance.

Accordingly, as shown in FIG. 20C, the solar cell bearing the groove is exposed to conditions that result in the formation of a conformal passivation layer 2024 within the groove. These conditions can include but are not limited to the formation of a mask exposing the groove, followed by the application Chemical Vapor Deposition (CVD) ambient resulting in formation of the passivation layer.

Examples of material making up the passivation layer can include but are not limited to oxide layer such as AlOx, SiOx, or nitride layer such as SiNx, or amorphous silicon such as a-Si:H. This passivation layer serves to stabilize the material at the p-n junction against defects giving rise to electron-hole combination.

Figure 21:
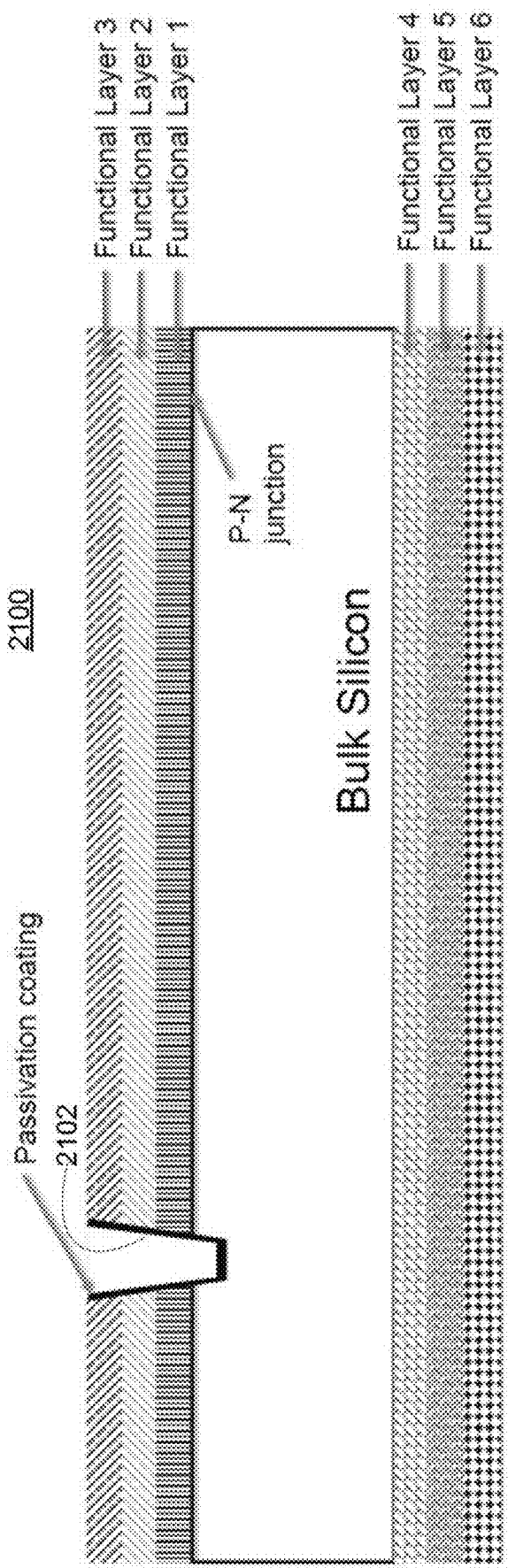
FIG. 21 shows a simplified cross-sectional view of an alternative embodiment of a photovoltaic element.

FIG. 21 shows a simplified cross-sectional view of a photovoltaic element 2100 being formed according to an alternative embodiment. As with FIG. 19, this FIG. 21 illustrates that the conditions of application of the laser can influence the characteristics of the resulting groove 2102. Here, the groove is wider at the bottom than the groove shown in FIG. 20C.

It may be challenging to accomplish cleaving of a wafer by propagating a crack from a back side scribe to directly meet the front side groove. Accordingly, embodiments may perform separation of a strip from a solar cell by propagating a crack from a rear side to a wider region lying between two front side grooves.

FIGS. 22A-G show simplified cross-sectional views illustrating a process of the fabrication of a photovoltaic element according to an embodiment. In FIG. 22A, a solar cell as in FIG. 20A is provided.

In FIG. 22B, the laser 2022 is applied in two separate locations to define two adjacent grooves 2202 and 2204, separated by a distance 2206. In FIG. 22C, a mask 2210 is formed to expose the region between the grooves.

In FIG. 22D, the region exposed by the mask is subjected to etching conditions to form a recessed Zone 1 2212. This etching results in removal of the functional layers. Then, a passivation layer 2214 is formed within the zone. The mask is then removed.

In FIG. 22E, an additional (here seventh) functional layer 2216 is formed over the passivation layer within the scribe region. That additional functional layer may comprise oxide layer such as AlOx, SiOx, or nitride layer such as SiNx, or amorphous silicon such as a-Si:H. Its role is to passivate the exposed surface defined by Zone 1. In addition, this additional functional layer can also reduce light reflection.

At this juncture, two further possible paths are available to separate the strip from the solar cell. FIG. 22F shows one approach, wherein a further groove 2218 is formed by application of a laser to the front side of the solar cell. This results in a scribing path 2220 within the region and through the additional functional layer and into the bulk silicon 2002.

FIG. 22G shows an alternative approach. Here, the laser is applied to a backside 2222 of the solar cell to form a backside groove 2224.

The location of this backside groove in turn defines a scribing path 2226. The application of stress to the solar cell along that scribing path creates a mechanical cleavage 2228 which propagates to the zone on the solar cell front side, ultimately allowing the strip to be separated from the solar cell.

It is noted that the formation of a recessed zone within a region between adjacent grooves, is not limited to approaches involving ablation through multiple functional layers. FIGS. 23A-E show simplified cross-sectional views illustrating the fabrication of a photovoltaic element according to an alternative embodiment.

Figure 23A:
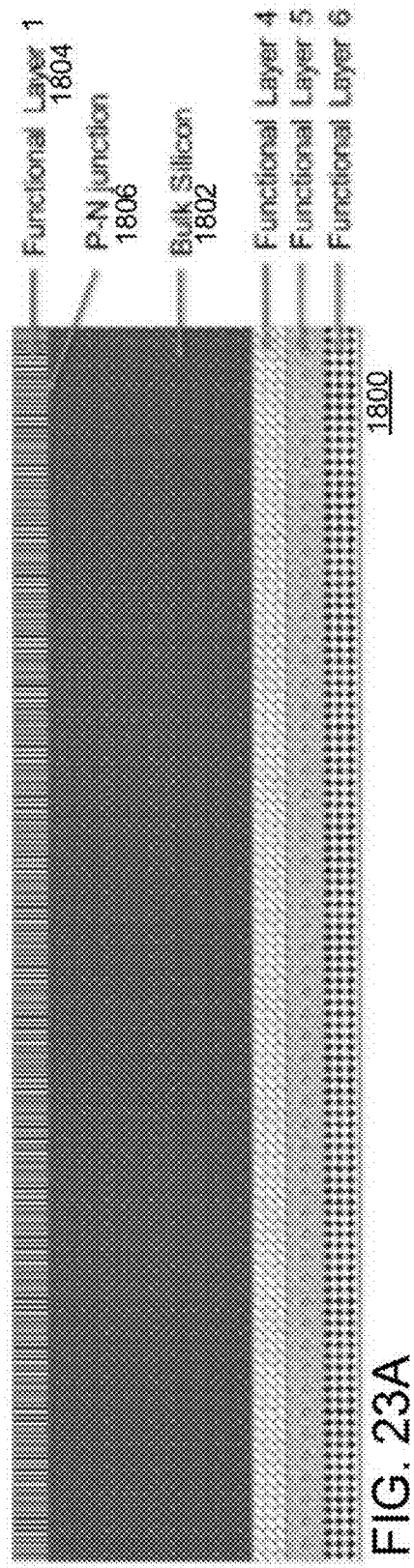
FIGS. 23A-E show simplified cross-sectional views illustrating the fabrication of a photovoltaic element according to an embodiment.
Figure 23B:
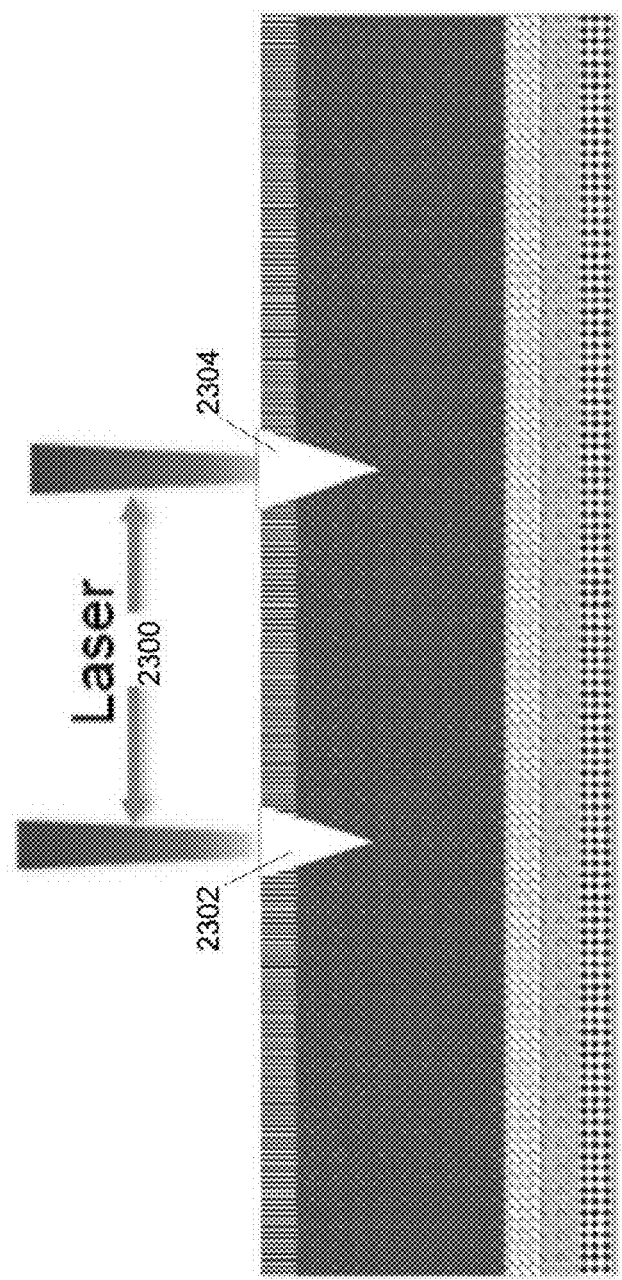

FIG. 23A shows the solar cell of FIG. 18A being provided as a starting material. FIG. 23B shows the application of a laser 2300 to create grooves 2302, 2304 penetrating through the first functional layer 1804 and p-n junction 1806 into the bulk silicon 1802.

Figure 23C:
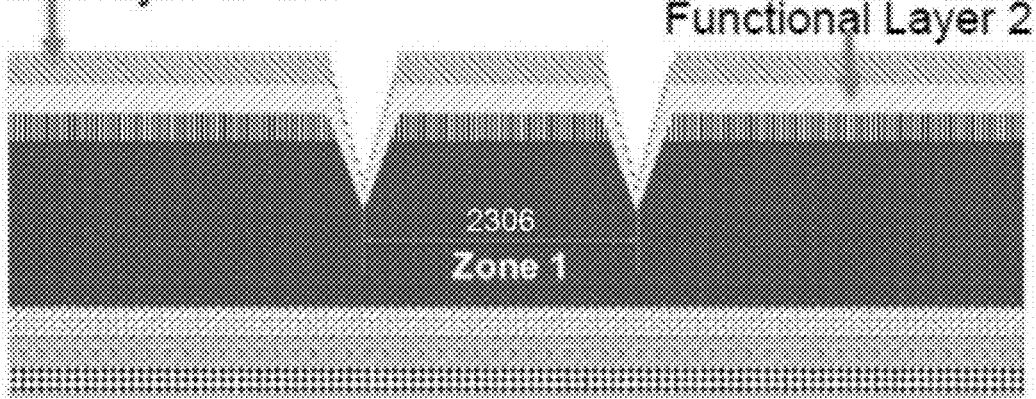

As shown in FIG. 23C, the area between the grooves defines a zone 2306. The second functional layer 1824 is then formed over the first functional layer and within the grooves. This second functional layer serves as passivation layer to reduce defects at the p-n junction, thereby improving power conversion efficiency. A third functional layer 1826 is then formed over the second functional layer.

Figure 23D:
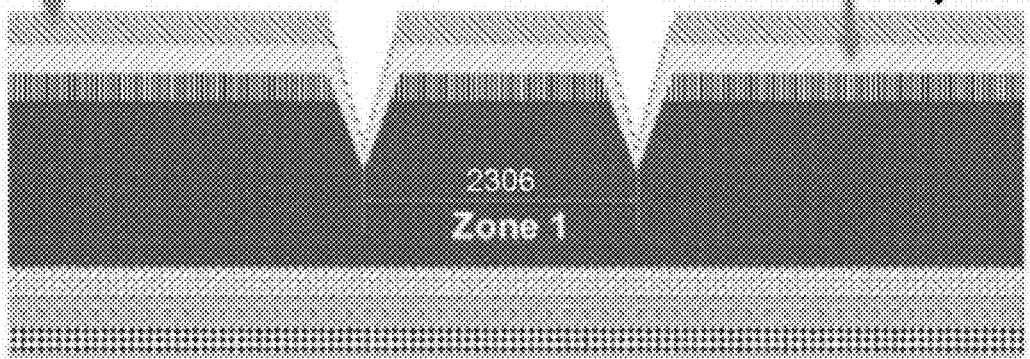

FIG. 23D shows the removal of material in the scribe region between the two grooves, including removal of the first functional layer. This forms a recess 2310.

Figure 23E:
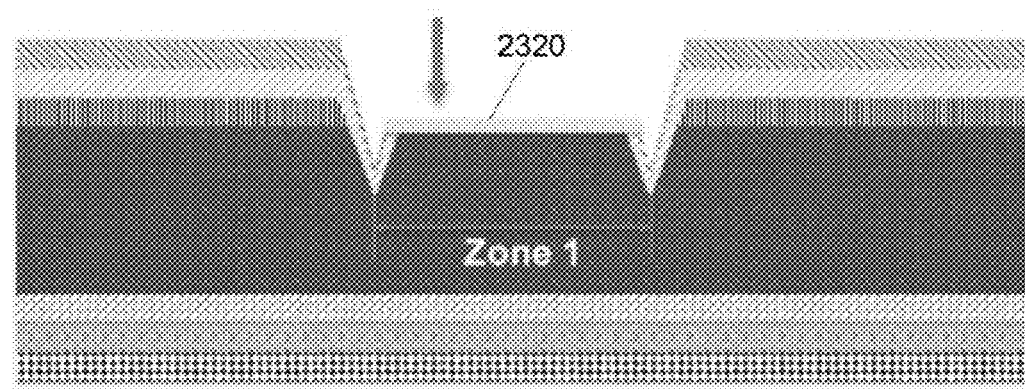

FIG. 23E shows the formation of a seventh functional layer 2320 within the scribe region (only, e.g., as may be afforded by masking techniques). As previously indicated, this seventh functional layer serves to passivate the exposed surface defined by Zone 1.

At this point a strip on either end of the scribe region is ready for separation from the solar cell. This separation can be achieved, for example, by frontside ablation of material within the scribe region and/or by ablation on a backside followed by propagation of a crack to reach the scribe region.

As noted above, one or more than one groove can be generated within a certain distance, also referred to herein as a zone. The width of such zone can be determined by the laser scribing tolerance. Zone between two neighboring grooves can have the same or different structure as the two adjacent zones. Such zone can be modified to improve the overall string performance by optimizing dark area performance.

Clause 1A. An apparatus comprising:
solar cell comprising first functional layer of first conductivity type overlying bulk silicon of second conductivity type opposite to first conductivity type, to define a p-n junction;
a first groove penetrating through the p-n junction; and
a passivation layer lining walls of the first groove at the p-n junction.

Clause 2A. An apparatus as in Clause 1A wherein the passivation layer comprises oxide, nitride, or amorphous silicon.

Clause 3A. An apparatus as in Clause 1A wherein the first functional layer comprises boron dopant or phosphorous dopant.

Clause 4A. An apparatus as in Clause 1A wherein the passivation layer is part of a second functional layer extending over the first functional layer.

Clause 5A. An apparatus as in Clause 4A further comprising a third functional layer overlying the second functional layer.

Clause 6A. An apparatus as in Clause 5A wherein the third functional layer comprises nitride or transparent conductive oxide.

Clause 7A. An apparatus as in Clause 1A wherein the passivation layer is confined to the first groove.

Clause 8A. An apparatus as in Clause 1A further comprising a second functional layer overlying the first functional layer outside of the first groove.

Clause 9A. An apparatus as in Clause 8A wherein the second functional layer comprises oxide, nitride, or amorphous silicon.

Clause 10A. An apparatus as in Clause 8A further comprising a third functional layer overlying the second functional layer.

Clause 11A. An apparatus as in Clause 10A wherein the third functional layer comprises nitride or transparent conductive oxide.

Clause 12A. An apparatus as in Clause 1A wherein the passivation layer comprises an oxide.

Clause 13A. An apparatus as in Clause 12A wherein the oxide is deposited.

Clause 14A. An apparatus as in Clause 12A wherein the oxide is grown.

Clause 15A. An apparatus as in Clause 1A further comprising: a scribe region between the first groove and a second groove, the second groove penetrating through the first functional layer and the p-n junction into the bulk silicon, the passivation layer also lining walls of the second groove at the p-n junction.

Clause 16A. An apparatus as in Clause 15A further comprising: an additional functional layer present within the scribe region.

Clause 17A. A method comprising: providing a solar cell comprising first functional layer of first conductivity type overlying bulk silicon of second conductivity type opposite to first conductivity type, to define a p-n junction; create a groove penetrating through the first functional layer and the p-n junction into the bulk silicon; and
form a passivation layer lining walls of the groove at the p-n junction.

Clause 18A. A method as in Clause 17A wherein:
the solar cell is provided with a second functional layer overlying the first functional layer; and
the groove is created through the second functional layer, the first functional layer, and the p-n junction.

Clause 19A. A method as in Clause 17A further comprising:
forming a second functional layer on top of the first functional layer and within the first groove as the passivation layer.

Figure 29:
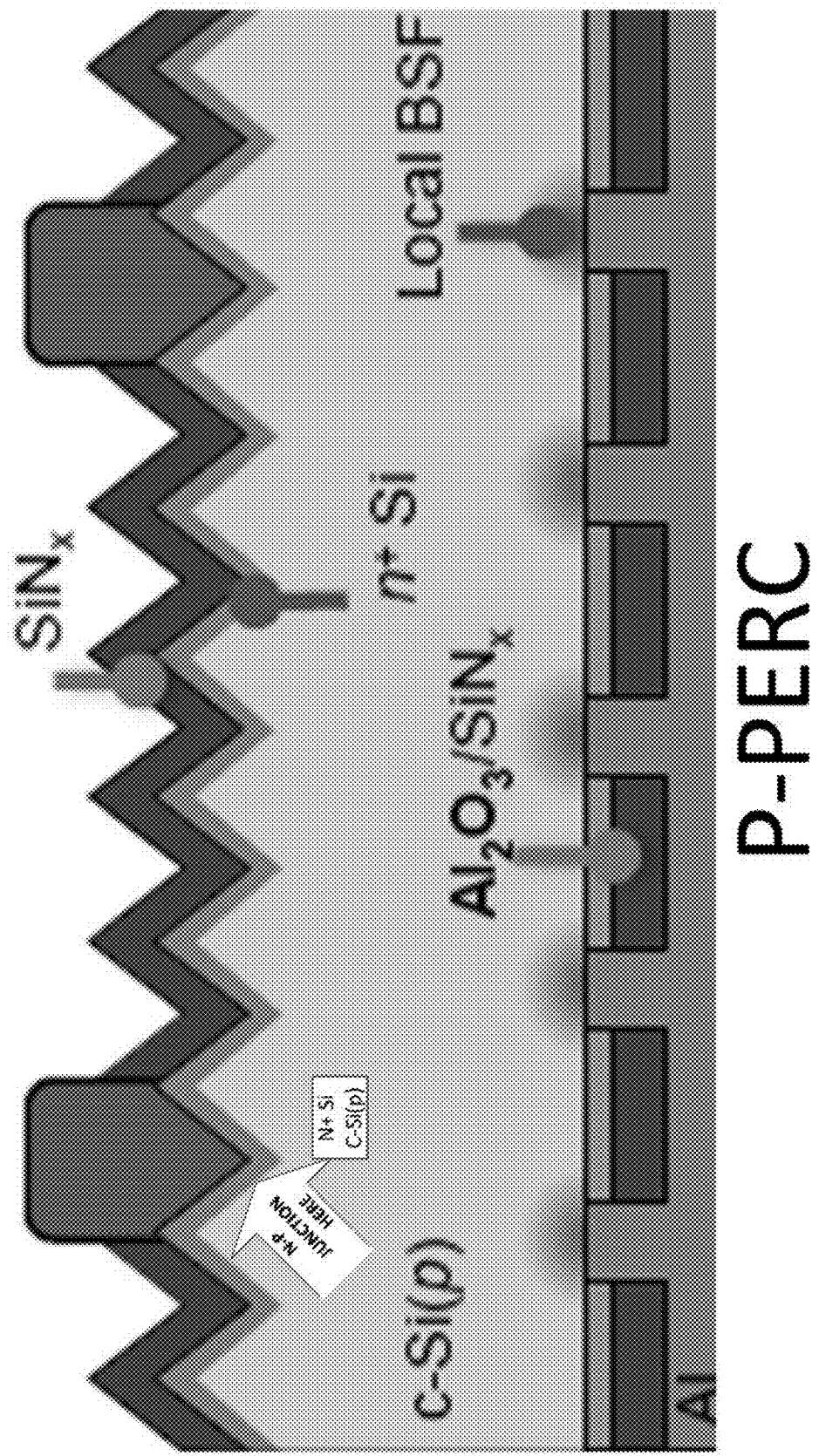
FIG. 29 shows a simplified cross-sectional view of a p-Passivated Emitter Rear Contact (PERC) solar device.
Figure 29A:
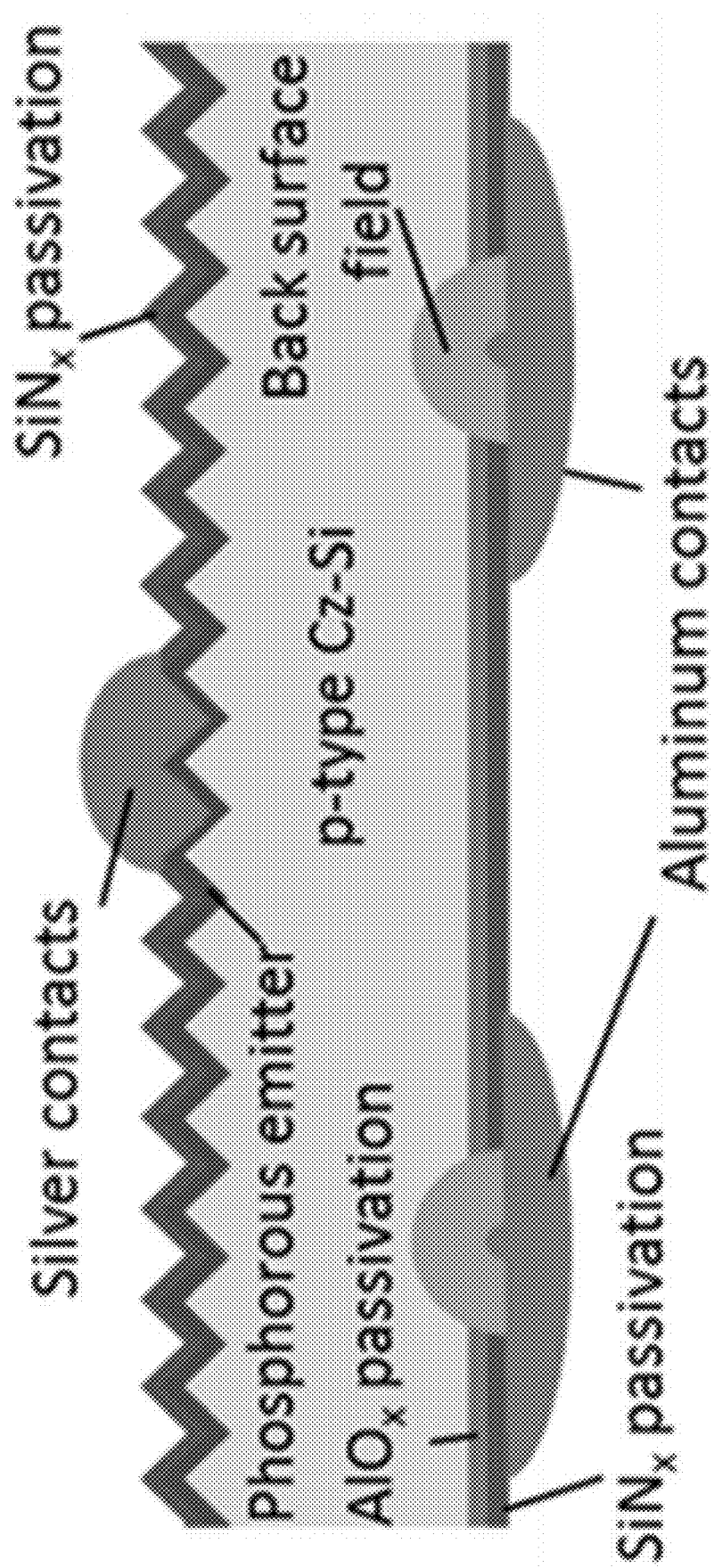
FIG. 29A shows a simplified cross-sectional view of a bifacial PERC device.

Clause 20A. A method as in Clause 17A wherein creating the groove comprises applying a laser Embodiments may be implemented to improve power conversion efficiency of a variety of different types of solar devices. FIG. 29 shows a simplified cross-sectional view of a p-Passivated Emitter Rear Contact (PERC) solar device, showing the location of the p-n junction. FIG. 29A shows a simplified cross-sectional view of a bifacial PERC device. Identities of the various elements of one example of these device types can be as follows.

| ELEMENT | p-PERC |
| --- | --- |
| Functional Layer 3 | — |
| Functional Layer 2 | SiNx |
| Functional Layer 1 | $N^+$ Si |
| Bulk Silicon | c-Si(p) |
| Functional Layer 4 | $Al_2O_3$ |
| Functional Layer 5 | $SiN_x$ |
| Functional Layer 6 | Al or - (bifacial) |

FIG. 29 helps to illustrate that the resulting shape of a dopant profile reflect the manner of introduction of the dopant. In particular, implantation is an anisotropic process, biased in the direction of the incoming dopant particles. This may result in relatively sharp boundaries between implanted and masked regions. An implanted dopant profile may show a peak below the implanted surface. According to some embodiments implantation can be followed by an annealing step to make the dopant distribution more uniform.

By contrast, diffusion may be an isotropic process, with dopant spreading in no particular preferred direction upon application of heat. This is shown in FIG. 29, with the semi-circular shape of the curved dopant profile of the local Back Surface Field (BSF) diffused p dopant contact.

It is noted that embodiments are not limited to any particular type of solar device including a p-n junction. In particular, FIG. 29B shows simplified cross-sectional views of PERC+, POLO-RS (rear surface), and PERC+POLO devices. Here, POLO refers to Poly-Silicon-On-Oxide.

Figure 29C:
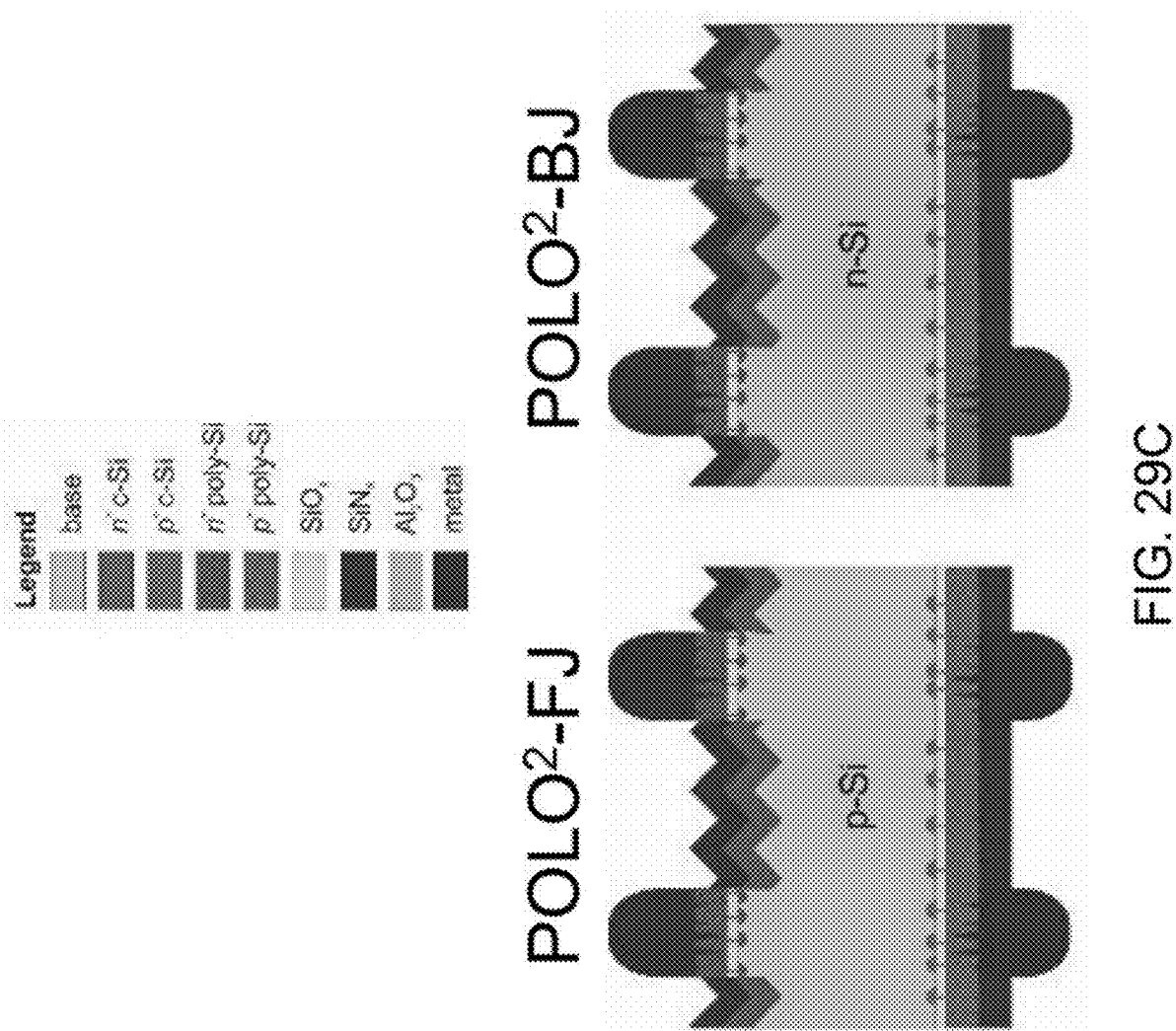
FIG. 29C shows simplified cross-sectional views of POLO$^2$-FJ and POLO$^2$-BJ devices.

FIG. 29C shows simplified cross-sectional views of $POLO^2$-FJ (Front Junction) and $POLO^2$-BJ (Back Junction) devices. Here, $POLO^2$ refers to a POLO design where both front and rear have Poly(crystalline)-Silicon-On-Oxide structure.

Figure 29D:
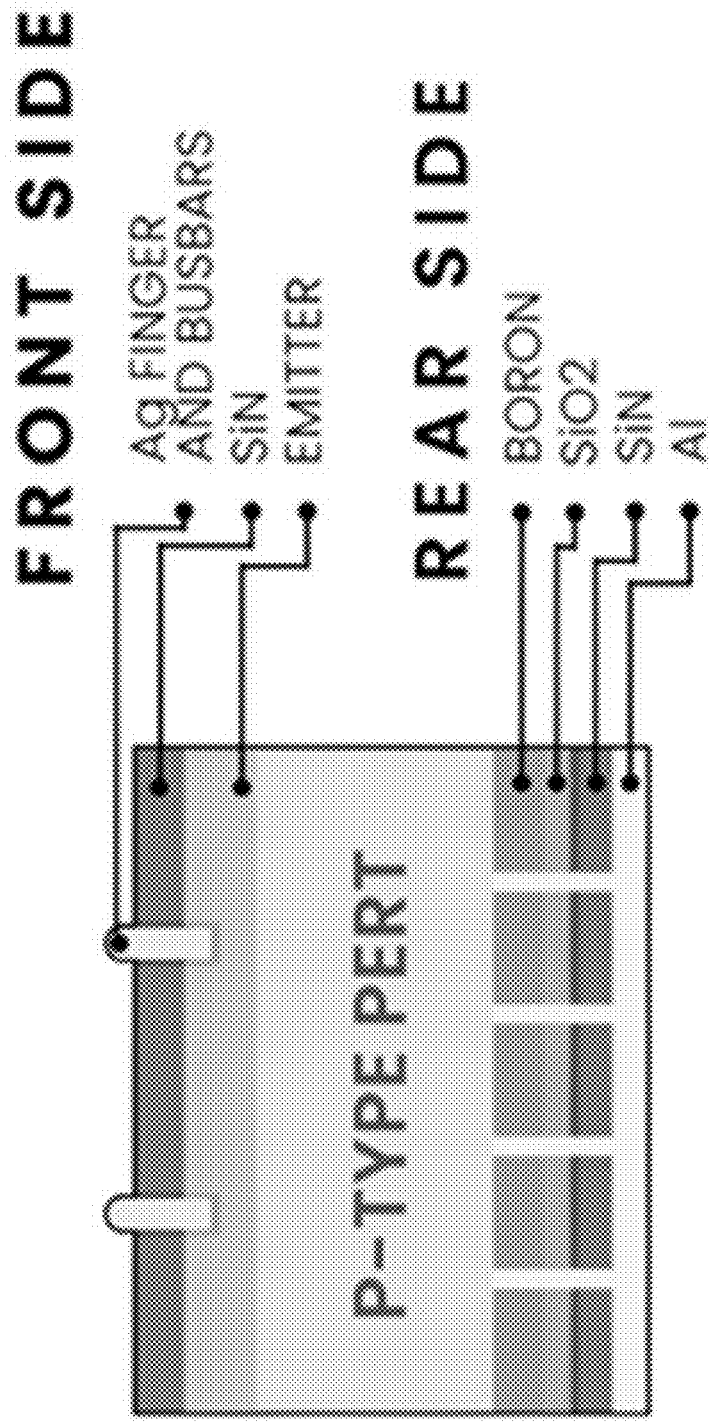
FIG. 29D shows a simplified cross-sectional view of a PERT device.
Figure 29E:
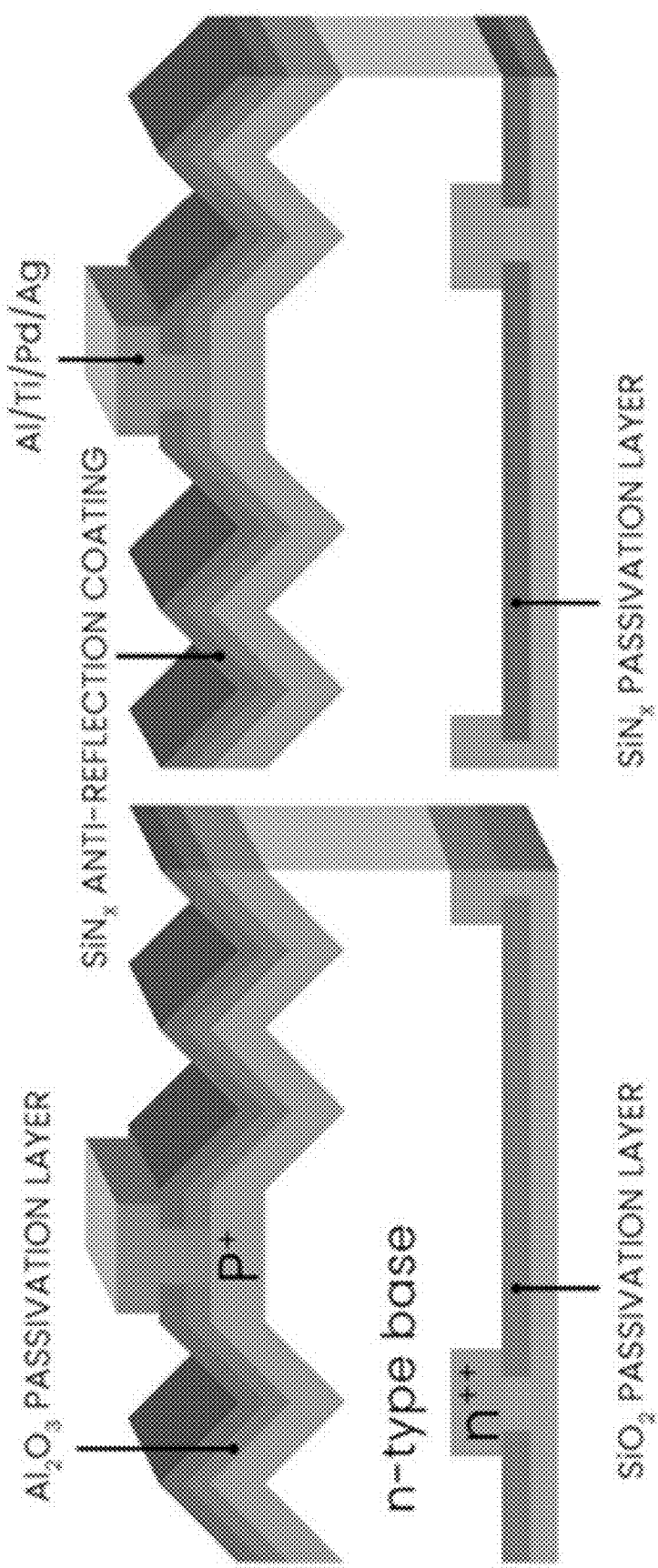
FIG. 29E shows simplified cross-sectional views of PERL devices.

Embodiments may be applicable to still other solar designs having p-n junctions. FIG. 29D shows a simplified cross-sectional view of a Passivated Emitter Rear Totally-Diffused (PERT) device. FIG. 29E shows simplified cross-sectional views of Passivated Emitter Rear Locally-Diffused (PERL) devices having different designs.

Figure 30:
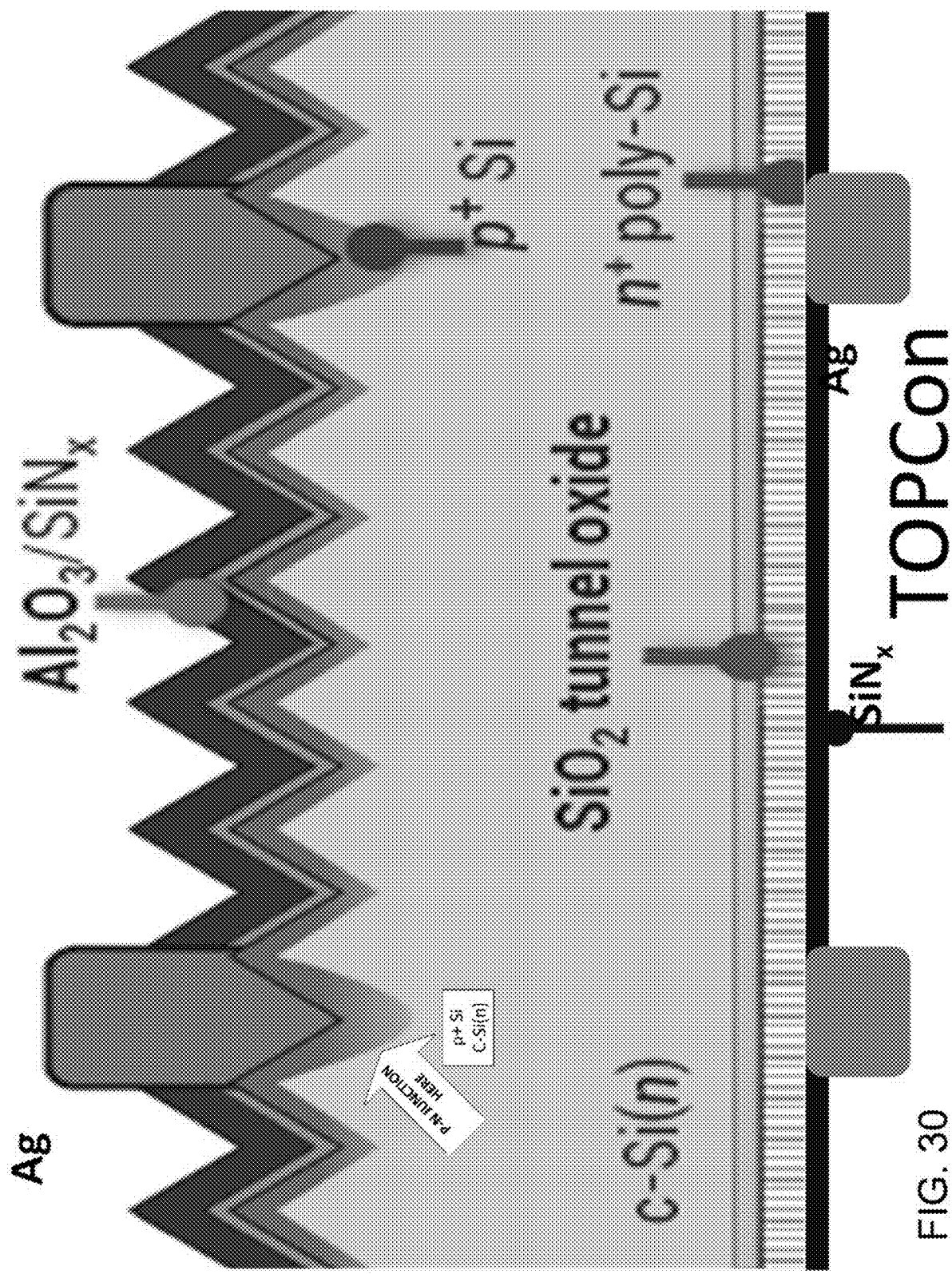
FIG. 30 shows a simplified cross-sectional view of one example of a bifacial Tunnel Oxide Passivated Contact (TOPCon) solar device.
Figure 30A:
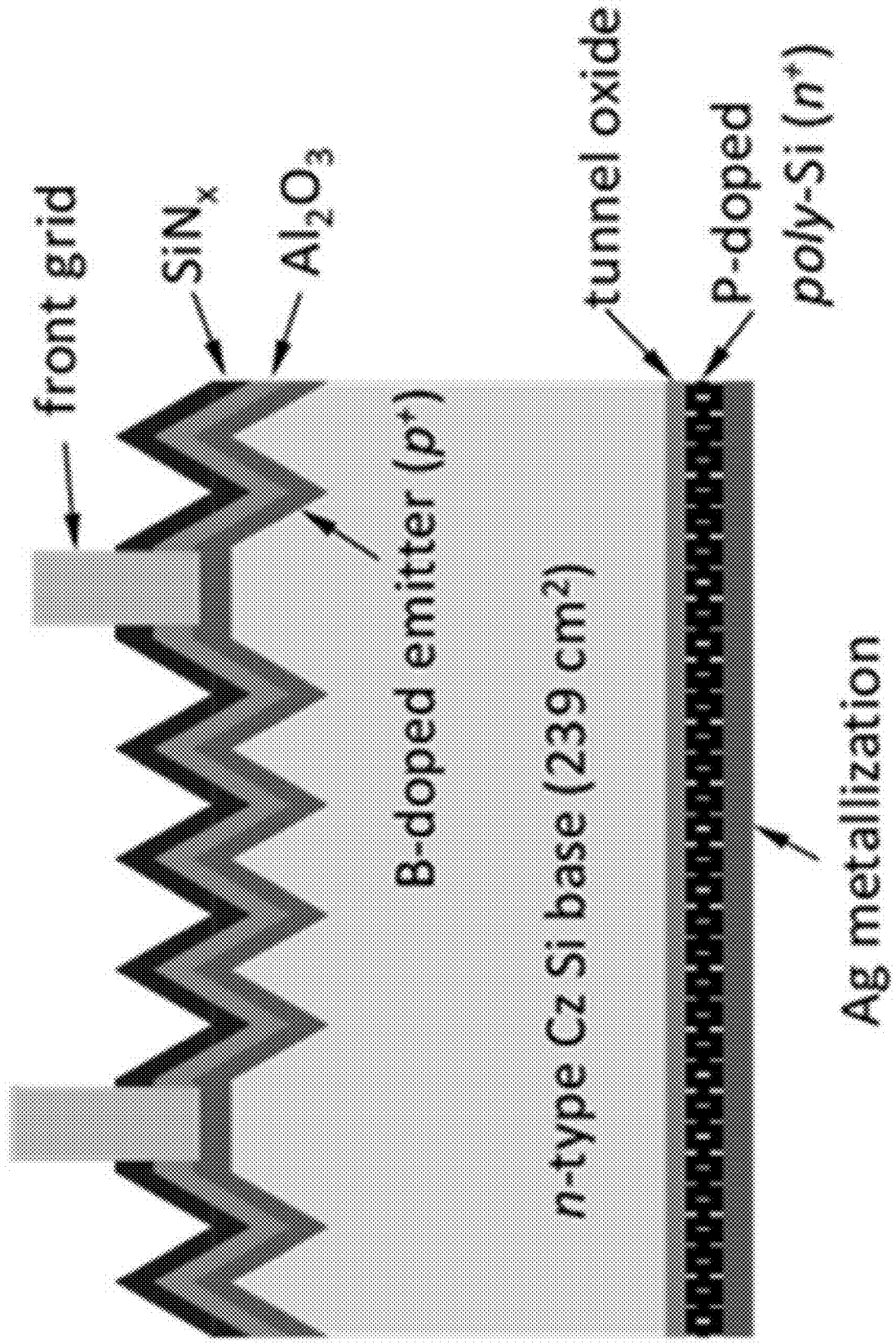
FIG. 30A shows one example of a mono-facial TOPCon device.

FIG. 30 shows a simplified cross-sectional view of a bifacial Tunnel Oxide Passivated Contact (TOPCon) solar device, showing the location of the p-n junction. FIG. 30A shows a mono-facial TOPCon device. Identities of the various elements of one example of this device type are as follows.

| ELEMENT | TOPCon |
| --- | --- |
| Functional Layer 3 | SiN$_x$ |
| Functional Layer 2 | Al$_2$O$_3$ |
| Functional Layer 1 | P+ Si (e.g., by thermal diffusion) |
| Bulk Silicon | c-Si(n) |
| Functional Layer 4 | SiO$_2$ tunnel oxide |
| Functional Layer 5 | N+ poly-Si |
| Functional Layer 6 | SiN$_x$ or Ag (mono-facial) |

FIG. 30 helps to illustrate that a p-n junction may in fact exhibit a complex profile. Here, additional p-type dopant has been introduced to the expected footprint location of the Ag contact (busbar or finger). According to some embodiments, this profile may be achieved by a selective diffusion process involving the localized application of a laser. However, the introduction of additional dopant is not required in all embodiments.

As mentioned above, approaches according to certain embodiments may involve either the changing of dopant levels to exclude the p-n junction from inter-strip regions, or not forming the p-n junction in inter-strip regions in the first place.

According to the former approach, the level of dopant may be changed to impose distance between the p-n junction and expected scribe regions. In an embodiment, the dopant level may be changed by introducing a counter-dopant to one (or both) of the p and n regions.

In some embodiments, this may be accomplished by patterning a mask to expose inter-strip regions, and then introducing the counter-dopant into unmasked areas by diffusion or implant. It is noted that the counter-dopant may be introduced in a different manner than the original dopant forming the junction. For example, where the original dopant forming the junction was introduced by diffusion, the counter-dopant may be implanted (or vice-versa). It is also noted that diffusion may be accomplished through the global application of thermal energy through a lamp or a furnace, or accomplished locally through the local application of thermal energy by a laser.

Such a counter-doping approach may result in detectable increases in levels of the counter-dopant in the strip that is incorporated into a shingled module. For example, in regions formerly containing a p-n junction, counter-doping associated with the introduction of n dopant may result in elevation of levels of n-dopant over and above the original background level. That is, a p-n dopant profile becomes a n(elevated)-n dopant profile.

For some embodiments, the effective dopant level may be changed by deactivation. This can involve the application of thermal energy to displace dopant into interstitial locations of a lattice, where the dopant does not affect electrical properties. Such thermal energy for deactivation may be applied globally (e.g. using a lamp or a furnace to heat unmasked regions) or locally (e.g., using a laser beam). A thermal deactivation approach may not change the absolute dopant concentration, but rather the location of dopant within the semiconducting lattice (e.g., displacement of dopant to interstitial sites). For some embodiments, the absolute dopant concentration can be changed by evaporating the dopant element with heat or laser.

As previously mentioned, in some embodiments the p-n junction may never be formed in the first place in inter-strip regions. That is, the p-n junction may be formed by the introduction of dopant (by diffusion or implant), with a patterned mask blocking the dopant from entering scribe regions at that time.

It is noted that embodiments may allow for ready integration into process flows for forming solar devices. That is, a mask used for excluding a p-n junction may be the same as one used to form device elements in an existing process flow. Similarly, thermal treatment (for diffusion or deactivation) could occur at the same time as thermal energy is applied to form device elements during an existing process flow. For example, the formed p-n junction can be removed by laser during the edge isolation process in cell production, which then avoids adding extra process steps and capital equipment. The groove in the inter-strip region will then be passivated during the anti-reflective coating process.

In addition, etching to remove material at inter-strip regions, could take place at a same time that etching occurs as part of an existing process flow. For example, counter-dopant may be introduced by diffusion from a silicate glass. Subsequent removal of that silicate glass (e.g., by HF etching) could occur at the same time as etching to define device elements in an existing process flow.

It is further noted that in some embodiments, silicate glass used for introduction of counter-dopant could be retained, remaining as part of the ultimate shingled device. Furthermore, such silicate glass can be used as a passivation layer.

The above examples have illustrated solar devices which include p-n junctions defined by different dopant types in a same material (e.g., crystalline silicon). Such junctions are typically referred to as homojunctions, as the type of material (e.g., crystalline silicon) is the same on either side of the junction.

However, embodiments are not limited to excluding junctions in the form of homojunctions. Specifically, other solar device designs may include a heterojunction—a junction between different types of material. One type of heterojunction may be defined between silicon and a different element (such as Germanium).

Another one type of heterojunction may be defined between silicon exhibiting different orders of crystalline structure. In some embodiments, a heterojunction may include an interface between silicon in crystalline form (c-Si), and silicon in amorphous (a-Si) or polycrystalline (poly-Si) form.

Figure 31:
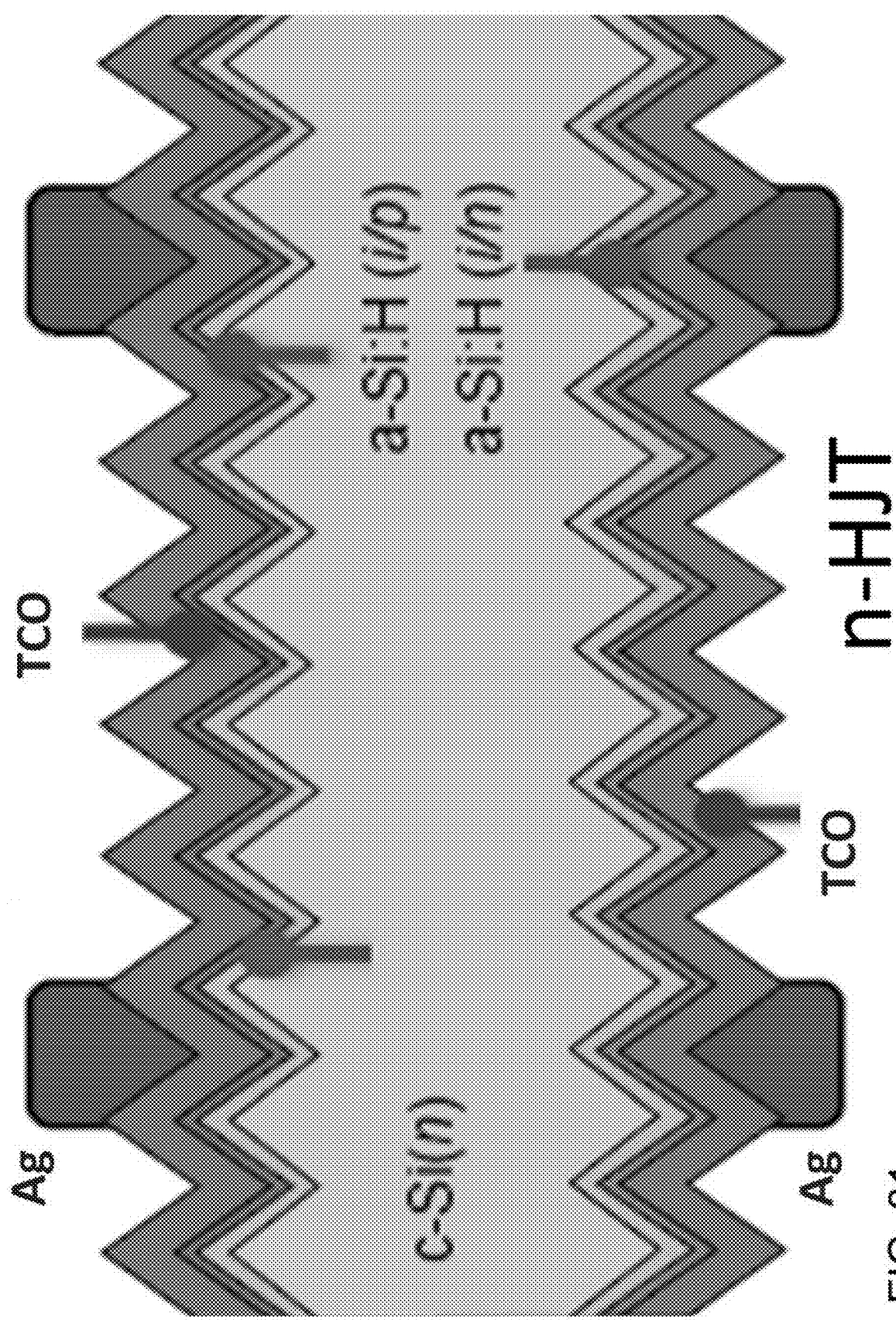
FIG. 31 shows a simplified cross-sectional view of an n Heterojunction (HJT) solar device.

FIG. 31 shows a simplified cross-sectional view of a Heterojunction (HJT) device. This type of solar device utilizes a p-i-n junction, where the P type dopant is in amorphous silicon, and the N type dopant is in crystalline silicon. A layer of intrinsic (i) amorphous silicon intervenes between the two. Components of an example of this device are as follows.

| ELEMENT | n-HJT |
| --- | --- |
| Functional Layer 3 | Transparent Conducting Oxide (TCO) |
| Functional Layer 2 | a-Si:H(p) |
| Functional Layer 1 | a-Si:H(i) |
| Bulk Silicon | c-Si(n) |
| Functional Layer 4 | a-Si:H(i) |
| Functional Layer 5 | a-Si:H(n) |
| Functional Layer 6 | TCO |

As just mentioned, a HJT solar device may include TCO layer(s). Such a TCO layer may exhibit higher conductivity than an amorphous silicon layer. Such a difference in conductivity can be one reason why excluding TCO can reduce the impact of scribing on a certain area.

Accordingly, particular embodiments may remove a TCO layer that has been formed during processing, or prevent formation of a TCO layer in an inter-strip region the first place. This can prevent a charge carrier from transferring over a long distance. Thus in some embodiments, the inter-strip region can be prepared for separation by selectively removing or preventing formation of TCO. According to some embodiments, the exclusion of TCO alone from inter-strip regions may serve to limit power conversion losses. In other embodiments, both TCO and a p-i-n junction can be excluded from inter-strip regions.

Figure 31A:
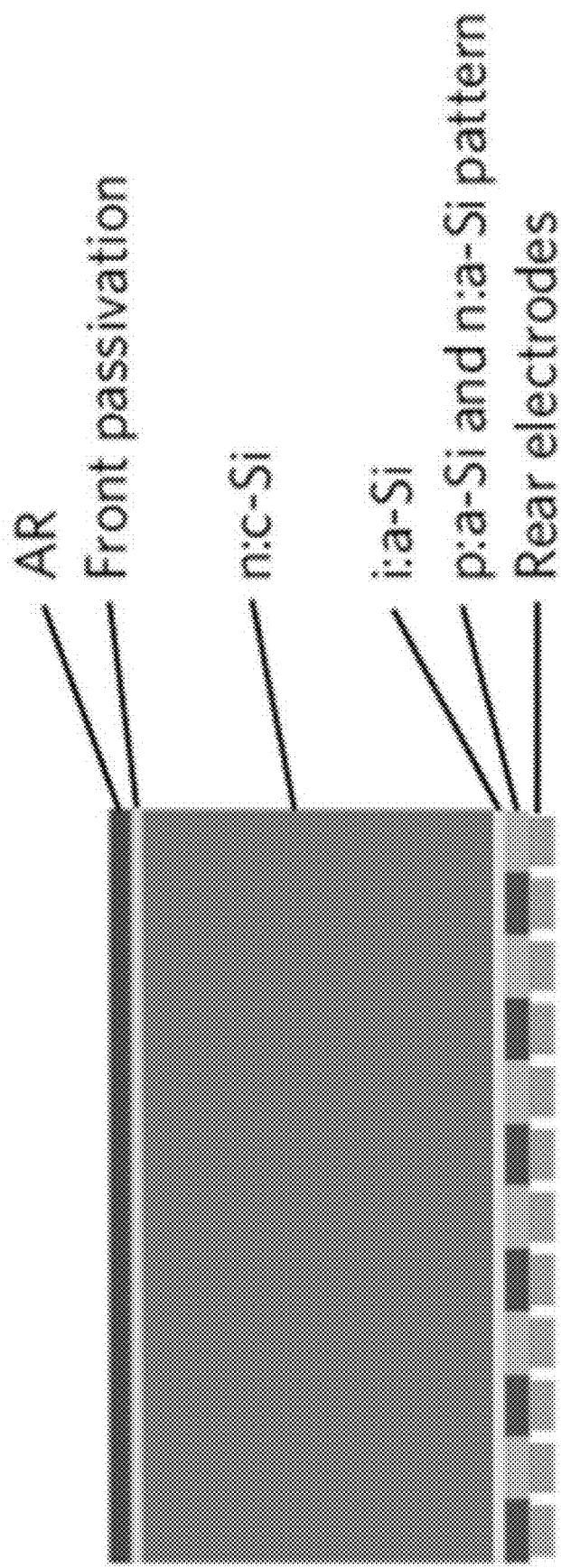
FIG. 31A shows a simplified cross-sectional view of a HIBC device.

It is noted that passivation contact or heterojunction may be combined with other approaches to form solar devices. For example, FIG. 31A shows a simplified cross-sectional view of a Heterojunction Interdigitated Back Contact (HIBC) solar device. HIBC is the combination of heterojunction and Interdigitated Back Contact (IBC) approaches.

Figure 31B:
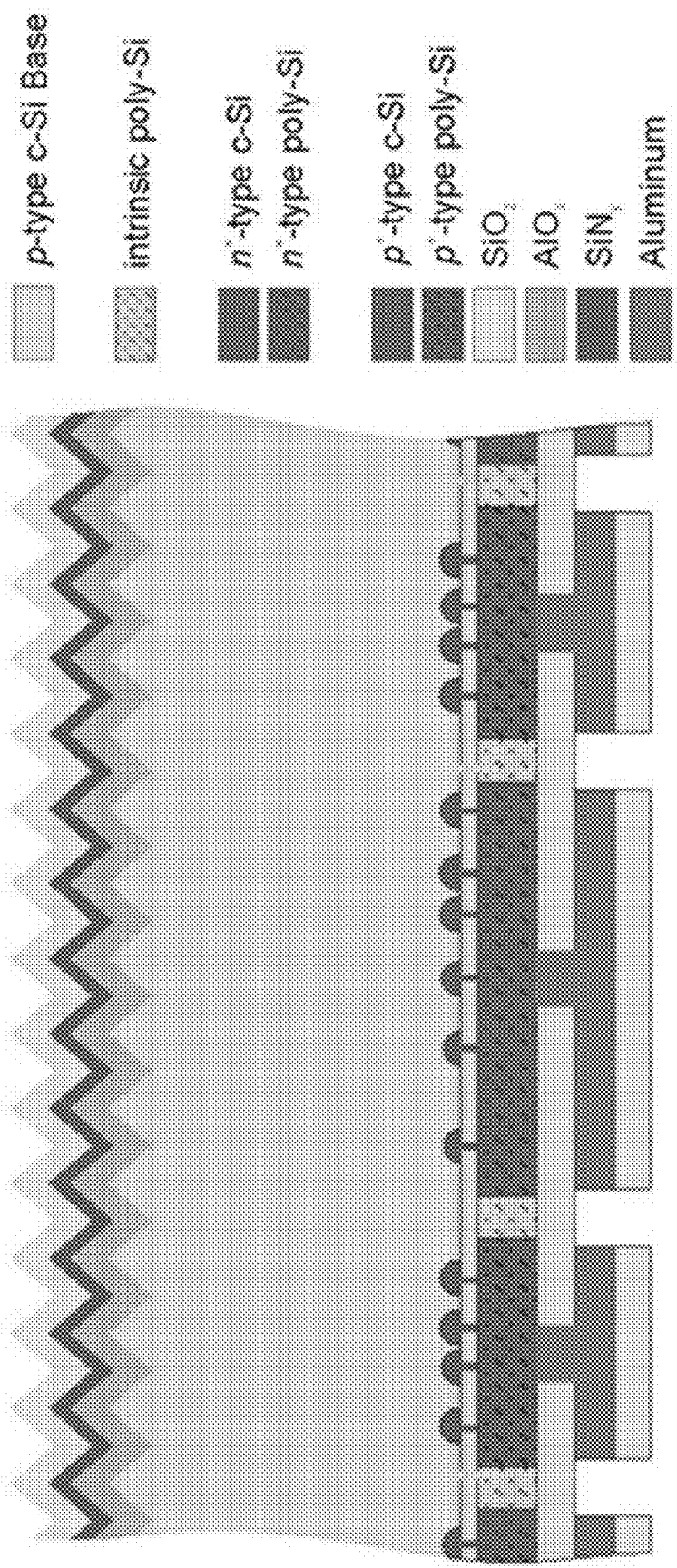
FIG. 31B shows a simplified cross-sectional view of a PassCon IBC device.

FIG. 31B shows another example of an advanced technology solar cell. In particular, this figure shows a simplified cross-sectional view of a Passivated Contact Interdigitated Back Contact (PassCon IBC) device.

In conclusion, it is noted that the implementation of embodiments may result improvements in the generation of power from solar energy. For example, losses attributable to electron-hole pair recombination at defects resulting from strip separation, can be expected to account for declines in power conversion efficiency of between about 0.1-2% rel. per strip. Thus, in a shingled 400 W module, an improvement in power conversion efficiency of even 0.1-2% rel., would be expected to produce a beneficial power gain of 0.4-8 W. Achieving even greater boosts in per-strip power conversion efficiency could result in higher output power per module.

What is claimed is:

1. A method comprising:
   forming a solar cell workpiece comprising a p-n junction;
   excluding the p-n junction from an inter-strip region; and
   separating a strip from the solar cell workpiece in the inter-strip region by application of stress along a scribing path to create a mechanical cleavage which propagates to a front side of the solar cell workpiece.

2. A method as in claim 1 wherein the strip comprises a Passivated Emitter Rear Contact (PERC) solar device.

3. A method as in claim 1 wherein the strip comprises a Tunnel Oxide Passivated Contact (TOPCon) solar device.

4. A method as in claim 1 wherein the strip is selected from the group comprising:
   Poly-Silicon-On-Oxide (POLO) solar device;
   Passivated Emitter Rear Totally-Diffused (PERT) solar device;
   Passivated Emitter Rear Locally-Diffused (PERL) solar device.

5. A method as in claim 1 wherein excluding the p-n junction comprises removing material from the solar cell workpiece.

6. A method as in claim 5 wherein removing material from the solar cell workpiece comprises ablation.

7. A method of claim 6 wherein the ablation is caused by a laser.

8. A method of claim 5 further comprising forming a passivation layer where the material has been removed.

9. A method of claim 8 wherein the passivation layer comprises a functional layer.

10. A method as in claim 1 wherein excluding the p-n junction comprises changing a level of dopant.

11. A method as in claim 10 wherein changing the level of dopant comprises introducing a counter-dopant.

12. A method as in claim 11 wherein introducing the counter-dopant comprises diffusion.

13. A method as in claim 11 wherein introducing the counter-dopant comprises implantation.

14. A method as in claim 10 wherein changing the level of dopant comprises deactivation.

15. A method as in claim 1 wherein excluding the p-n junction comprises blocking dopant from entering the inter-strip region.

16. A method as in claim 15 wherein blocking the dopant comprises forming a mask over the inter-strip region.

17. A method as in claim 16 wherein the p-n junction is formed by implantation.

18. A method comprising:
    forming a solar cell workpiece comprising a p-i-n junction;
    excluding the p-i-n junction from an inter-strip region; and
    separating a strip from the solar cell workpiece in the inter-strip region by application of stress along a scribing path to create a mechanical cleavage which propagates to a front side of the solar cell workpiece.

19. A method as in claim 18 wherein excluding the p-i-n junction comprises removing material from the solar cell workpiece.

20. A method as in claim 18 wherein excluding the p-i-n junction comprises blocking dopant from entering the inter-strip region.

21. A method as in claim 20 wherein blocking dopant comprises forming a mask over the inter-strip region.

22. A method as in claim 18 wherein the p-i-n junction is formed by vapor deposition.

23. A method as in claim 18 wherein the strip comprises a Heterojunction (HJT) solar device.

24. A method as in claim 23 wherein the HJT solar device comprises a Transparent Conductive Oxide (TCO) layer.

25. A method as in claim 24 further comprising removing the TCO layer at the inter-strip region by wet etching.

26. A method as in claim 24 further comprising blocking the TCO layer from being formed in the inter-strip region using a mask.

27. A method comprising:
    forming a solar cell workpiece comprising a Transparent Conducting Oxide (TCO) layer;
    excluding the TCO layer from an inter-strip region; and
    separating a strip from the solar cell workpiece in the inter-strip region to form a Heterojunction (HJT) solar device by application of stress along a scribing path to create a mechanical cleavage which propagates to a front side of the solar cell workpiece.

28. A method as in claim 27 wherein excluding the TCO layer comprises blocking the TCO layer from being formed in the inter-strip region using a mask.

29. A method as in claim 27 wherein excluding the TCO layer comprises removing the TCO layer at the inter-strip region.

* * * * *